United States Patent
Uesugi et al.

(10) Patent No.: US 9,178,174 B2
(45) Date of Patent: Nov. 3, 2015

(54) DISPLAY DEVICE AND METHOD OF MANUFACTURING THE SAME, METHOD OF REPAIRING DISPLAY DEVICE, AND ELECTRONIC APPARATUS

(71) Applicant: Sony Corporation, Tokyo (JP)

(72) Inventors: Masanao Uesugi, Kanagawa (JP); Jiro Yamada, Kanagawa (JP); Mitsuo Morooka, Tokyo (JP); Yasunobu Hiromasu, Kanagawa (JP)

(73) Assignee: SONY CORPORATION (JP)

( * ) Notice: Subject to any disclaimer, the term of this patent is extended or adjusted under 35 U.S.C. 154(b) by 0 days.

(21) Appl. No.: 13/847,200

(22) Filed: Mar. 19, 2013

(65) Prior Publication Data
US 2013/0256638 A1 Oct. 3, 2013

(30) Foreign Application Priority Data

Mar. 27, 2012 (JP) .................. 2012-070933
Mar. 28, 2012 (JP) .................. 2012-072826
Dec. 20, 2012 (JP) .................. 2012-277619

(51) Int. Cl.
*H01L 51/52* (2006.01)
*H01L 51/56* (2006.01)
*H01L 27/32* (2006.01)

(52) U.S. Cl.
CPC ........ *H01L 51/5203* (2013.01); *H01L 27/3276* (2013.01); *H01L 51/5228* (2013.01); *H01L 51/56* (2013.01); *H01L 2227/323* (2013.01); *H01L 2251/568* (2013.01)

(58) Field of Classification Search
CPC .................... H01L 51/5203; H01L 51/56
USPC ......... 257/40, 59, 72, 347, 752; 438/4, 34, 99
See application file for complete search history.

(56) References Cited

U.S. PATENT DOCUMENTS

| | | | |
|---|---|---|---|
| 7,164,230 B2* | 1/2007 | Park ............................... | 313/505 |
| 7,221,095 B2* | 5/2007 | Yamazaki et al. ............. | 313/509 |
| 7,482,182 B2* | 1/2009 | Yamazaki et al. .............. | 438/22 |
| 7,728,510 B2* | 6/2010 | Oh ................................. | 313/504 |
| 2004/0137142 A1* | 7/2004 | Nishikawa ...................... | 427/66 |
| 2008/0165315 A1* | 7/2008 | Nishida et al. ................ | 349/137 |
| 2009/0015149 A1* | 1/2009 | Lee et al. ....................... | 313/504 |
| 2009/0127545 A1* | 5/2009 | Park et al. ........................ | 257/40 |
| 2010/0187546 A1* | 7/2010 | Fushimi et al. ................. | 257/88 |

FOREIGN PATENT DOCUMENTS

| | | |
|---|---|---|
| JP | 2002-318556 A | 10/2002 |
| JP | 2011-34849 A | 2/2011 |
| WO | 2007/148540 A1 | 12/2007 |

* cited by examiner

*Primary Examiner* — Sheng Zhu
(74) *Attorney, Agent, or Firm* — Sheridan Ross P.C.

(57) ABSTRACT

A display device includes light emitting elements that are arranged in a two-dimensional matrix, in which the light emitting elements include a drive circuit which is provided on a substrate, a first insulating layer which covers the drive circuit and the substrate, a light emitting portion in which a first electrode, an organic layer having a light emitting layer, and a second electrode are laminated, and a second insulating layer which covers the first electrode.

13 Claims, 37 Drawing Sheets

↓ ASHING

ASHING

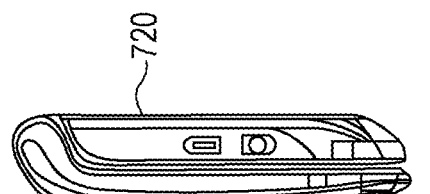
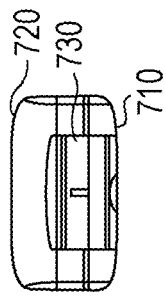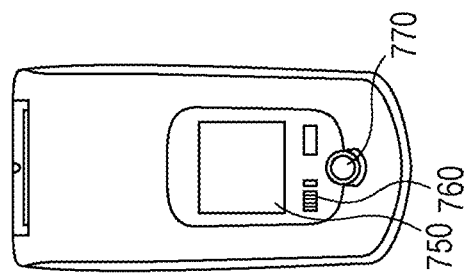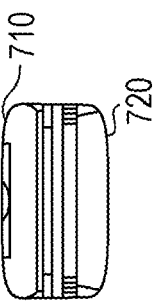
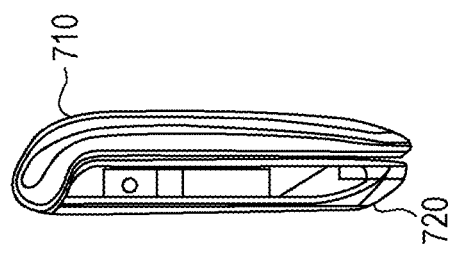
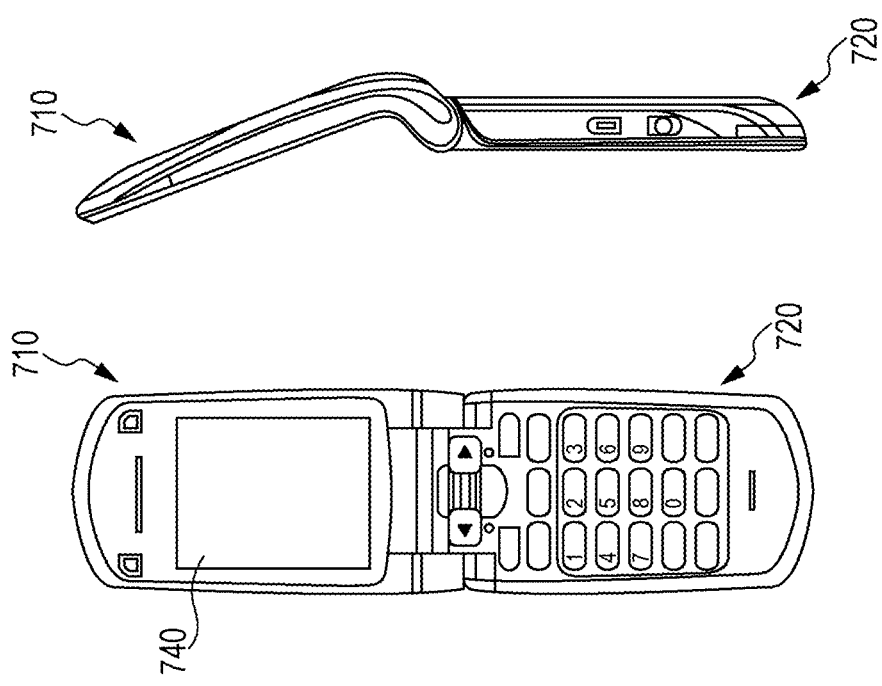

DISPLAY DEVICE AND METHOD OF MANUFACTURING THE SAME, METHOD OF REPAIRING DISPLAY DEVICE, AND ELECTRONIC APPARATUS

BACKGROUND

The present disclosure relates to a display device and a method of manufacturing the same, a method of repairing a display device, and an electronic apparatus.

Recently, organic electroluminescence display devices (organic EL display devices), which are one type of flat panel display and use an organic electroluminescence (EL) phenomenon to display an image, have attracted attention. Since a light-emitting phenomenon of organic EL elements themselves is used, organic EL display devices have superior characteristics such as a wide viewing angle and low power consumption. Furthermore, organic EL display devices have been put into practice in the video field due to their high response to high-definition and high-speed video signals. In addition, in organic EL display devices, a plastic substrate, in particular, a plastic film substrate may be used as a substrate owing to flexibility which is an intrinsic property of an organic light-emitting material. As a result, organic EL display devices attract attention as a flexible display device.

Among methods of driving an organic EL display device, an active matrix method in which a drive circuit is configured from a thin film transistor (TFT) has superior response and resolution to those of a passive matrix method. Therefore, it is considered that the active matrix method is particularly suitable for the organic EL display devices. An organic EL display device using the active matrix method includes a light emitting portion and a first panel in which light emitting elements, composed of drive circuits for driving the light emitting portion, are arranged in a two-dimensional matrix. The light emitting elements are interposed between the first panel and a second panel, which is a sealing panel. In addition, the light emitting portion has a structure in which a first electrode, an organic layer having a light emitting layer, and a second electrode are laminated.

There are two types of organic EL display devices, a bottom emission type in which light is emitted from the light emitting elements toward the first panel and a top emission type in which light is emitted from the light emitting elements toward the second panel. The top emission type organic EL display device has an advantageous effect of high aperture ratio.

In the top emission type organic EL display device, the second electrode which is located on the second panel side is a so-called common electrode shared by plural light emitting elements, and is formed of a light-transmissive conductive material such as Indium Zinc Oxide (IZO). However, such a light-transmissive conductive material has electrical resistivity which is higher than that of a general metal material or the like by two or three digits. As a result, there is a problem in that a voltage, applied to the second electrode, is not uniform in a plane of the second electrode, the luminance of the light emitting elements varies depending on positions, and display quality deteriorates.

In order to solve such problems, for example, Japanese Unexamined Patent Application Publication No. 2002-318556 discloses a technique in which an auxiliary electrode (auxiliary wiring), connected to the second electrode, is formed on an insulating layer formed on the first electrode. The auxiliary electrode is formed of the same material as that of the first electrode. In the technique disclosed in Japanese Unexamined Patent Application Publication No. 2002-318556, when the first electrode and the auxiliary electrode are formed of, for example, aluminum (Al) or an Al alloy, a surface of the auxiliary electrode is likely to be oxidized in the manufacturing process of an organic EL display device. When the auxiliary electrode is oxidized and a part of the second electrode (second electrode extending portion) is formed on the auxiliary electrode, a contact resistance between the auxiliary electrode and the second electrode increases, which leads to a voltage drop. The power consumption of the display device is increased due to the voltage drop.

International Publication No. WO 2007/148540 discloses a technique in which a contact portion is formed on the same layer as that of a drive circuit. The contact portion is formed of a conductive material of which a surface is not easily oxidized and which has a superior ohmic contact with the second electrode. A top portion of the contact portion is in contact with an end of the auxiliary electrode. The second electrode extending portion is formed over a range from the top portion of the contact portion to an upper area of the auxiliary electrode.

When foreign conductive materials are incorporated into the organic layer, there is a concern that the first electrode and the second electrode may be short-circuited due to the foreign materials. Means for solving such a problem is disclosed in, for example, Japanese Unexamined Patent Application Publication No. 2011-034849. Specifically, an organic EL display device disclosed in Japanese Unexamined Patent Application Publication No. 2011-034849 includes: an insulating substrate; a pixel electrode that is arranged above the insulating substrate; a partition wall that is arranged in the vicinity of the image electrode; a division layer that is connected to the partition wall, is arranged above the pixel electrode, and divides a portion of the pixel electrode, exposed from the partition wall, into plural regions; an organic layer that is arranged above the pixel electrode and the division layer; a counter electrode that covers the organic layer and the partition wall; and a groove that is formed on the organic layer and the counter electrode in a loop shape and exposes a part of the division layer.

When foreign materials are incorporated into the organic layer formed above the pixel electrode (first electrode), the division layer is irradiated with laser; and the organic layer and the counter electrode (second electrode), laminated above the division layer and the partition wall, are removed such that a region, into which the foreign materials are incorporated, is surrounded by a removed portion. The removed portion forms the groove. A potential is not supplied to a portion of the counter electrode (second electrode) surrounded by the groove. Therefore, this portion forms a dark spot region and the other portion substantially forms a light emitting region (for example, refer to paragraph [0050] and FIGS. 8 and 9 in the specification of Japanese Unexamined Patent Application Publication No. 2011-034849).

SUMMARY

The technique disclosed in International Publication No. WO 2007/148540 is superior in preventing an increase of the contact resistance between the auxiliary electrode and the second electrode. However, along with the demand for high-definition display devices, the patterning of the auxiliary electrode for reliably forming a state where the end of the auxiliary electrode is in contact with the top portion of the contact portion may be difficult.

In addition, recently, a new technique for repairing a display device when conductive foreign materials are incorporated into the organic layer has been demanded.

Therefore, it is desirable to provide a display device having a configuration or structure in which a second electrode and an auxiliary electrode are reliably and electrically connected to each other through a contact portion; an electronic apparatus having the display device; and a method of manufacturing the display device.

In addition, it is desirable to provide a display device using a new repairing technique; an electronic apparatus having the display device; and a method of repairing a display device.

A display device according to a first embodiment of the present disclosure includes light emitting elements that are arranged in a two-dimensional matrix, in which the light emitting elements include:

(a) a drive circuit which is provided on a substrate;

(b) a first insulating layer which covers the drive circuit and the substrate;

(c) a light emitting portion in which a first electrode, an organic layer having a light emitting layer, and a second electrode are laminated; and (d) a second insulating layer which covers the first electrode, the light emitting elements further include:

(e) an auxiliary electrode layer; and (f) a contact portion which is formed on the substrate, the first electrode is formed on the first insulating layer and is electrically connected to the drive circuit through a first electrode extending portion which is formed on a first opening provided in the first insulating layer, the organic layer is formed at least on a portion of the first electrode which is exposed in the bottom of a second opening formed on the second insulating layer, a third opening, through which the contact portion is exposed in the bottom, is formed on the first insulating layer, a fourth opening, through which the contact portion is exposed in the bottom, is formed at least on the second insulating layer, the auxiliary electrode layer is formed distant from the first electrode and over a range from an upper area of the first insulating layer to an internal area of the third opening, and the second electrode is formed over a range from an upper area of the organic layer to an upper area of the second insulating layer and furthermore to an internal area of the fourth opening.

An electronic apparatus according to a first embodiment of the present disclosure includes the display device according to the first embodiment of the present disclosure.

In a method of manufacturing a display device according to the present disclosure the display device includes light emitting elements that are arranged in a two-dimensional matrix, in which the light emitting elements include a drive circuit and a light emitting portion in which a first electrode, an organic layer having a light emitting layer, and a second electrode are laminated. This method includes:

(A) providing the drive circuit and a contact portion on the substrate;

(B) forming a first insulating layer that covers the drive circuit, the contact portion, and the substrate;

(C) forming a first opening, through which a part of the drive circuit is exposed in the bottom, on a portion of the first insulating layer which is located above the drive circuit and forming a third opening, through which the contact portion is exposed in a concave portion and in the bottom, on a portion of the first insulating layer which is located above the contact portion;

(D) forming a conductive material layer on the entire surface and patterning the conductive material layer to form the first electrode on the first insulating layer, to form a first electrode extending portion in the first opening, to form an auxiliary electrode layer, which is distant from the first electrode, over a range from an upper area of the first insulating layer to an internal area of the third opening, and to remove the conductive material layer on at least a part of the bottom of the concave portion;

(E) removing a portion of the first insulating layer, which is located on an exposed portion in the bottom of the concave portion, to expose the contact portion, forming a second insulating layer on the entire surface, forming a second opening, through which the first electrode is exposed in the bottom, on the second insulating layer, forming a fourth opening, which reaches an exposed portion of the contact portion in the bottom of the concave portion, on the second insulating layer, or forming a second insulating layer on the entire surface, removing a portion of the second insulating layer which is located above the concave portion, removing a portion of the first insulating layer which is located on a portion of the bottom of the concave portion, forming a second opening, through which the first electrode is exposed in the bottom, on the second insulating layer, and forming a fourth opening, which reaches an exposed portion of the contact portion in the bottom of the concave portion, on the second insulating layer and the first insulating layer;

(F) forming the organic layer over a range from an exposed portion of the first electrode in the bottom of the second opening to a part of an upper area of the second insulating layer; and (G) forming the second electrode over a range from an upper area of the organic layer to an upper area of the second insulating layer and furthermore to an internal area of the fourth opening.

A display device according to a second embodiment of the present disclosure includes light emitting elements that are arranged in a two-dimensional matrix, in which the light emitting elements include:

(a) a drive circuit which is provided on a substrate;

(b) a first insulating layer which covers the drive circuit and the substrate;

(c) a light emitting portion which includes a first electrode, an organic layer having a light emitting layer, and a second electrode;

(d) a second insulating layer which covers the first electrode, the first electrode formed on the first insulating layer is electrically connected to the drive circuit, the light emitting elements further include (e) a window layer which is provided on the first electrode, the light emitting portion is divided into plural window portions by the window layer, the organic layer is formed at least on the first electrode, the second electrode is formed on the organic layer, and when there is a foreign material in a window portion of the light emitting portion, a portion of the first electrode corresponding to the window portion is separated from the other portions of the first electrode.

A display device according to a third embodiment of the present disclosure includes light emitting elements that are arranged in a two-dimensional matrix, in which the light emitting elements include:

(a) a drive circuit which is provided on a substrate;

(b) a first insulating layer which covers the drive circuit and the substrate;

(c) a light emitting portion which includes a first electrode, an organic layer having a light emitting layer, and a second electrode; and (d) a second insulating layer which covers the first electrode, the first electrode formed on the first insulating layer is electrically connected to the drive circuit, the first electrode includes Q numbers of first electrode small pieces which are provided distant from each other, first electrode branched portions which extend from the respective first electrode small pieces, and a first electrode main portion which collects Q numbers of first electrode branched portions and extends toward the drive circuit, the organic layer is formed at least on each of the first electrode small pieces, the second electrode is formed on the organic layer, and when there is a foreign material on a first electrode small piece of the light emitting portion, a first electrode branched portion extending from the first electrode small piece is cut.

An electronic apparatus according to a second embodiment of the present disclosure includes the display device according to the second or third embodiment of the present disclosure.

In a method of repairing a display device according to a first embodiment of the present disclosure, the display device includes light emitting elements that are arranged in a two-dimensional matrix, in which the light emitting elements include:

(a) a drive circuit which is provided on a substrate;

(b) a first insulating layer which covers the drive circuit and the substrate;

(c) a light emitting portion which includes a first electrode, an organic layer having a light emitting layer, and a second electrode; and (d) a second insulating layer which covers the first electrode, the first electrode formed on the first insulating layer is electrically connected to the drive circuit, the light emitting elements further include (e) a window layer which is provided on the first electrode, the light emitting portion is divided into plural window portions by the window layer, the organic layer is formed at least on the first electrode, and the second electrode is formed on the organic layer.

This method includes, when there is a foreign material in a window portion of the light emitting portion, irradiating a portion of the first electrode surrounding the window portion with laser light to separate the portion of the first electrode corresponding to the window portion from the other portions of the first electrode.

In a method of repairing a display device according to a second embodiment of the present disclosure, the display device includes light emitting elements that are arranged in a two-dimensional matrix, in which the light emitting elements include:

(a) a drive circuit which is provided on a substrate;

(b) a first insulating layer which covers the drive circuit and the substrate;

(c) a light emitting portion which includes a first electrode, an organic layer having a light emitting layer, and a second electrode; and (d) a second insulating layer which covers the first electrode, the first electrode formed on the first insulating layer is electrically connected to the drive circuit, the first electrode includes Q numbers of first electrode small pieces which are provided distant from each other, first electrode branched portions which extend from the respective first electrode small pieces, and a first electrode main portion which collects Q numbers of first electrode branched portions and extends toward the drive circuit, the organic layer is formed at least on each of the first electrode small pieces, and the second electrode is formed on the organic layer.

This method includes, when there is a foreign material on a first electrode small piece of the light emitting portion, irradiating a first electrode branched portion extending from the first electrode small piece with laser light to cut the first electrode branched portion.

In the display device according to the first embodiment of the present disclosure and the method of manufacturing the same, or in the electronic apparatus according to the first embodiment of the present disclosure, the auxiliary electrode layer is formed over a range from an upper area of the first insulating layer to an internal area of the third opening. That is, the auxiliary electrode layer is formed to extend to an upper area of a portion of the contact portion which is exposed in the bottom of the third opening. In addition, the second electrode is formed over a range from an upper area of the organic layer to an upper area of the second insulating layer and furthermore to an internal area of the fourth opening. That is, the second electrode layer is formed to extend to an upper area of a portion of the contact portion which is exposed in the bottom of the fourth opening. Therefore, the second electrode and the auxiliary electrode layer are reliably and electrically connected to each other through the contact portion. In addition, even if a surface of the auxiliary electrode layer is oxidized, a phenomenon in which an electrical resistance between the auxiliary electrode layer and the second electrode increases does not occur. As a result, low power consumption can be reliably realized and display quality can be improved. Furthermore, by using this superior display device, a high-performance electronic apparatus can be realized.

In the display device according to the second or third embodiment of the present disclosure, the electronic apparatus according to the second embodiment of the present disclosure, and the method of repairing a display device according to the first or second embodiment of the present disclosure, a portion of the first electrode where there is a foreign material can be easily and reliably separated from the other portions of the first electrode. As a result, the short-circuiting between the first electrode and the second electrode, which may be caused by the foreign material, can be reliably avoided. In a method of repairing a display device of the related art, it is necessary that an organic layer and a second electrode be removed. However, in the method of repairing a display device according to the present disclosure, the reliability for repair can be improved by removing only the first electrode. In the display device according to the third embodiment of the present disclosure and the method of repairing a display device according to the second embodiment, a target area for laser irradiation can be reduced, or the length of laser irradiation can be reduced. As a result, cutting with laser irradiation can be easily and reliably performed and the time of repair using laser irradiation can be reduced.

BRIEF DESCRIPTION OF THE DRAWINGS

FIGS. 6A to 6C are cross-sectional views for describing a method of manufacturing the display device according to Example 1, schematically illustrating a part of a substrate and the like;

FIGS. 7A and 7B following FIG. 6C are cross-sectional views for describing the method of manufacturing the display device according to Example 1, schematically illustrating a part of a substrate and the like;

FIGS. 8A and 8B following FIG. 7B are cross-sectional views for describing the method of manufacturing the display device according to Example 1, schematically illustrating a part of a substrate and the like;

FIGS. 9A and 9B following FIG. 8B are cross-sectional views for describing the method of manufacturing the display device according to Example 1, schematically illustrating a part of a substrate and the like;

FIGS. 10A and 10B following FIG. 9B are cross-sectional views for describing the method of manufacturing the display device according to Example 1, schematically illustrating a part of a substrate and the like;

FIGS. 11A and 11B are cross-sectional views for describing a method of manufacturing a display device according to Example 2, schematically illustrating a part of a substrate and the like;

FIGS. 12A and 12B following FIG. 11B are cross-sectional views for describing a method of manufacturing a display device according to Example 2, schematically illustrating a part of a substrate and the like;

FIGS. 13A and 13B following FIG. 12B are cross-sectional views for describing a method of manufacturing a display device according to Example 2, schematically illustrating a part of a substrate and the like;

FIGS. 14A and 14B following FIG. 13B are cross-sectional views for describing a method of manufacturing a display device according to Example 2, schematically illustrating a part of a substrate and the like;

FIGS. 15A and 15B are cross-sectional views for describing a method of manufacturing a display device according to Example 3, schematically illustrating a part of a substrate and the like;

FIGS. 16A and 16B following FIG. 15B are cross-sectional views for describing a method of manufacturing a display device according to Example 3, schematically illustrating a part of a substrate and the like;

FIGS. 17A and 17B following FIG. 16B are cross-sectional views for describing a method of manufacturing a display device according to Example 3, schematically illustrating a part of a substrate and the like;

FIGS. 18A and 18B are cross-sectional views for describing a method of manufacturing a display device according to Example 4, schematically illustrating a part of a substrate and the like;

FIGS. 19A and 19B following FIG. 18B are cross-sectional views for describing the method of manufacturing a display device according to Example 4, schematically illustrating a part of a substrate and the like;

FIGS. 20A and 20B following FIG. 19B are cross-sectional views for describing the method of manufacturing a display device according to Example 4, schematically illustrating a part of a substrate and the like;

FIGS. 40A to 40G are perspective views illustrating an external appearance of a mobile phone which is an electronic apparatus including the display devices according to Examples 1 to 7.

DETAILED DESCRIPTION OF EMBODIMENTS

Figure 1:
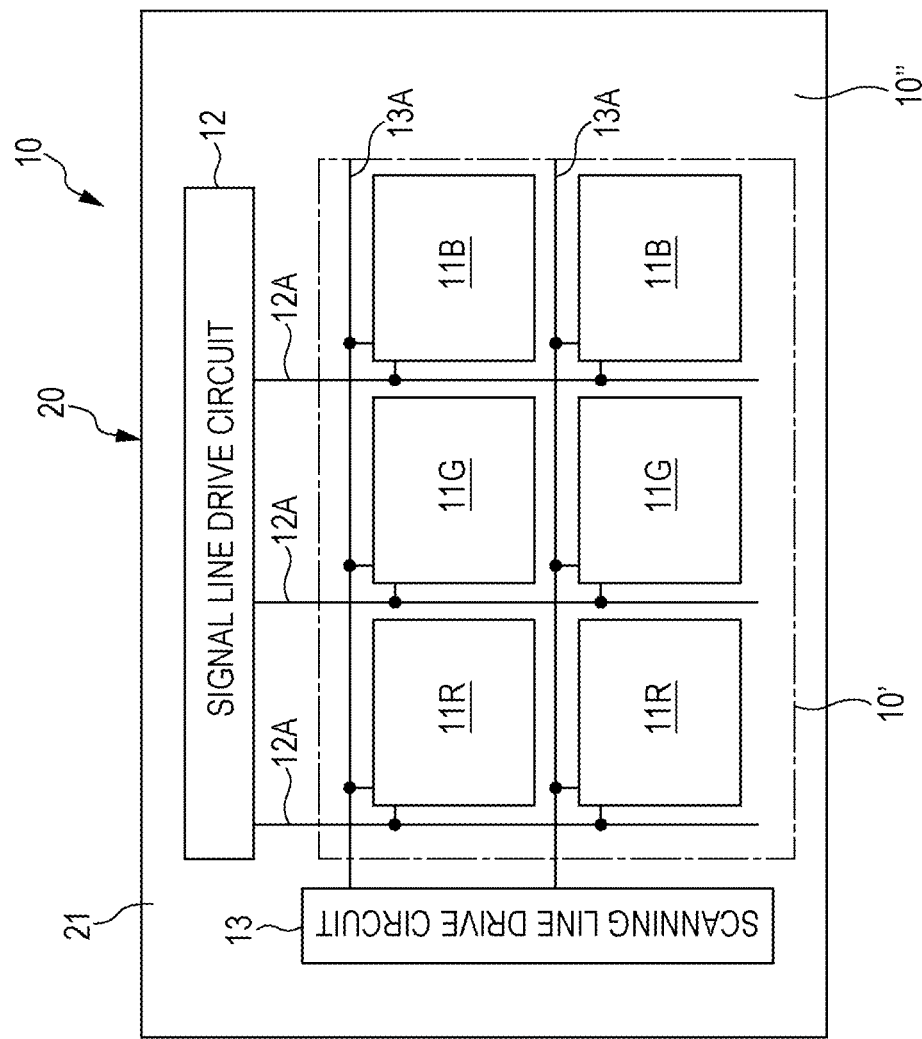
FIG. 1 is a schematic diagram illustrating a display device according to Example 1.

Hereinafter, the present disclosure will be described based on Examples with reference to the drawings. However, the present disclosure is not limited to Examples and various numerical values and shapes in Examples are merely examples. The descriptions will be performed in the following order.
1. Overall Description Relating to Display Devices According to First to Third Embodiments of Present Disclosure, Method of Manufacturing Display Device According to Present Disclosure, Methods of Repairing Display Device According to First and Second Embodiments of Present Disclosure, and Electronic Apparatuses According to First and Second Embodiments of Present Disclosure
2. Example 1 (Display Device and Method of Manufacturing The Same According to First Embodiment of Present Disclosure)
3. Example 2 (Modification Example of Method of Manufacturing Display Device According to Example 1)
4. Example 3 (Another Modification Example of Method of Manufacturing Display Device According to Example 1)
5. Example 4 (Modification Example of Method of Manufacturing Display Device According to Example 3)
6. Example 5 (Modification Example of Display Devices According to Examples 1 to 4)
7. Example 6 (Display Device According to Second Embodiment of Present Disclosure and Method of Repairing Display Device According to First Embodiment of Present Disclosure)
8. Example 7 (Display Device According to Third Embodiment of Present Disclosure and Method of Repairing Display Device According to Second Embodiment of Present Disclosure)
9. Example 8 (Electronic Apparatus According to First Embodiment or Second Embodiment of Present Disclosure) and Others
Overall Description Relating to Display Devices According to First to Third Embodiments of Present Disclosure, Method of Manufacturing Display Device According to Present Disclosure, Methods of Repairing Display Device According to First and Second Embodiments of Present Disclosure, and Electronic Apparatuses According to First and Second Embodiments of Present Disclosure Hereinafter, the display devices according to the first to third embodiments of the present disclosure, the method of manufacturing a display device according to the present disclosure, the methods of repairing a display device according to the first and second embodiments of the present disclosure, and the electronic apparatuses according to the first and second embodiments of the present disclosure will be sometimes collectively referred to as "the display devices and the like according to the present disclosure". In addition, hereinafter, the display device according to the first embodiment of the present disclosure and the method of manufacturing the same; and the electronic apparatus according to the first embodiment of the present disclosure will be sometimes collectively referred to as "the display devices and the like according to the first embodiment of the present disclosure". Furthermore, hereinafter, the display devices according to the second and third embodiments of the present disclosure, the methods of repairing a display device according to the first and second embodiments of the present disclosure, and the electronic apparatus according to the second embodiment of the present disclosure will be sometimes collectively referred to as "the display devices and the like according to the second embodiment of the present disclosure".

In the display devices and the like according to the present disclosure, a light emitting portion which emits light based on an organic EL phenomenon can be used as a specific example of the light emitting portion. That is, an electroluminescence display device (organic EL display device) can be used as an example of the display device. In addition, basically, the drive circuit is not limited as long as it is configured from a semiconductor element which can drive the light emitting portion. Specifically, as described below, the drive circuit can be configured from, for example, a thin film transistor (TFT). In addition, in the following description, the substrate will be sometimes referred to as "the first substrate"; and a panel (including the substrate) in which light emitting elements are provided will be sometimes referred to as "a first panel" for convenience of description. Furthermore, a panel which is bonded to the first panel with the light emitting elements interposed therebetween will be sometimes referred to as "a second panel" for convenience of description. The second panel includes a second substrate. A display device is manufactured by bonding the first panel (first substrate) and the second panel (second substrate) to each other with the light emitting elements interposed therebetween. A display device in which light, emitted from a light emitting layer, exits through the second panel will be sometimes referred to as "a top emission type display device" for convenience of description, and a display device in which light, emitted from a light emitting layer, exits through the first panel will be sometimes referred to as "a bottom emission type display device".

In the display devices and the like according to the first embodiment of the present disclosure, the contact portion may have a structure in which at least a first contact layer and a second contact layer are laminated in this order from the substrate side; and an etching rate of a material forming the second contact layer may be lower than that of a material forming the first electrode (that is, under the same etching conditions, the second contact layer-forming material may be etched with more difficulty than the material forming the first electrode). In this case, it is preferable that the material forming second contact layer be a metal which is difficult to oxidize or a material containing the metal which is difficult to oxidize. As a result, an increase in the contact resistance between the auxiliary electrode layer and the contact portion and between the second electrode and the contact portion can be more reliably avoided. Furthermore, in this configuration, it is preferable that a material forming the first contact layer be a metal having higher conductivity than that of the material forming the second contact layer, or a material containing the metal having higher conductivity. As a result, the electrical resistance between the auxiliary electrode layer and the second layer can be further reduced. Specifically, although they are not limited to these examples, the second contact layer may be formed of a material containing molybdenum (Mo) or titanium (Ti); and the first contact layer may be formed of a material containing at least one kind of metal selected from a group consisting of aluminum (Al), silver (Ag), and copper (Cu).

In the display devices and the like according to the first embodiment of the present disclosure having the above-described preferable configurations, the drive circuit may include a gate electrode, a gate insulating layer, a channel forming region, and source/drain electrodes (that is, specifically, may include a thin film transistor); and the source/drain electrodes may have the same configuration as that of the contact portion. The thin film transistor may be a bottom gate/top contact type, a bottom gate/bottom contact type, a top gate/top contact type, or a top gate/bottom contact type. In this case, below the contact portion, a structure, in which at least a first layer which forms the gate electrode and a second layer which forms the gate insulating layer are laminated, may be formed below the contact portion. The first layer is located on the substrate side. In such a configuration, the thin film transistor is the bottom gate/top contact type. More specifically, a structure in which the first layer, the second layer, and the contact portion are laminated from below may be the same structure as that of a bottom gate/top contact type TFT (in which a gate electrode a gate insulating layer, a semiconductor layer forming a channel forming region, and source/drain electrodes are laminated). As a result, the manufacturing process of a display device can be simplified. Alternatively, it is preferable that a material forming the source/drain electrode and a material forming the contact portion be materials which can be simultaneously etched.

In the display devices and the like according to the second embodiment of the present disclosure, the drive circuit may include a gate electrode, a gate insulating layer, a channel forming region, and source/drain electrodes (that is, specifically, may include a thin film transistor). The thin film transistor may be a bottom gate/top contact type, a bottom gate/bottom contact type, a top gate/top contact type, or a top gate/bottom contact type.

Furthermore, in the display devices and the like according to the first embodiment of the present disclosure having the above-described preferable configuration, it is preferable that the fourth opening have a shape having a wide upper portion and a narrow lower portion (that is, a so-called forward tapered shape). Alternatively, it is preferable that the fourth opening have a stepwise shape having a wide upper portion and a narrow lower portion. By adopting such a shape, when the second electrode is formed inside the fourth opening, the short-circuiting of the second electrode and an increase in the resistance value of the second electrode can be prevented.

Furthermore, in the display devices and the like according to the present disclosure having the above-described preferable configurations, it is preferable that the first electrode be formed of aluminum (Al) or silver (Ag)s; and light, emitted from the light emitting layer, be reflected from the first electrode. In addition, it is preferable that the first electrode be provided on the first insulating layer, for example, so as to cover the drive circuit.

Furthermore, in the display devices and the like according the first embodiment of the present disclosure having the above-described preferable configurations, it is preferable that a material forming the auxiliary electrode layer be the same as the material forming the first electrode. Alternatively, it is preferable that the material forming the auxiliary electrode layer and the material forming the first electrode be materials which can be simultaneously etched.

Furthermore, in the display devices and the like according to the present disclosure having the above-described preferable configurations, it is preferable that light, emitted from the light emitting portion, pass through the second electrode. That is, it is preferable that light, emitted from the light emitting portion, exits through the second panel (top emission type display device).

Furthermore, in the display devices and the like according to the present disclosure having the above-described preferable configurations, the second electrode may be shared by a plurality of light emitting elements (that is, a so-called common electrode).

Furthermore, in the display devices and the like according to the first embodiment of the present disclosure having the above-described preferable configurations, a portion of the auxiliary electrode layer on the first insulating layer may surround the first electrode, formed on the first insulating layer, in a state being distant from the first electrode.

Furthermore, in the display devices and the like according to the first embodiment of the present disclosure having the above-described preferable configurations, a portion of an auxiliary wiring layer, which is located at an edge of a display region of the display device, may be connected to a power supply, which is provided in a peripheral portion of the display device, through the contact portion formed on the substrate and a wiring layer extending from the contact portion.

In addition, in the method of manufacturing a display device according to the present disclosure having the above-described preferable configurations, at least the concave portion, the first opening, and the third opening may be formed on the first insulating layer based on a photolithographic technique; and a half-tone mask or a grey-tone mask may be used in the photolithographic technique.

In the display device according to the second embodiment of the present disclosure, a portion of the first electrode which is located below the window layer surrounding the window portion, or a portion of the first electrode which is located below the window layer surrounding the window portion and a portion of the first electrode which is located below the window layer and the second insulating layer surrounding the window portion may be separated from the other portions of the first electrode. By adopting such a configuration, the scattering of the material forming the first electrode caused by the isolation of the first electrode can be prevented.

In addition, in the method of repairing a display device according to the first embodiment of the present disclosure, a portion of the first electrode which is located below the window layer surrounding the window portion, a portion of the first electrode which is located below the window layer surrounding the window portion and a portion of the first electrode which is located below the window layer and the second insulating layer surrounding the window portion may be separated from the other portions of the first electrode. In the method of repairing a display device according to the first embodiment of the present disclosure having such a configuration, or in the method of repairing a display device according to the second embodiment of the present disclosure, the laser light may be emitted from the second electrode side. That is, the laser light may be irradiated from the first substrate side or the second substrate side, but is preferably irradiated from the second substrate side. The former will be sometimes referred to as "the bottom-side irradiation"; and the latter will be sometimes referred to as "the top-side irradiation". In a display device which is manufactured by bonding the substrate and the second substrate with light emitting elements interposed therebetween, the above-described configuration in which the laser light is emitted from the second electrode side includes a configuration in which laser light is irradiated through the second substrate; and a configuration in which the light emitting elements are irradiated with laser light before bonding with the second substrate. When the former configuration is adopted, the manufacturing efficiency of a display device is superior to that of the latter configuration.

An irradiation range of laser light for repair can be set to be a radius range of 10 μm to 20 μm. In addition, for example, in the case of the top-side irradiation, when a display device is repaired through a color filter, examples of laser light to be used include laser light having a wavelength of 800 nm to 1064 nm and a power of 5 microwatt to 80 microwatt. On the other hand, in the case of the bottom-side irradiation, examples of laser light to be used include laser light having a wavelength of 355 nm to 1064 nm and a power of 5 microwatt to 80 microwatt.

In the display devices and the like according to the present disclosure having the above-described preferable configurations, it is preferable that the substrate be formed of a material having high resistance to moisture or gas, which may be incorporated from the outside into a display device, high solvent resistance, and high weather resistance; and be formed of an inorganic material or a resin material. Specific examples of a material forming the substrate include a borosilicate glass ($Na_2O$—$B_2O_3$—$SiO_2$) substrate, a phosphate glass substrate, a soda glass ($Na_2O$—CaO—$SiO_2$) substrate, a high-strain-point glass substrate, a forsterite ($2MgO$—$SiO_2$) substrate, a lead glass ($Na_2O$—PbO—$SiO_2$) substrate, and various glass substrates having an insulating film on a surface thereof. Other examples thereof include a quartz substrate, a quartz substrate having an insulating film on a surface thereof, and a silicon substrate having an insulating film on a surface thereof. Still other examples thereof include organic polymers (in the form of a flexible plastic film, plastic sheet, or plastic substrate which is formed of a polymer material), for example, polymethylmethacrylate (PMMA), polyvinyl alcohol (PVA), polyvinyl phenol (PVP), polyether sulfone (PES), polyethylene terephthalate (PET), polyethylene naphthalate (PEN), polybutylene terephthalate (PBT), acetyl cellulose, tetraacetyl cellulose, polyphenylene sulfide, polycarbonate (PC), polyethylene (PE), polypropylene (PP), polyvinylidene fluoride, brominated phenoxy, polyamide, polyimide, polystyrene, polyarylate, polysulfone such as polyester sulfone, and polyolefin. Examples of a material forming the second substrate include the above-described examples of the material forming the substrate (material forming the first substrate). The first or second substrate may have a single-layer structure or a laminated structure. The material forming the first substrate and the material forming the second substrate may be the same as or different from each other. When the display device is a top emission type display device, light emitted from the light emitting portion may pass through the material forming the second substrate. On the other hand, when the display device is a bottom emission type display device, light emitted from the light emitting portion may pass through the material forming the first substrate.

When the first electrode (including the first electrode extending portion) in a top emission type display device or the second electrode in a bottom emission type display device (these electrodes will be sometimes referred to as "the light reflecting electrode" for convenience of description) functions as an anode electrode, examples of a material (light reflecting material) which forms the light reflecting electrode include metals having a high work function such as platinum (Pt), gold (Au), silver (Ag), chromium (Cr), tungsten (W), nickel (Ni), copper (Cu), iron (Fe), cobalt (Co), tantalum (Ta), titanium (Ti), aluminum (Al), ruthenium (Ru), molybdenum (Mo), zinc (Zn), tin (Sn), and zirconium (Zr); and alloys thereof (for example, an Ag—Pd—Cu alloy containing silver as a major component, 0.3% by mass to 1% by mass of palladium (Pd), and 0.3% by mass to 1% by mass of copper (Cu); an Al—Nd alloy; and an Al—Ce alloy). Among these, as described above, it is preferable that a material containing aluminum (Al) and silver (Ag) be used and light emitted from the light emitting portion be reflected from the material. Furthermore, a conductive material having a low work function and high optical reflectance such as aluminum (Al) or an alloy containing aluminum can function as an anode electrode by, for example, providing an appropriate hole injection layer to improve a hole injection property. For example, the thickness of the light reflecting electrode is $5\times10^{-8}$ m to $2\times10^{-6}$ m, preferably $1\times10^{-7}$ m to $1\times10^{-6}$ m, and more preferably $1\times10^{-7}$ m to $5\times10^{-7}$ m. Alternatively, a structure may be adopted in which a transparent conductive material having a high hole injection property such as Sn-doped $In_2O_3$ (ITO) or indium zinc oxide (IZO) is laminated on a dielectric multilayer or a reflective film having high reflectance formed of aluminum (Al) or the like. On the other hand, when the light reflecting electrode is used as a cathode electrode, it is preferable a material having a low work function and high optical reflectance be used. However, a conductive material having high optical reflectance which is used as an anode electrode can be used as a cathode electrode by, for example, providing an appropriate electron injection layer to improve an electron injection property.

On the other hand, when the second electrode in a top emission type display device or the first electrode in a bottom emission type display device (these electrodes will be sometimes referred to as "the semi-transmissive electrode") functions as an anode electrode, it is preferable that a material (semi-transmissive material) which forms the semi-transmissive electrode be a conductive material having a low work function such that emitted light passes through the material and electrons are efficiently injected to the organic layer. Examples of the semi-transmissive material include metals having a low work function and alloys thereof, for example, aluminum (Al), silver (Ag), magnesium (Mg), calcium (Ca), sodium (Na), strontium (Sr), copper (Cu), an alloy of an alkali metal or alkali earth metal and silver (Ag) (for example, an alloy (Mg—Ag alloy) of magnesium (Mg) and silver (Ag)), an alloy (Mg—Ca alloy) of magnesium and calcium, and an alloy (Al—Li alloy) of aluminum (Al) and lithium (Li). Among these, an Mg—Ag alloy is preferable in which the volume ratio of magnesium and silver (Mg:Ag) is, for example, 5:1 to 30:1. Alternatively, the volume ratio of magnesium and calcium (Mg:Ca) is, for example, 2:1 to 10:1. The thickness of the semi-transmissive electrode is 4 nm to 50 nm, preferably 4 nm to 20 nm, and more preferably 6 nm to 12 nm. Alternatively, the semi-transmissive electrode may be formed of a transparent conductive oxide, more specifically, a zinc oxide-based material containing, for example, zinc oxide (ZnO), aluminum oxide-doped zinc oxide (AZO), gallium-doped zinc oxide (GZO), In—$GaZnO_4$ (IGZO), indium zinc oxide (IZO), or F-doped zinc oxide (FZO); an indium oxide-based material containing indium oxide ($In_2O_3$), Sn-doped $In_2O_3$ (ITO), or fluorine-doped $SnO_2$ (FTO); or a tin oxide-based material containing tin oxide ($SnO_2$), antimony-doped $SnO_2$ (ATO), or F-doped $SnO_2$ (FTO). Alternatively, the semi-transmissive electrode may have a structure in which a first layer formed of the above-described conductive material and a second layer (for example, having a thickness of $3\times10^{-8}$ m to $1\times10^{-6}$ m) formed of the above-described transparent conductive oxide are laminated. When the laminated structure is adopted, the thickness of the first layer may be thin and 1 nm to 4 nm.

Examples of a method of forming the first electrode or the second electrode include combination methods of an etching method with an evaporation method including an electron beam evaporation method, a hot filament evaporation method, and a vacuum evaporation method, a sputtering method, a chemical vapor deposition (CVD) method or MOCVD method, and an ion plating method; various printing methods such as a screen printing method, an ink jet printing method, and a metal mask printing method; plating methods (for example, an electroplating method and an electroless plating method); a lift-off method; a laser ablation method; and a sol-gel method. According to various printing methods and plating methods, the first electrode or the second electrode having a desired shape (pattern) can be directly formed. When the first electrode or the second electrode is formed after forming the organic layer, it is particular preferable that a film formation method, such as a vacuum evaporation method, in which film-forming particles have low energy or a film formation method such as a MOCVD method be used, from the viewpoint of preventing the organic layer from being damaged. When the organic layer is damaged, a light non-emitting pixel (or light non-emitting subpixel) called "a dark spot" may be generated due to leakage current. In addition, it is preferable that the organic layer and these electrodes be formed without being exposed to the atmosphere, from the viewpoint of preventing the organic layer from deteriorating due to moisture in the atmosphere.

In the display devices and the like according to the first embodiment of the present disclosure, when the contact portion has a structure in which the first contact layer and the second contact layer are laminated, as described above, it is preferable that the second contact layer be formed of a material containing molybdenum (Mo) or titanium (Ti); and the first contact layer be formed of a material containing at least one kind of metal selected from a group consisting of aluminum (Al), silver (Ag), and copper (Cu). However, the present disclosure is not limited thereto. Other examples of the material forming the second contact layer include platinum (Pt), palladium (Pd), and gold (Au). Alternatively, the second contact layer may be formed of nitride, boride, or carbide. Specific examples thereof include molybdenum nitride (MoN), titanium nitride (TiN), niobium nitride (NbN), tungsten nitride (WN), zinc nitride (ZrN), vanadium nitride (VN), titanium boride ($TiB_2$), zinc boride ($ZrB_2$), vanadium boride ($VB_2$), niobium boride ($NbB_2$), chromium boride ($CrB_2$), tantalum boride ($TaB_2$), molybdenum boride ($MoB_5$), tungsten boride ($W_2B_5$), lanthanum boride ($LaB_6$), titanium carbide (TiC), zinc carbide (ZrC), vanadium carbide (VC), niobium carbide (NbC), tantalum carbide (TaC), chromium carbide ($Cr_3C_2$), and molybdenum carbide ($Mo_2C$). When the contact portion is a single-layer structure, the material forming the contact portion may be selected from the examples of the material forming the second contact layer. In addition, a third contact layer may be further formed below the first contact layer. In this case, the third contact layer may be formed of any one of the examples of the material forming the second contact layer. The contact portion can be formed based on an existing method although the method varies depending on a material to be used.

The first insulating layer may be formed of one kind or an appropriate combination of two or more kinds selected from a $SiO_2$-based material such as $SiO_2$, BPSG, PSG, BSG, AsSG, PbSG, SiON, SOG (spin-pm glass), low-melting-point glass, or glass paste; a SiN-based material; aluminum oxide; and an insulating resin such as a photosensitive polyimide resin, a novolac-based resin, an acrylic resin, a polybenzoxazole resin, or a polyhydroxystyrene resin. The first insulating layer can be formed using an existing process such as various CVD methods, various PVD methods including a sputtering method, a coating method, and various printing methods. In a bottom emission type display device having a configuration or structure in which light, emitted from the light emitting elements, passes through the first insulating layer, it is necessary that the first insulating layer be formed of a transparent material for light emitted from the light emitting portion and that the drive circuit be arranged so as not to interrupt light emitted from the light emitting portion. In the bottom emission type display device, the drive circuit may be provided above the second electrode. The thickness of the first insulating layer is, for example, 1 μm to 10 μm, preferably 1 μm to 5 μm, and more preferably 1.5 μm to 4 μm. A material forming the second insulating layer may be appropriately selected from the examples of the material forming the first insulating layer, and examples thereof include an insulating layer such as a polyimide resin or a novolac resin. The second insulating layer can be formed using an existing process such as a CVD method, a coating method, a sputtering method, and various printing methods.

Examples of a method of forming an opening includes a combination of a photolithographic technique and an etching technique (dry etching or wet etching) and a combination of a photolithographic technique and an exposure and developing technique for the material although the method varies depending on the material forming the first insulating layer and the material forming the second insulating layer.

A material forming the window layer may be appropriately selected from the examples of the material forming the second insulating layer. The material forming the window layer and the material forming the second insulating layer may be the same as or different from each other. The window layer can be formed using an existing process such as various CVD methods, various PVD methods including a sputtering method, a coating method, and various printing methods. Optionally, patterning technique can be further used. Examples of a planar shape of the window portion include a triangular shape, a rectangular shape, and a hexagonal shape. The number of the window portions and the number of the first electrode small pieces may be 2 or more. It is preferable that the window portions be formed at the same time as the formation of the second insulating layer, from the viewpoint of simplifying the manufacturing process.

In order to prevent moisture from entering the organic layer, an insulating or conductive protective film may be provided above the organic layer. It is preferable that the protective film be formed based on a film formation method, such as a vacuum evaporation method, in which film-forming particles have low energy or a film formation method such as a CVD or MOCVD method. Alternatively, when the protective film is formed, it is preferable that the film-forming temperature be set to room temperature in order to prevent luminance from deteriorating due to deterioration of the organic layer and that conditions for minimizing the stress of the protective film be set in order to prevent the peeling of the protective film. In addition, it is preferable that the protective film be formed without the electrodes, which have been already formed, being exposed to the atmosphere. As a result, the organic layer can be prevented from deteriorating due to moisture or oxygen in the atmosphere. Furthermore, when the display device is the top emission type, it is preferable that the protective film be formed of a material through which, for example, 80% or higher of light emitted from the organic layer passes. Specific examples thereof include the following inorganic amorphous insulating materials. Since such an inorganic amorphous insulating material does not form grains, a superior protective film having low permeability can be obtained. Specifically, it is preferable that the material forming the protective film be transparent to light emitted from the light emitting layer and be dense to prevent permeation of moisture. Examples thereof include amorphous silicon (α-Si), amorphous silicon carbide (α-SiC), amorphous silicon nitride ($α-Si_{1-x}N_x$), amorphous silicon oxide ($α-Si_{1-y}O_y$), amorphous carbon (α-C), amorphous silicon oxynitride (α-SiON), and $Al_2O_3$. When the protective film is formed of a conductive film, the protective film may be formed of the above-described transparent conductive oxide such as ITO or IZO.

When the drive circuit is configured from a thin film transistor (TFT) including a gate electrode, a gate insulating layer, a channel forming region, and source/drain electrodes, the thin film transistor can be manufactured based on an existing method.

Specific examples of a material forming the gate electrode include platinum (Pt), titanium (Ti), aluminum (Al), ruthenium (Ru), molybdenum (Mo), copper (Cu), tungsten (W), and nickel (Ni); and alloys thereof. Other examples thereof include polycrystalline silicon. The gate electrode may have a single-layer structure or a laminated structure of two or more layers (for example, a two-layer structure of an aluminum layer and a molybdenum layer).

In addition, specific examples of a material forming the gate insulating layer include $SiO_2$, SiN, SiON, metal oxides, metal nitrides, and metal oxynitrides. Examples of the metal oxides include aluminum oxide ($Al_2O_3$), titanium oxide ($TiO_2$), ZnO, indium oxide ($In_2O_3$), tin oxide ($SnO_2$), gallium oxide ($Ga_2O_3$), tellurium oxide ($TeO_2$), germanium oxide ($GeO_2$), cadmium oxide (CdO), tungsten oxide ($WO_3$), and molybdenum oxide ($MoO_3$). Regarding $TiO_2$, rutile type which is the most stable structure is preferable; and regarding $Ga_2O_3$, $\beta$-$Ga_2O_3$ which is the most stable structure is preferable. In addition, examples of the metal nitrides include aluminum nitride (AlN), and titanium nitride (TiN). Examples of the metal oxynitride include aluminum oxynitride and titanium oxynitride. The gate insulating layer may have a single-layer structure and a laminated structure of two or more layers.

Examples of a material forming the channel forming region include polysilicon, amorphous silicon, and semiconductor materials containing an oxide semiconductor. Examples of the oxide semiconductor material include compounds containing oxygen and an element such as indium (In), gallium (Ga), zinc (Zn), tin (Sn), or zirconium (Zr). The oxide semiconductor may be an amorphous oxide semiconductor or a crystalline oxide semiconductor. Examples of the amorphous oxide semiconductor include indium gallium zinc oxide (IGZO). Examples of the crystalline oxide semiconductor include ZnO, IZO, and indium gallium oxide (IGO). The channel forming region formed of an oxide semiconductor may have a laminated structure of an amorphous film and a crystalline film. In this case, it is preferable that the source/drain electrodes be in contact with the crystalline film.

In the display devices and the like according to the first embodiment of the present disclosure, it is preferable that the source/drain electrodes have the same configuration as that of the contact portion. However, the present disclosure is not limited thereto. In the display devices and the like according to the first embodiment of the present disclosure in which the source/drain electrodes have a different configuration from the contact portion, or in the display devices and the like according to the second embodiment of the present disclosure, examples of a material forming the source/drain electrodes include at least one kind of metal selected from a group consisting of gold (Au), platinum (Pt), silver (Ag), titanium (Ti), aluminum (Al), ruthenium (Ru), molybdenum (Mo), copper (Cu), zinc (Zn), tin (Sn), zirconium (Zr), tungsten (W), and nickel (Ni). Examples of a metal compound include metal oxides, metal nitrides, metal oxynitrides, and metal carbides. Specific examples thereof include zinc oxide-based materials containing ZnO, AZO, GZO, IZO, and FZO; indium oxide-based materials containing $In_2O_3$, ITO, and FTO; tin oxide-based materials containing $SnO_2$, ATO, and FTO; gallium oxide ($Ga_2O_3$); tellurium oxide ($TeO_2$); germanium oxide ($GeO_2$); cadmium oxide (CdO); tungsten oxide ($WO_3$); molybdenum oxide ($MoO_3$); $CuAlO_2$; LaCuOS; LaCuOSe; $SrCu_2O_2$; and NiG.

When the display device is a color display device, one pixel includes three subpixels including a red light emitting subpixel which emits red light, a green light emitting subpixel which emits green light, and a blue light emitting subpixel which emits blue light; or four subpixels. In the case of such a color display device, a configuration may be adopted in which the red light emitting subpixel is configured from a light emitting element which emits red light, the green light emitting subpixel is configured from a light emitting element which emits green light, and the blue light emitting subpixel may is with a light emitting element which emits blue light; or in a bottom emission type display device having the above-described preferable configurations, a configuration may be adopted in which the second substrate includes a color filter, the light emitting elements emit white light, and thus the respective color light emitting subpixels is configured from a combination of the light emitting elements which emit white light and the color filter. The second substrate may include a light shielding film (black matrix). Likewise, in a bottom emission type display device, the first substrate may have a color filter and a light shielding film (black matrix).

A configuration in which one pixel (or subpixel) is configured from one light emitting element is not particularly limited. Examples of an arrangement of pixels (or subpixels) include a stripe arrangement, diagonal arrangement, a delta arrangement, and a rectangle arrangement. In addition, a configuration in which one pixel (or subpixel) is configured from plural light emitting elements is not particularly limited. Examples of an arrangement of pixels (or subpixels) include a stripe arrangement.

When an organic EL display device is configured as a color organic EL display device, as described above, subpixels are configured from organic EL elements which configure the organic EL display device. In this case, as described above, one pixel includes three kinds of subpixels including a red light emitting subpixel which emits red light, a green light emitting subpixel which emits green light, and a blue light emitting subpixel which emits blue light. Therefore, when the number of the organic EL elements which configure the organic EL display device is represented by an expression of N×M, the number of pixels is obtained by an expression of (N×M)/3. The organic EL display device can be used as a monitor device which configures a personal computer, a video camera, or a digital camera and can be used as a monitor device which is incorporated into a television set, a mobile phone, a personal digital assistant (PDA), or a game device. Alternatively, the organic EL display device can be applied to an electronic view finder (EVF) or a head mounted display (HMD). Alternatively, the organic EL display device can be applied to a backlight device for a liquid crystal display device or a lighting device including surface light source.

The organic layer includes the light emitting layer (for example, the light emitting layer formed of an organic light emitting material). Specifically, for example, the organic layer may have a structure in which a hole transport layer, a light emitting layer, and an electron transport layer are laminated; a structure in which a hole transport layer and a light emitting layer also serving as an electron transport layer are laminated; or a structure in which a hole injection layer, a hole transport layer, a light emitting layer, an electron transport layer and an electron injection layer are laminated. In addition, when these laminated structures are configured from "tandem units", the organic layer may include a two-stage tandem structure in which a first tandem unit, a connection layer, and a second tandem unit are laminated; or a three- or more stage tandem structure in which three or more tandem units are laminated. In these cases, an organic layer which emits white light as a whole can be obtained by changing the color of emitted light into red, green, and blue with the respective tandem units. Examples of a method of forming the organic layer include physical vapor deposition methods (PVD methods) such as a vacuum evaporation method; printing methods such as a screen method and an ink jet printing method; a laser transfer method of irradiating a structure, in which a laser absorption layer and an organic layer are formed and laminated on a transfer substrate, with laser light and separating the organic layer from the laser absorption layer to transfer the organic layer; and various coating methods. When the organic layer is formed based on a vacuum evaporation method, an organic layer can be obtained by using a so-called metal mask and depositing a material which passes through an opening of the metal mask. The organic layer can be formed on the entire surface without patterning.

Example 1

Figure 2A:
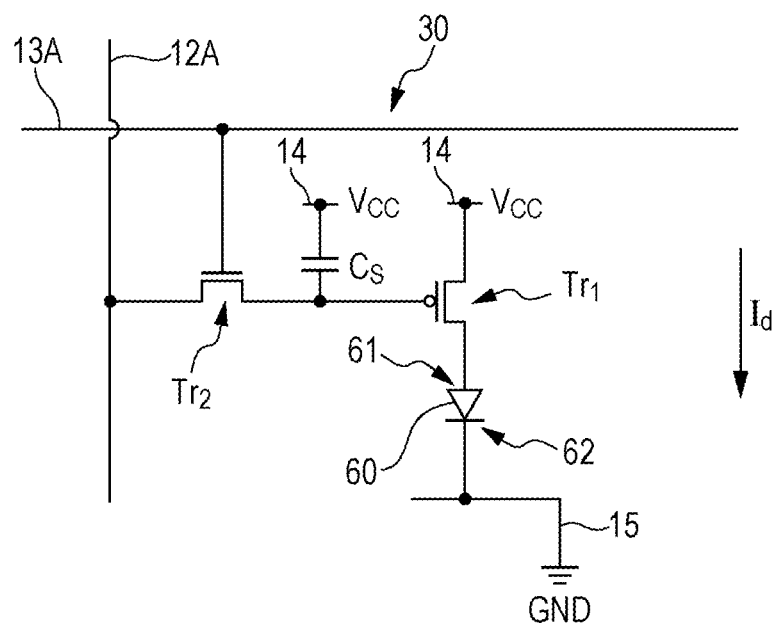
FIGS. 2A and 2B are equivalent circuit schematics of a drive circuit of the display device according to Example 1.
Figure 2B:
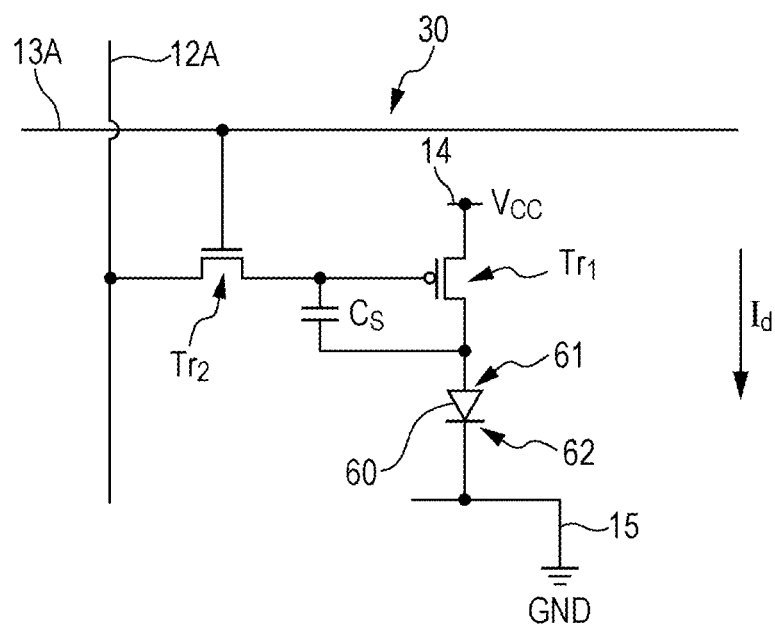
Figure 3:
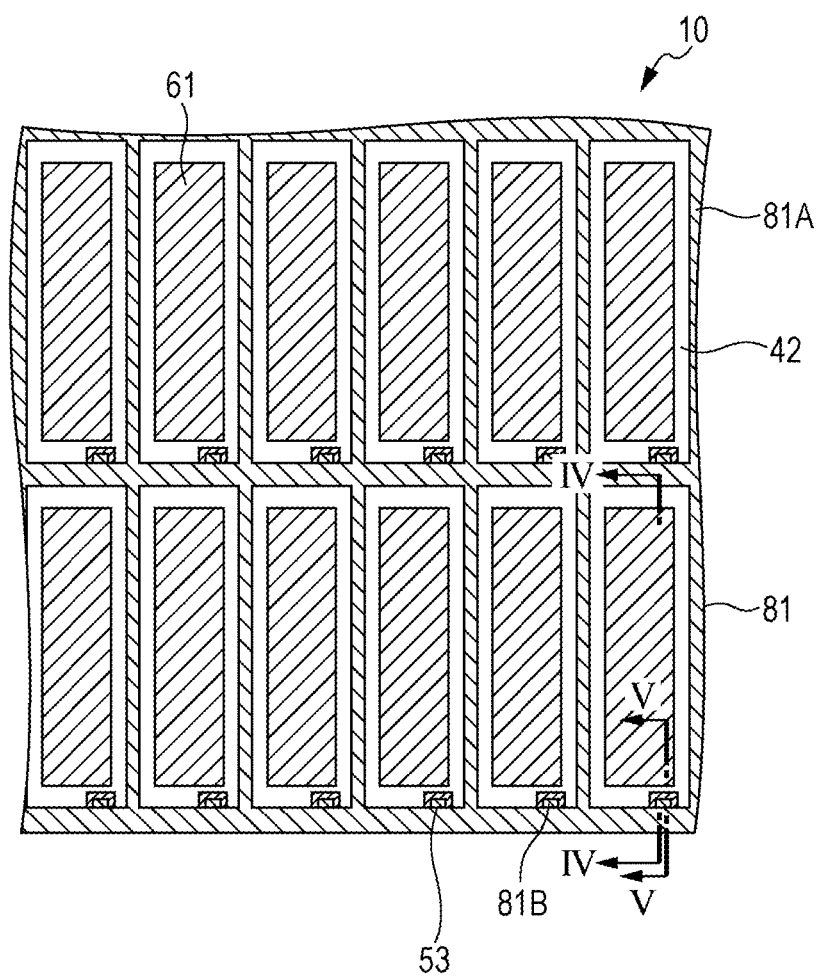
FIG. 3 is a diagram schematically illustrating an arrangement state of a part of components of the display device according to Example 1.
Figure 4:
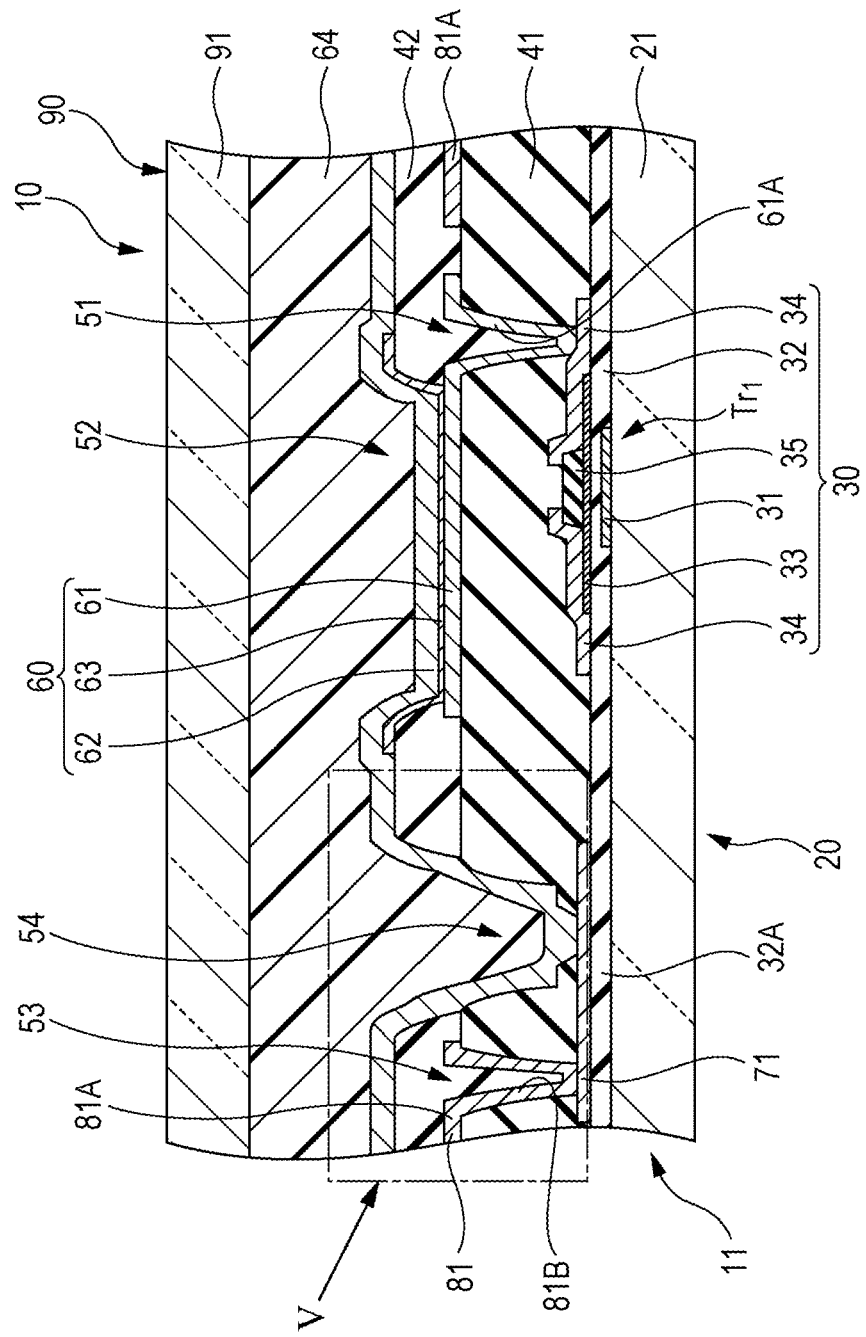
FIG. 4 is a cross-sectional view schematically illustrating a part of the display device according to Example 1.
Figure 5:
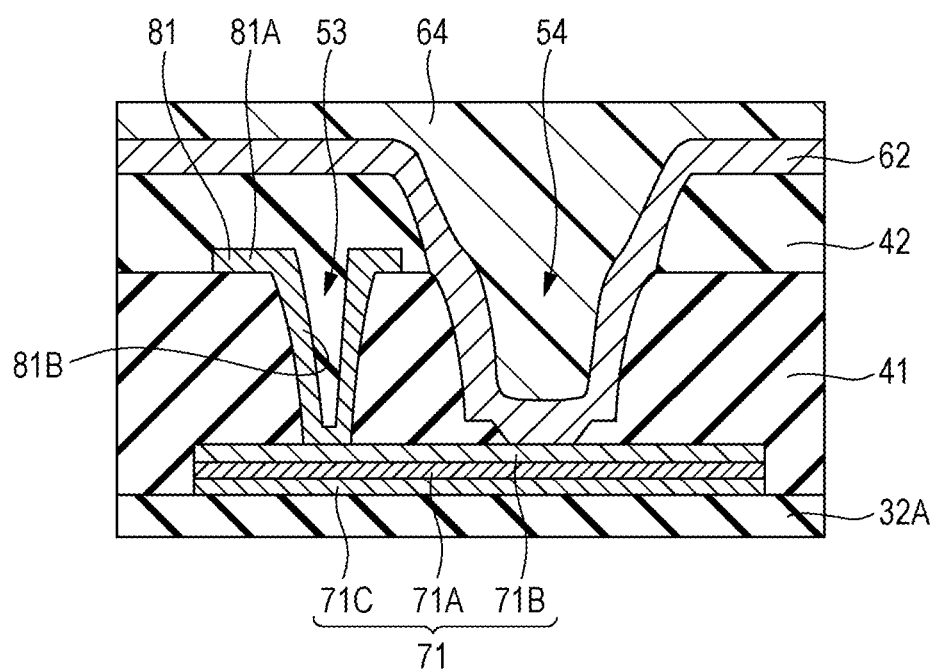
FIG. 5 is a cross-sectional view schematically illustrating an enlarged portion including a contact portion in the display device according to Example 1.
Figure 6A:
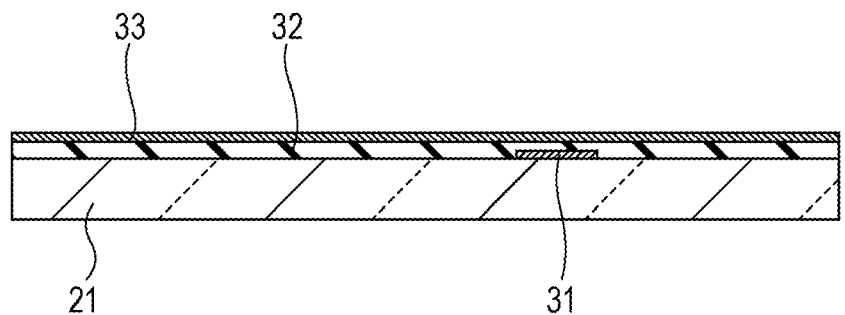
Figure 6B:
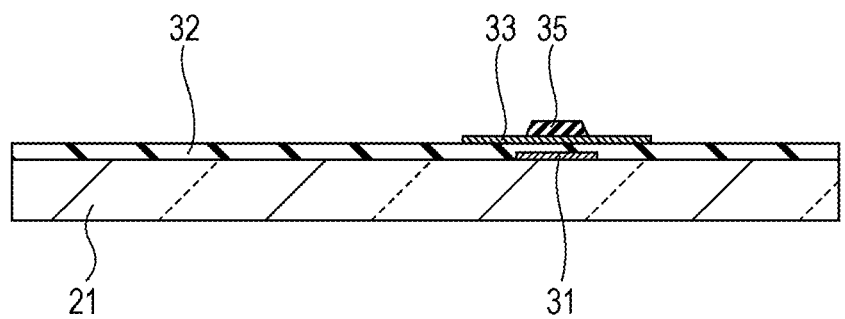
Figure 6C:
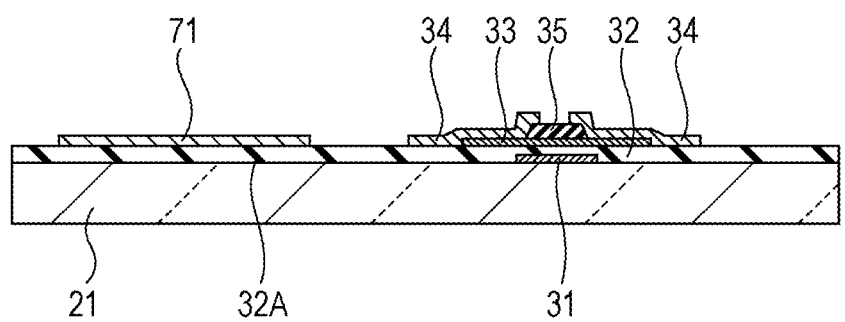
Figure 7A:
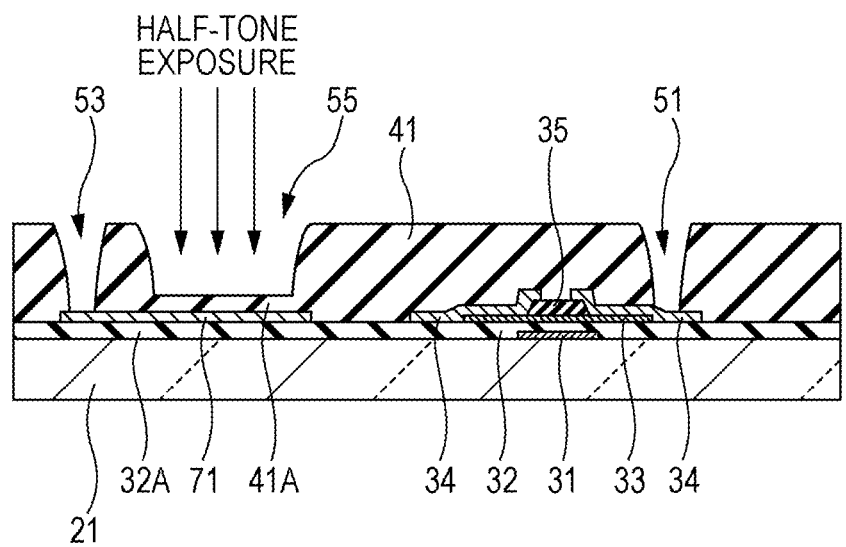
Figure 7B:
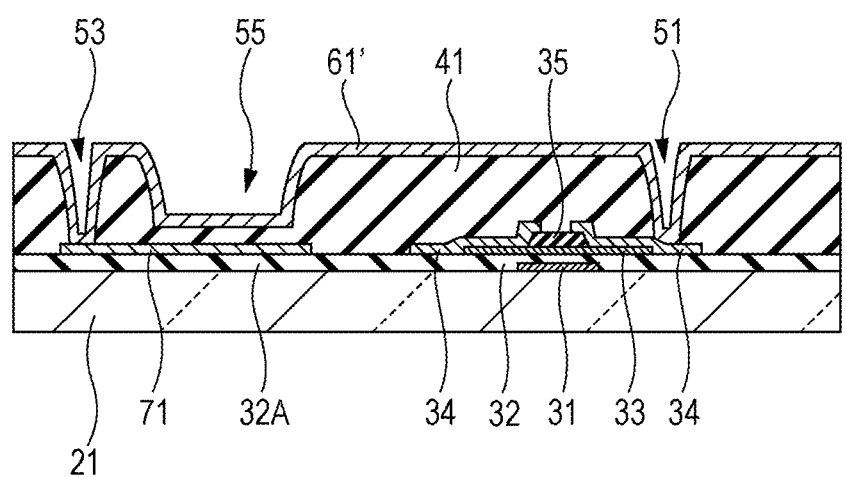

Example 1 relates to the display device according to the first embodiment of the present disclosure and the method of manufacturing the same. FIG. 1 is a schematic diagram of a display device according to Example 1; and FIGS. 2A and 2B are equivalent circuit schematics of a drive circuit of the display device according to Example 1. In addition, FIG. 3 is a diagram schematically illustrating an arrangement state of a part of components of the display device according to Example 1; FIG. 4 is a cross-sectional view schematically illustrating a part of a display region of the display device according to Example 1; and FIG. 5 is a cross-sectional view schematically illustrating an enlarged portion (region surrounded by a chain line in FIG. 4) including a contact portion in the display device according to Example 1. FIG. 4 is a schematic partial cross-sectional view taken along line IV-IV in FIG. 3; and FIG. 5 is a schematic partial cross-sectional view taken along line V-V in FIG. 3. In addition, FIG. 3 shows the arrangement state of a first electrode, an auxiliary electrode layer, and a first opening. The first electrode, the auxiliary electrode, and the first opening are hatched so as to be clarified.

In concrete terms, the display device according to Example 1 is an organic electroluminescence display device (organic EL display device) and a light emitting portion emits light based on an organic EL phenomenon. In addition, a drive circuit is configured from a thin film transistor (TFT).

That is, a display device 10 according to Example 1 includes light emitting elements 11 that are arranged in a two-dimensional matrix, in which the light emitting elements include:

(a) a drive circuit 30 which is provided on a substrate (first substrate) 21;

(b) a first insulating layer 41 which covers the drive circuit 30 and the substrate (first substrate) 21;

(c) a light emitting portion 60 in which a first electrode 61, an organic layer 63 having a light emitting layer (not illustrated), and a second electrode 62 are laminated; and (d) a second insulating layer 42 which covers the first electrode 61.

In this display device, the light emitting elements 11 further include:

(e) an auxiliary electrode layer 81; and (f) a contact portion 71 which is formed on the substrate (first substrate) 21.

In addition, the first electrode 61 is formed on the first insulating layer 41 and is electrically connected to the drive circuit 30 through a first electrode extending portion 61A which is formed on a first opening 51 provided in the first insulating layer 41.

The organic layer 63 is formed at least on a portion of the first electrode 61 which is exposed in the bottom of a second opening 52 formed on the second insulating layer 42 (specifically, in Example 1, the organic layer 63 is formed over a range from the portion of the first electrode 61, which is exposed in the bottom of the second opening 52 formed on the second insulating layer 42, to a part of an upper area of the second insulating layer 42).

A third opening 53, through which the contact portion 71 is exposed in the bottom, is formed on the first insulating layer 41.

A fourth opening 54, through which the contact portion 71 is exposed in the bottom, is formed at least on the second insulating layer 42 (specifically, in Example 1, on the second insulating layer 42).

The auxiliary electrode layer 81 is formed distant from the first electrode 61 and over a range from an upper area of the first insulating layer 41 to an internal area of the third opening 53.

The second electrode 62 is formed over a range from an upper area of the organic layer 63 to an upper area of the second insulating layer 42 and furthermore to an internal area of the fourth opening 54.

The light emitting elements 11 is provided in a first panel 20. A second panel 90 is bonded to the first panel 20 with the light emitting elements 11 interposed therebetween. The second panel 90 includes a second substrate 91. The display device according to Example 1 is a top emission type display device in which light, emitted from the light emitting layer, exits through the second panel 90.

As illustrated in FIG. 1, the display device 10 is a color display device that includes a display region 10' in which the light emitting elements 11 (red light emitting elements 11R which emits red light, green light emitting elements 11G which emits green light, and blue light emitting elements 11B which emits blue light) are arranged on the first substrate 21 in a two dimensional matrix. A signal line drive circuit 12 and a scanning line drive circuit 13, which are image display drivers, are provided in a peripheral portion 10" of the display device 10. The light emitting layer of the red light emitting subpixels 11R can be formed of, for example, a material obtained by mixing 4,4'-bis(2,2-diphenylvinyl)biphenyl (DPVBi) with 2,6-bis[(4'-methoxydiphenylamine) styryl]-1,5-dicyanonaphthalene (BSN). The light emitting layer of the green light emitting subpixels 11G can be formed of, for example, a material obtained by mixing DPVBi with coumarin 6. The light emitting layer of the blue light emitting subpixels 11B can be formed of, for example, a material obtained by mixing DPVBi with 4,4'-bis[2-{4-(N,N-diphenylamino)phenyl}vinyl]biphenyl.

FIGS. 2A and 2B are equivalent circuit schematics illustrating examples of the drive circuit 30. The drive circuit 30 is formed below the first electrode 61 and includes a drive transistor $Tr_1$, a write transistor $Tr_2$, and a capacitor (storage capacitor) $C_S$. In the drive transistor $Tr_1$, a first source/drain electrode is connected to a first power supply line 14 ($V_{CC}$) and a second source/drain electrode is connected to the first electrode 61 which configures the light emitting elements. In addition, a gate electrode of the drive transistor $Tr_1$ is connected to a second source/drain electrode of the write transistor $Tr_2$ and is connected to a first terminal of the capacitor $C_S$. A first source/drain electrode of the write transistor $Tr_2$ is connected to a signal line 12A. A gate electrode of the write transistor $Tr_2$ is connected to a scanning line 13A. The signal line 12A extends in, for example, a column direction and the scanning line 13A extends in, for example, a row direction. Regions in which the signal line 12A and the scanning line 13A intersect each other correspond to subpixels. The signal line 12A is connected to the signal line drive circuit 12. Image signals are supplied from the signal line drive circuit 12 to the write transistor $Tr_2$ through the signal line 12A. The scanning line 13A is connected to the scanning line drive circuit 13.

Scanning signals are supplied from the scanning line drive circuit 13 to a gate electrode of the write transistor $Tr_2$ through the scanning line 13A. The second electrode 62 which configures the light emitting elements is connected to a second power supply line 15 (GND). In the drive circuit 30 illustrated in FIG. 2A, the drive transistor $Tr_1$ is configured from a p-channel type TFT, and a second end of the capacitor $C_S$ is connected to the first power supply line 14. On the other hand, in the drive circuit 30 illustrated in FIG. 2B, the drive transistor $Tr_1$ is configured from an n-channel type TFT, and a second end of the capacitor $C_S$ is connected to the second source/drain electrode of the drive transistor $Tr_1$ and the first electrode 61 which configures the light emitting elements.

The drive transistor $Tr_1$ and the write transistor $Tr_2$ are configured from a thin film transistor (TFT) having an existing configuration or structure. The TFT illustrated in the drawing is a bottom gate/top contact type. FIG. 4 illustrates the drive transistor $Tr_1$. The drive transistor $Tr_1$ includes a gate electrode 31, a gate insulating layer 32, a semiconductor layer 33 forming a channel forming region, and source/drain electrodes 34 which are formed on the substrate (first substrate) 21. When the source/drain electrodes 34 are etched, a stopper insulating film 35 for protecting the semiconductor layer 33 is formed on the semiconductor layer 33. Basically, a material forming the stopper insulating film is particularly limited as long as it has electrical insulating properties. However, a stable material having low response is preferable, and examples thereof include silicon oxides, silicon nitrides, aluminum oxides, and titanium oxides. As described below, the source/drain electrodes 34 have the same configuration as that of the contact portion 71. The gate electrode 31 has a structure in which an aluminum layer (lower layer) having a thickness of 0.3 μm and a molybdenum layer (upper layer) having a thickness of 40 nm are laminated. In addition, the gate insulating layer 32 is formed of $SiO_2$ with a thickness of 0.4 μm; and the semiconductor layer 33 is formed of IGZO with a thickness of 40 nm. These thin film transistors $Tr_1$ and $Tr_2$ are covered with the first insulating layer 41. A protective layer, which is formed of an insulating material such as aluminum oxide, silicon oxide, or silicon nitride, may be provided between the thin film transistors $Tr_1$ and $Tr_2$ and the first insulating layer 41.

In the display device 10 according to Example 1, the first substrate 21 and the second substrate 91 are formed of a transparent polyimide film. In addition, the first insulating film 41 and the second insulating film 42 are formed of a photosensitive polyimide resin. Furthermore, the organic layer 63 include a hole transport layer, a light emitting layer, and an electron transport layer; or include a hole injection layer, a hole transport layer, a light emitting layer, an electron transport layer, and an electron injection layer. However the organic layer 63 is illustrated as a single layer in the drawing.

As described above, the display device according to Example 1 is a top emission type display device in which light, emitted from the light emitting layer, exits through the second panel 90 and passes through the second electrode 62. In addition, the second electrode 62 is a common electrode shared by the plural light emitting elements (more specifically, all the light emitting elements 11). That is, the second electrode 62 is a so-called common electrode. The first electrode 61 and the second electrode 62 are separated and insulated from each other by the second insulating layer 42. In addition, a sealing layer 64, formed of a transparent polyimide resin, is formed between the second electrode 62 and the second substrate 91.

The contact portion 71, which is formed on the substrate (first substrate) 21 to be distant from the thin film transistors $Tr_1$ and $Tr_2$, includes at least a structure in which a first contact layer 71A and a second contact layer 71B are laminated in this order from the substrate side (in Example 1, a structure in which a third contact layer 71C, the first contact layer 71A, and the second contact layer 71B are laminated). In the drawings other than FIG. 5, the contact 71 is illustrated as a single layer. An etching rate of a material forming the second contact layer 71B is lower than that of a material forming the first electrode 61. In addition, the material forming the second contact layer 71B is a metal which is difficult to oxidize or a material containing the metal which is difficult to oxidize. Furthermore, a material forming the first contact layer 71A is a metal having higher conductivity than that of the material forming the second contact layer 71B, or a material containing the metal having higher conductivity. Specifically, the second contact layer 71B and the third contact layer 71C are formed of a material containing molybdenum (Mo) (more specifically, a molybdenum layer having a thickness of 0.05 μm). Meanwhile, the first contact layer 71A is formed of a material containing aluminum (Al) (more specifically, an aluminum layer having a thickness of 0.5 μm). In addition, the source/drain electrodes 34 are formed of the same material as the material forming the contact layer 71 (a structure in which a Mo Layer, an Al layer, and a Mo layer are laminated). In other words, the material forming the source/drain electrodes 34 and the material forming the contact portion 71 are materials which can be simultaneously etched.

In addition, the first electrode 61 is formed of a material containing aluminum (Al) (specifically, an aluminum alloy such as an Al—Nd alloy having a thickness of 0.3 μm), and light emitted from the light emitting layer is reflected from the first electrode. That is, the first electrode 61 configures the light reflecting electrode. The first electrode 61 is provided on the first insulating layer 41 so as to cover the drive circuit 30. On the other hand, the second electrode 62 is formed of ITO with a thickness of 10 nm.

The auxiliary electrode layer 81 includes a portion 81A formed on the first insulating layer 41 and a portion 81B formed inside the third opening 53. As illustrated in FIG. 3, the portion 81A of the auxiliary electrode layer 81 formed on the first insulating layer 41 surrounds the first electrode 61, formed on the first insulating 41, in a state being distant from the first electrode 61. A material forming the auxiliary electrode layer 81 is the same as the material forming the first electrode 61. In other words, the material forming the auxiliary electrode layer 81 and the material forming the first electrode 61 are materials which can be simultaneously etched.

A portion of an auxiliary wiring layer 81, which is located at an edge of the display region 10' of the display device 10, is connected to a power supply (not illustrated in FIGS. 1, 3, and 4), which is provided in the peripheral portion 10" of the display device 10, through the contact portion 71 formed on the substrate (first substrate) 21 and a wiring layer (not illustrated in FIGS. 1, 3, and 4) extending from the contact portion 71. A voltage is applied from the power supply to the second electrode 62 through the wiring layer and furthermore through the auxiliary wiring layer 81 and the contact portion 71. The power supply, the wiring layer, the auxiliary wiring layer 81, and the contact portion 71 are included in the second power supply line 15 illustrated in FIGS. 2A and 2B.

The first electrode 61 and the organic layer 63 included in the light emitting portion 60 are separated from another first electrode 61 and another organic layer 63 included in another adjacent light emitting portion 60, by the second insulating layer 42 formed on the first insulating layer 41. The second openings 52 have a rectangular shape in a plan view and are arranged in a two-dimensional matrix. In addition, the fourth opening 54, which is formed on the second insulating layer 42 and through which the contact portion 71 is exposed in the bottom, has a shape having a wide upper portion and a narrow lower portion (that is, a so-called forward tapered shape). The second electrode 62 and the auxiliary wiring layer 81 are electrically connected to each other through the contact portion 71.

In the display device 10, when a current flows through the first electrode 61 through the thin film transistor $Tr_1$, the light emitting layer emits light based on an illuminance corresponding to image signals transmitted through the signal line 12A. The light, emitted from the light emitting layer, is reflected from the first electrode 61, passes through the second electrode 62 and the sealing layer 64, and exits through the second substrate 91. As a result, a predetermined image is displayed on the display device 10.

Hereinafter, a method of manufacturing the display device 10 according to Example 1 will be described with reference to FIGS. 6A, 6B, 6C, 7A, 7B, 8A, 8B, 9A, 9B, 10A, and 10B.

Step-100

First, the drive circuit 30 and the contact portion 71 are provided on the substrate (first substrate) 21.

Specifically, the gate electrode 31 is first formed on the first substrate 21 based on an existing method and then the gate insulating layer 32 is formed on the entire surface based on an existing method. Next, the semiconductor layer 33, formed of an oxide semiconductor, is formed on the gate insulating layer 32 based on an existing method. In this way, a structure illustrated in FIG. 6A can be obtained.

When the semiconductor layer 33 is formed of, for example, indium gallium zinc oxide (IGZO), the semiconductor layer 33 can be formed using plasma discharge with mixed gas of argon gas and oxygen gas, based on, for example, a DC sputtering method using an IGZO ceramic target. Before the plasma discharge, the air is exhausted until the vacuum degree in a vacuum chamber is less than or equal to $1 \times 10^{-4}$ Pa, and the mixed gas of argon gas and oxygen gas is introduced into the vacuum chamber. In addition, when the semiconductor layer 33 is formed of, for example, zinc oxide (ZnO), the semiconductor 33 can be formed based on, for example, an RF sputtering method using a ZnO ceramic target; or a DC sputtering method using a zinc metal target in a gas atmosphere containing argon gas and oxygen gas. At this time, the carrier density in the semiconductor layer 33 can be controlled based on a flow ratio of argon gas and oxygen gas.

Next, optionally, the semiconductor layer 33 is patterned with a desired shape (for example, an island shape). During patterning, wet etching may be performed using an etchant formed of a mixed acid of a phosphoric acid, an acetic acid, and a nitric acid. Basically, the shape of the semiconductor layer 33 is not limited, but an island shape including the gate electrode 31 and the vicinity thereof may be adopted. Next, the stopper insulating film 35 having a thickness of, for example, 0.3 µm is formed on the semiconductor layer 33. In this way, a structure illustrated in FIG. 6B can be obtained.

Next, the source/drain electrodes 34 are formed on the semiconductor layer 33 and on the gate insulating layer 32, respectively. At the same time, the contact portion 71 is formed in an island shape on the substrate (first substrate) 21, more specifically, on an extending portion 32A of the gate insulating layer 32 (refer to FIG. 6C). The source/drain electrodes 34 and the contact portion 71 are formed based on an existing method such as a combination of an etching method with various PVD methods including a vapor evaporation method and a sputtering method or various CVD methods although the method varies depending on a material to be used. As the etching method, a wet etching method using an etchant, formed of a mixed acid of a phosphoric acid, an acetic acid, and a nitric acid, may be adopted. The source/drain electrodes 34 and the contact portion 71 may be formed in the same step or in different steps.

Step-110

Next, the first insulating layer 41, which covers the drive circuit 30, the contact portion 71, and the substrate 21, is formed. Specifically, the first insulating layer 41 can be obtained by performing coating with a solution of a photosensitive polyimide resin according to a spin coating method, a slit coating method, or the like.

Step-120

The first opening 51, through which a part of the drive circuit 30 (specifically, a part of the source/drain electrodes 34 or an extending portion thereof) is exposed in the bottom, is formed on a portion of the first insulating layer 41 which is located above the drive circuit 30. At the same time, a concave portion 55 and the third opening 53, through which the contact portion 71 is exposed in the bottom, are formed on a portion of the first insulating layer 41 which is located above the contact portion 71 (refer to FIG. 7A). Specifically, the first insulating layer 41 is exposed and developed to form the third opening 53 and the first opening 51. Then, the first insulating layer 41 is baked.

In this case, at least the first opening 51 and the third opening 53 are formed on the first insulating layer 41 based on a photolithographic technique; and a half-tone mask or a grey-tone mask is used in the photolithographic technique. Specifically, when the first insulating layer 41 is exposed, a light-transmissive portion of a photomask for forming the concave portion 55 has a half-tone mask or a grey-tone mask such that the concave portion 55 does not reach the contact portion 71. That is, the first insulating layer 41 is exposed such that a part of the first insulating layer 41 remains in the thickness direction between the bottom of the concave portion 55 and the contact portion 71; and such that the first opening 51 and the third opening 53 reaches the contact portion 71. It is preferable that the first opening 51, the third opening 53, and the concave portion 55 be formed in a forward tapered shape. In addition, it is preferable that the forward tapered shape be as gradual as possible. It is preferable that a cross-section of an opening of the concave portion 55 be wider than those of the first opening 51 and the third opening 53. In addition, it is preferable that a portion 41A of the first insulating layer 41, which is located below the concave portion 55, have a minimum thickness with which it can function as a protective film for the contact portion 71 in a subsequent etching step for forming the first electrode 61 and the auxiliary electrode layer 81. In this way, the portion 41A of the first insulating layer 41, which is located below the concave portion 55, is formed to be thin. As a result, in the subsequent steps, the portion 41A of the first insulating layer 41, which is located below the concave portion 55, is easily removed. The thickness of the portion 41A of the first insulating layer 41, which is located below the concave portion 55, is, for example, 0.1 µm to 1 µm and preferably 0.1 µm to 0.5 µm.

Step-130

Figure 8A:
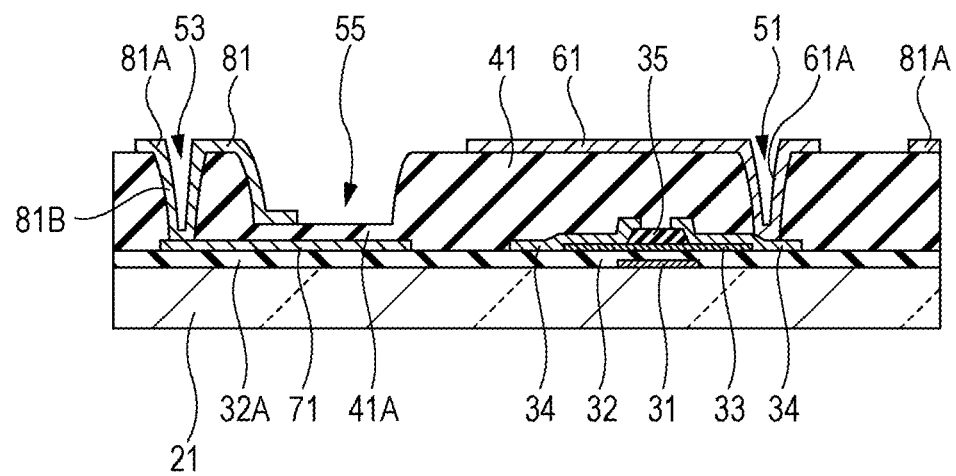

Next, a conductive material layer 61', which has a thickness of about 0.3 µm and is formed of an aluminum alloy, is formed on the entire surface based on, for example, a sputtering method (refer to FIG. 7B) and the conductive material layer 61' is patterned based on a photolithographic technique and an etching technique to form the first electrode 61 on the first insulating layer 41, to form the first electrode extending portion 61A in the first opening 51, and to form the auxiliary electrode layer 81, which is distant from the first electrode 61, over a range from an upper area of the first insulating layer 41 to an internal area of the third opening 53, and at the same time, to remove the conductive material layer 61' on at least a part (41A) of the bottom of the concave portion 55 (refer to FIG. 8A). During etching, for example, an etchant formed of a mixed acid of a phosphoric acid, an acetic acid, and a nitric acid may be used.

In the bottom of the concave portion 55, since the portion 41A of the first insulating layer 41 is coated with the contact portion 71, the contact portion is prevented from being etched. In addition, the auxiliary wiring layer 81 is formed on a part of the bottom and side walls of the concave portion 55. As a result, the area of the auxiliary wiring layer 81 is increased and the total resistance of the auxiliary wiring layer can be reduced. However, the area of the auxiliary wiring layer 81 is not necessarily formed on a part of the bottom and side walls of the concave portion 55.

Step-140

Figure 8B:
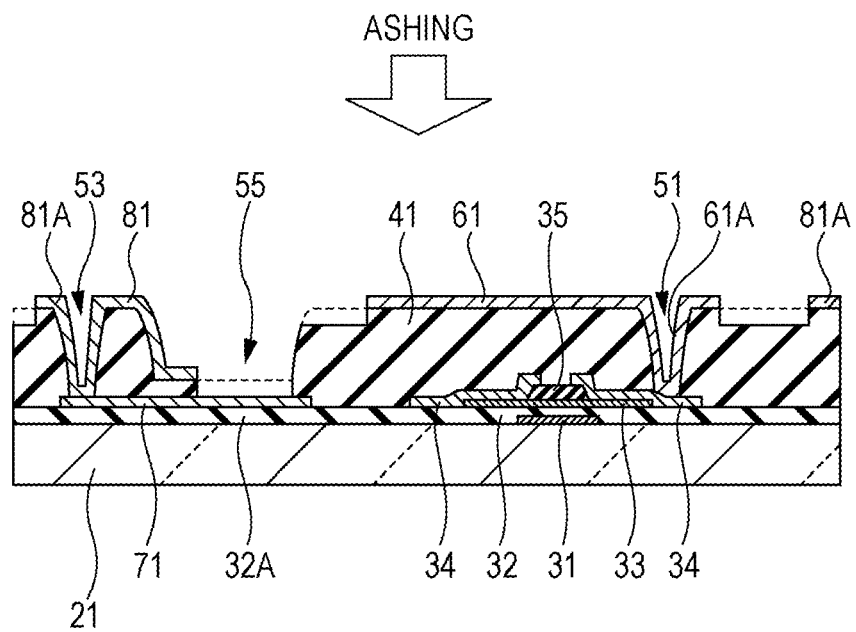

Next, the portion 41A of the first insulating layer 41, which is located on an exposed portion in the bottom of the concave portion 55, is removed to expose the contact portion 71 (refer to FIG. 8B). Specifically, the entire surface of the first insulating layer 41 is asked. As a result, an exposed portion of the first insulating layer 41 at a given thickness from the surface is removed.

Step-150

Next, the second insulating layer 42 is formed on the entire surface. Then, the second opening 52, through which the first electrode 61 is exposed in the bottom, is formed on the second insulating layer 42. At the same time, the fourth opening 54, which reaches an exposed portion of the contact portion 71 in the bottom of the concave portion 55, is formed on the second insulating layer 42 (refer to FIG. 9A). Specifically, in the same manner as in Step-110 and Step-120, a solution of a photosensitive polyimide resin is coated using a spin coating method or a slit coating method, followed by exposing and developing to form the second opening 52 and the fourth opening 54. Then, the second insulating layer 42 is baked.

Step-160

Figure 9A:
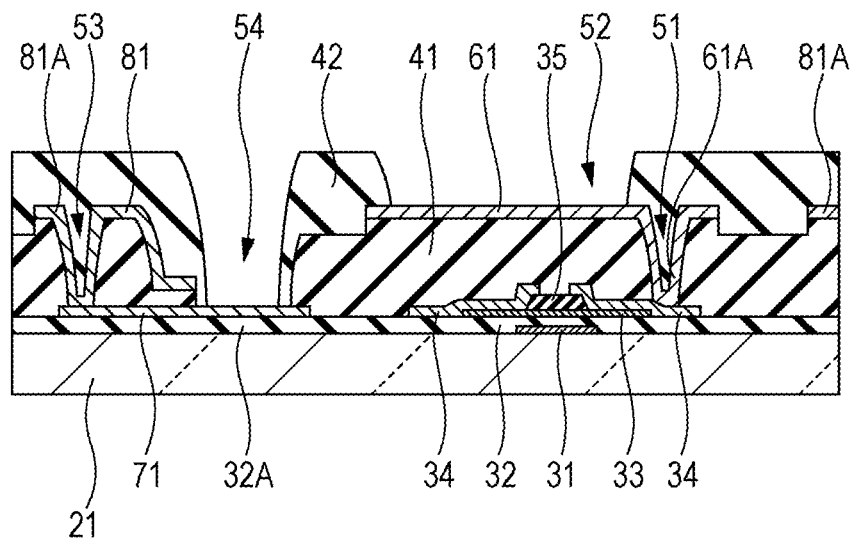
Figure 9B:
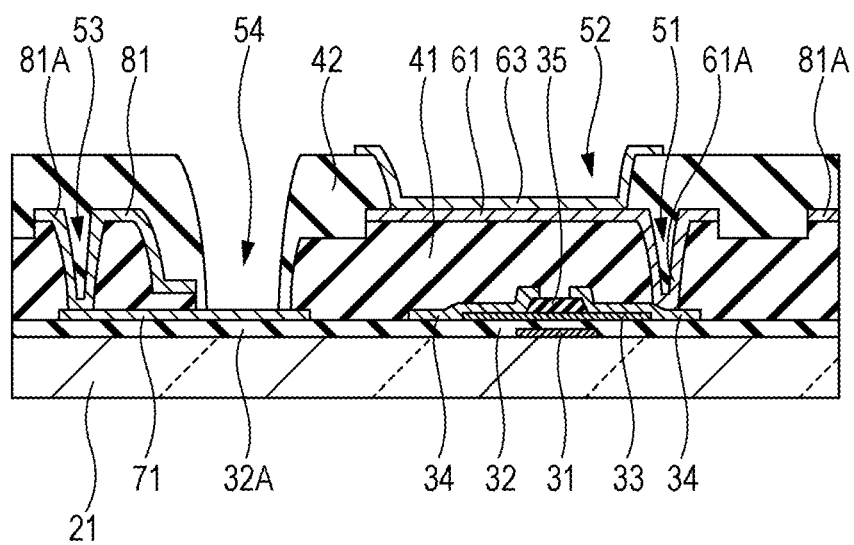

Next, the organic layer 63 is formed over a range from an exposed portion of the first electrode 61 in the bottom of the second opening 52 to a part of an upper area of the second insulating layer 42, based on an existing method (refer to FIG. 9B).

Step-170

Figure 10A:
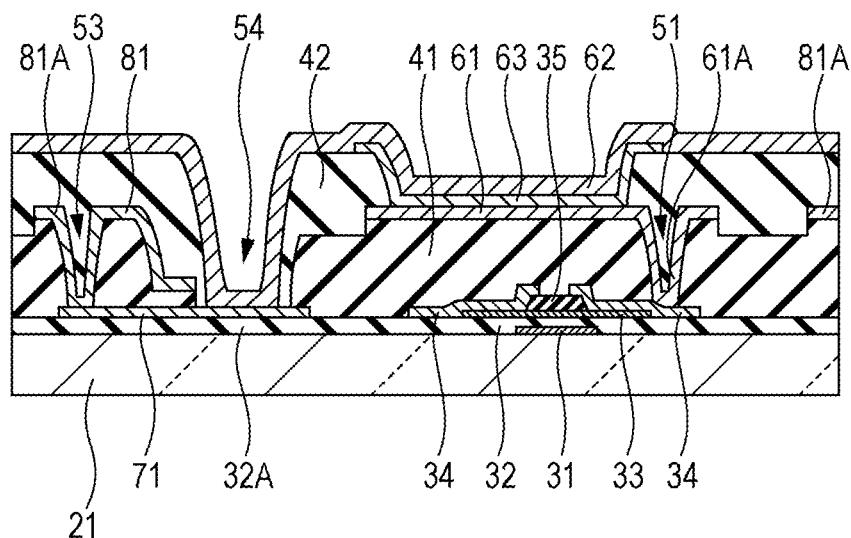

Next, the second electrode 62 is formed over a range from an upper area of the organic layer 63 to an upper area of the second insulating layer 42 and furthermore to an internal area of the fourth opening 54 (refer to FIG. 10A).

Step-180

Figure 10B:
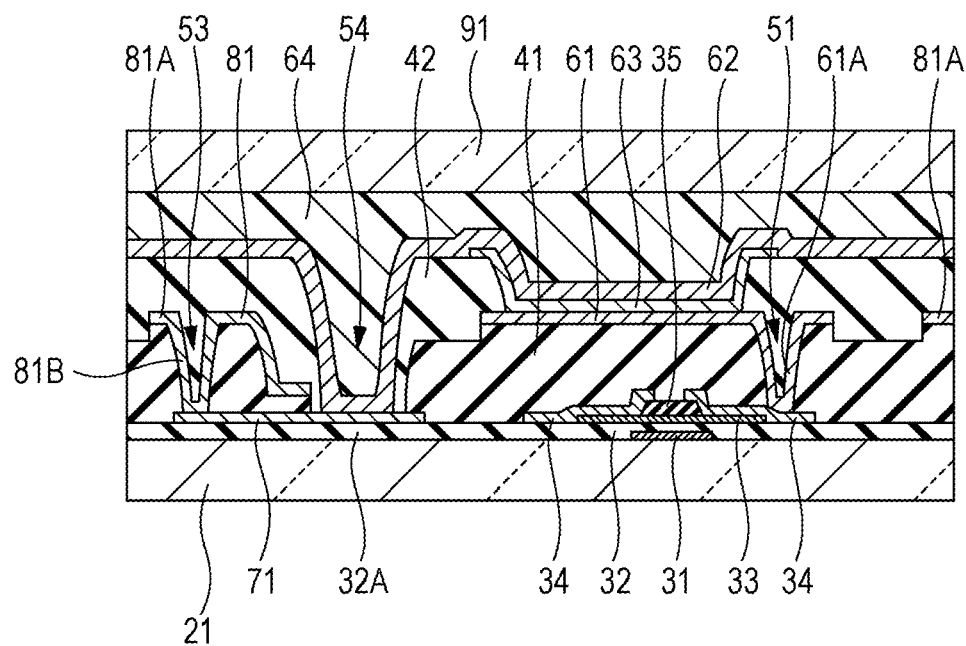

Next, the sealing layer 64 is formed on the second electrode 62. Then, the first substrate 21 and the second substrate 91 are bonded to each other with the sealing layer 64 interposed therebetween in, for example, a vacuum. In this way, the display device 10 illustrated in the schematic partial cross-sectional view of FIG. 10B is completed.

In the display device according to Example 1, the auxiliary electrode layer is formed over a range from an upper area of the first insulating layer to an internal area of the third opening. That is, the auxiliary electrode layer is formed to extend to an exposed portion of the contact portion in the bottom of the third opening. In addition, the second electrode is formed over a range from an upper area of the organic layer to an upper area of the second insulating layer and furthermore to an internal area of the fourth opening. That is, the second electrode is formed to extend to an exposed portion of the contact portion in the bottom of the fourth opening. Therefore, the second electrode and the auxiliary electrode layer can be reliably electrically connected to each other through the contact portion. In addition, even if a surface of the auxiliary electrode layer is oxidized, a phenomenon in which the electrical resistance between the auxiliary electrode layer and the second layer increases does not occur. As a result, low power consumption can be reliably realized and display quality can be improved. Furthermore, by using this superior display device, a high-performance electronic apparatus can be realized.

In addition, in the method of manufacturing the display device according to Example 1, in the etching step in which the first electrode and the auxiliary wiring layer are formed, since the contact portion is coated with the first insulating layer, the contact portion can be prevented from being etched. Furthermore, the contact portion and the source/drain electrodes can be etched using the same etchant, and the first electrode and the auxiliary wiring layer can be etched using the same etchant. Therefore, the manufacturing process can be simplified and the manufacturing cost can be reduced. In addition, the contact portion has a structure in which two or more layers are laminated and the top surface of the contact portion is formed of a material having high oxidation resistance. Therefore, deterioration in the performance of the contact portion can be suppressed to the minimum in the process of manufacturing a display device.

In addition, a structure, in which at least a first layer which forms the gate electrode and a second layer which forms the gate insulating layer are laminated, may be formed below the contact portion 71. More specifically, a structure in which the first layer, the second layer, and the contact portion 71 are laminated in this order from the substrate side may be the same structure as that of a bottom gate/top contact type TFT (in which the gate electrode 31, the gate insulating layer 32, the semiconductor layer 33, the stopper insulating film 35, and the source/drain electrodes 34 are laminated; or in which the gate electrode 31, the gate insulating layer 32, the semiconductor layer 33, and the source/drain electrodes 34 are laminated). As a result, the contact portion 71 can be simultaneously formed in the process of manufacturing the TFT.

Example 2

Example 2 is a modification example of the method of manufacturing the display device according to Example 1. Hereinafter, a method of manufacturing a display device according to Example 2 will be described with reference to FIGS. 11A, 11B, 12A, 12B, 13A, 13B, 14A, and 14B which are cross-sectional views schematically illustrating a part of a substrate and the like. Example 1 is different from Example 2, regarding the positional relationship between the third opening 53 and the concave portion 55 with respect to the thin film transistor.

Step-200

Figure 11A:
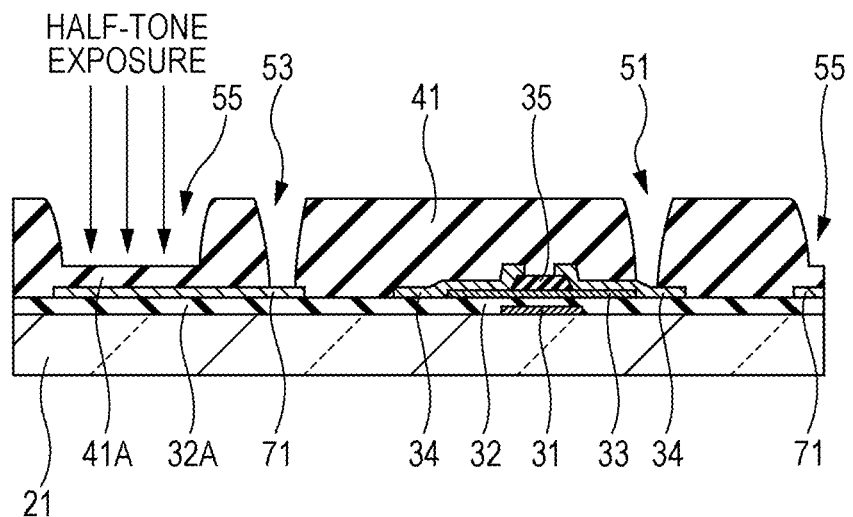

First, a structure illustrated in FIG. 11A can be obtained by performing the same steps as Step-100 to Step-120 of Example 1.

Step-210

Figure 11B:
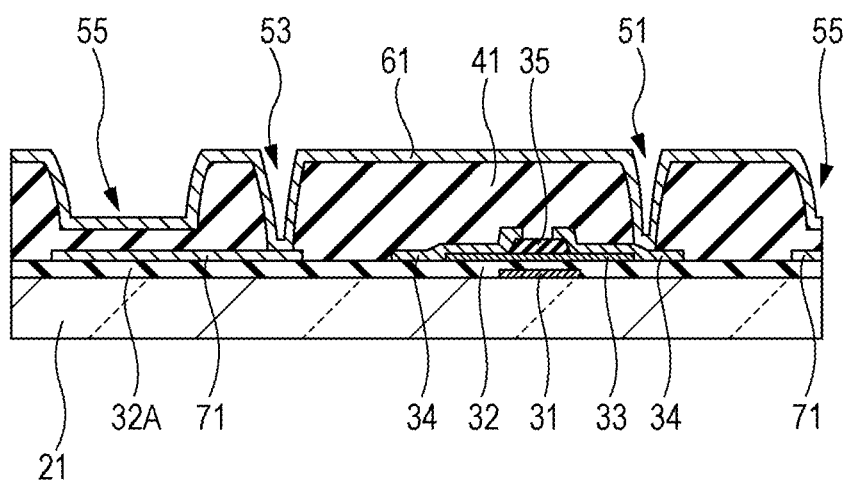
Figure 12A:
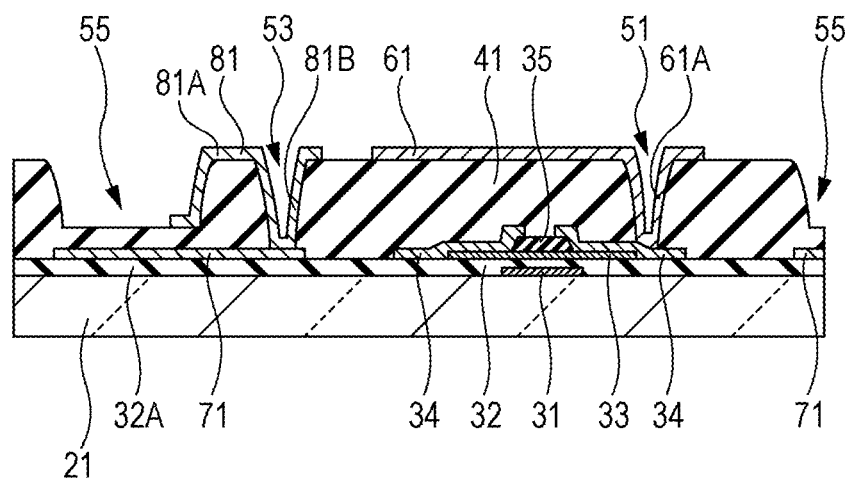

Next, structures illustrated in FIGS. 11B and 12A can be obtained by performing the same step as Step-130 of Example 1.

Step-220

Figure 12B:
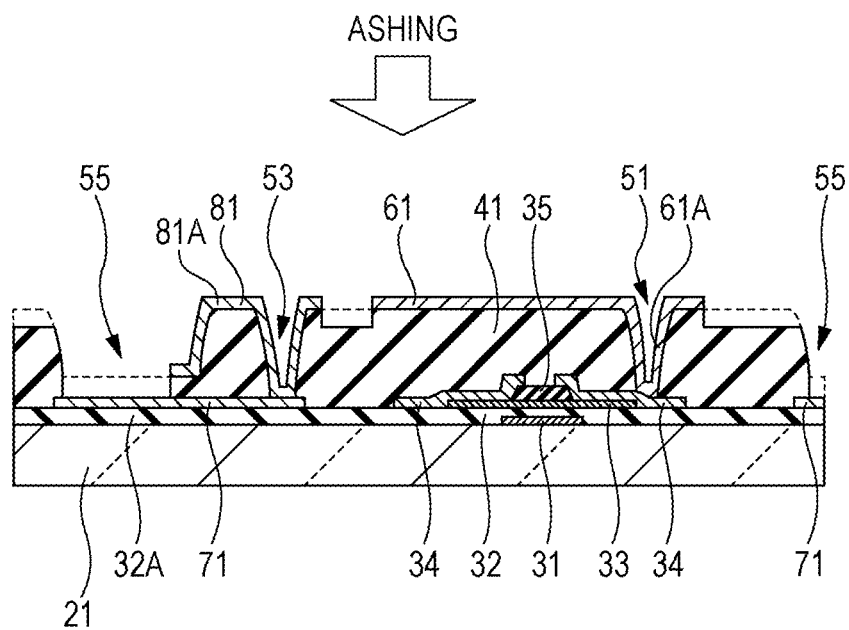
Figure 13A:
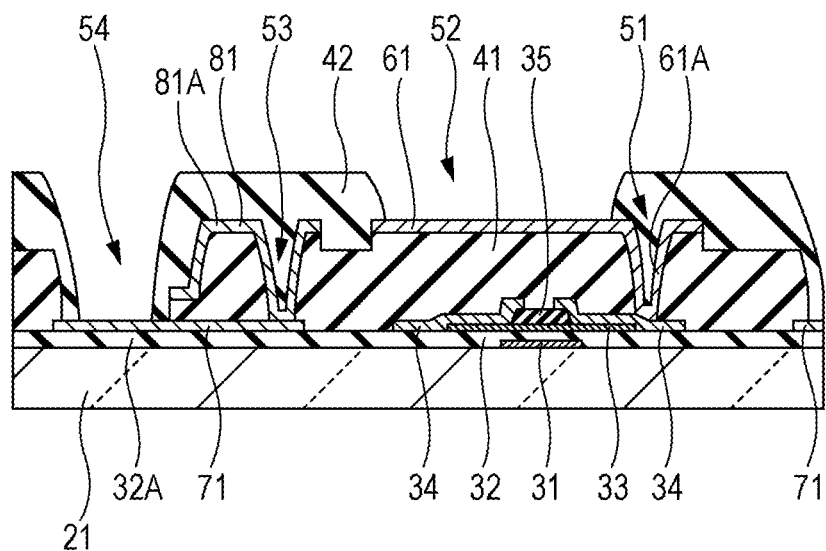
Figure 13B:
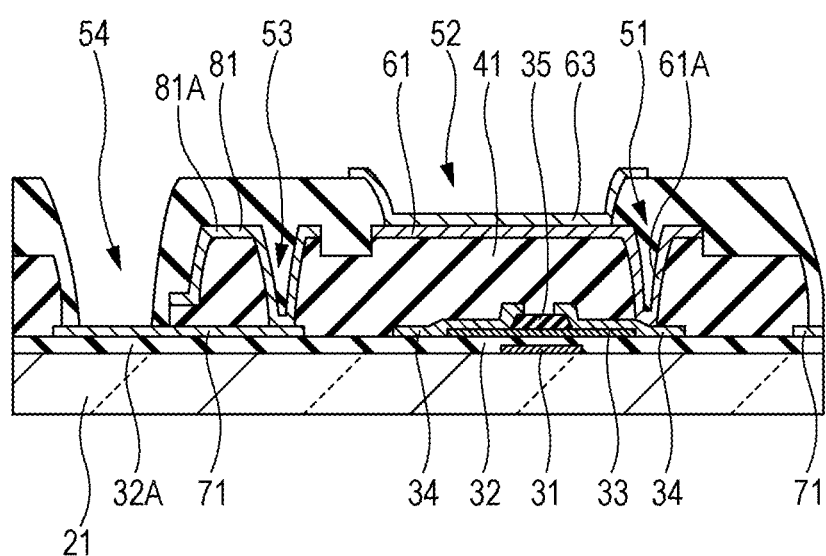
Figure 14A:
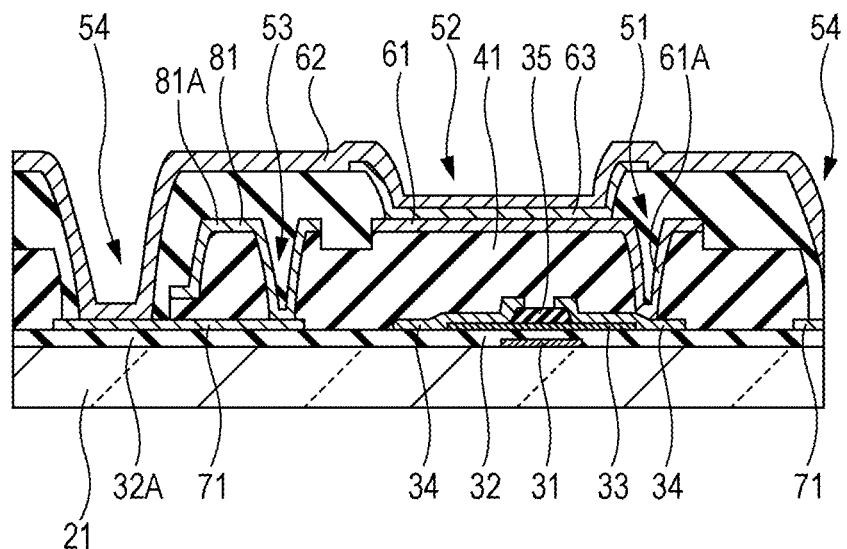
Figure 14B:
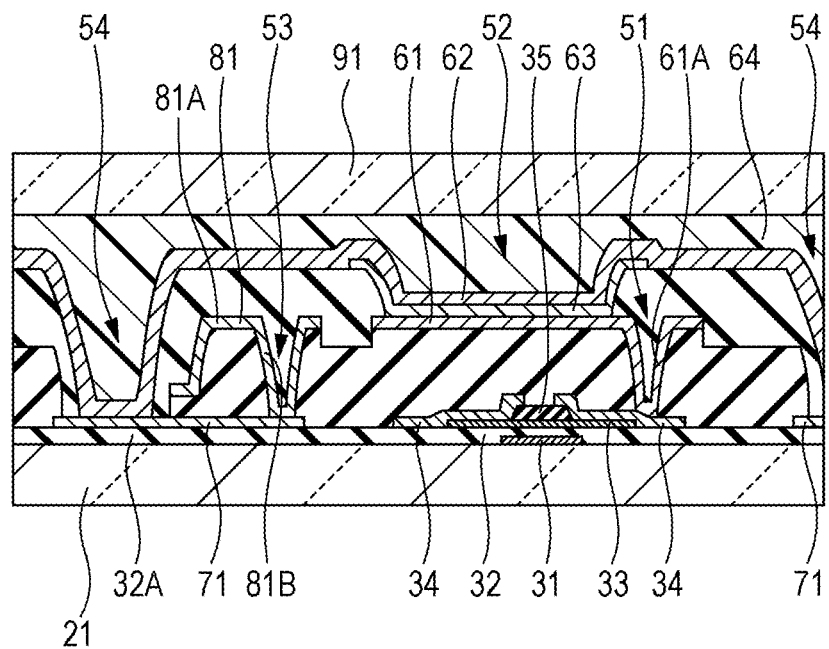

Next, a structure illustrated in FIG. 12B can be obtained by performing the same step as Step-140 of Example 1. Furthermore, structures illustrated in FIGS. 13A, 13B, 14A, and 14B can be obtained by performing the same steps as Step-150 to Step-180 of Example 1.

Example 3

Example 3 is also a modification example of the method of manufacturing the display device according to Example 1. Hereinafter, a method of manufacturing a display device according to Example 3 will be described with reference to FIGS. 15A, 15B, 16A, 16B, 17A, and 17B which are cross-sectional views schematically illustrating a part of a substrate and the like. The method of manufacturing a display device according to Example 3 is different from the method of manufacturing the display device according to Example 1, regarding steps of removing the portion 41A of the first insulating layer 41 and forming the fourth opening 54 on the second insulating layer 42.

Step-300

Figure 15A:
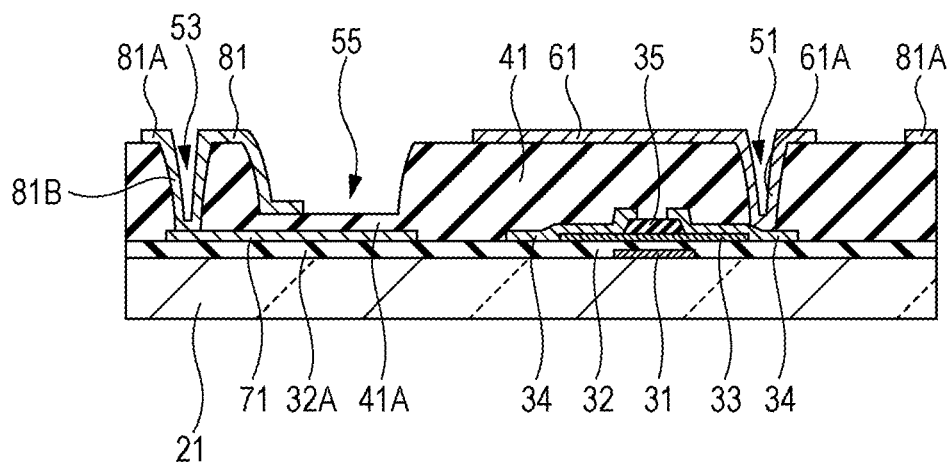
Figure 15B:
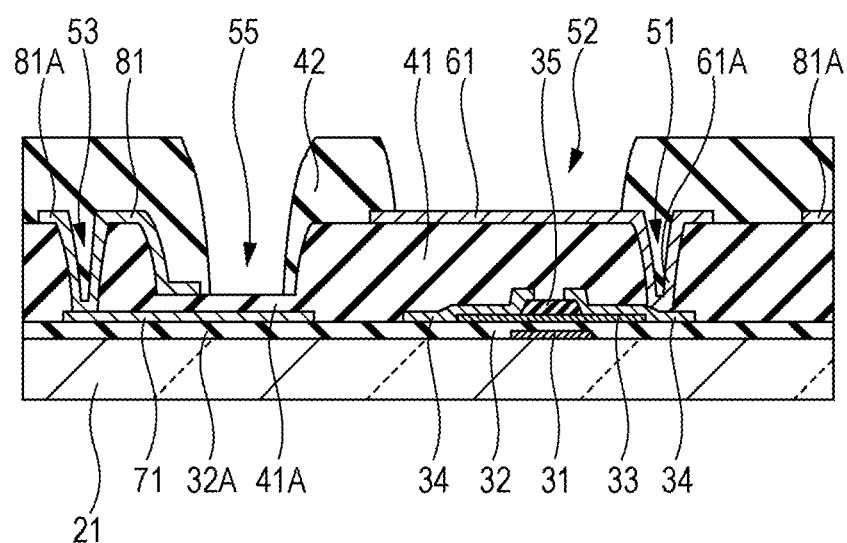

First, a structure illustrated in FIG. 15A can be obtained by performing the same steps as Step-100 to Step-130 of Example 1.

Step-310

Next, the second insulating layer 42 is formed on the entire surface. Then, the second opening 52 is formed on the second insulating layer 42 and a portion of the second insulating layer 42, which is located above the concave portion 55, is removed (refer to FIG. 15B). Specifically, the same step as Step-150 of Example 1 is performed. However, in this step, the portion 41A of the first insulating layer 41, which is located in the bottom of the concave portion 55, remains in the bottom of the formed fourth opening 54.

Step-320

Next, the portion 41A of the first insulating layer 41, which is located on a part of the bottom of the concave portion 55, is removed, and the fourth opening 54, which reaches an exposed portion of the contact portion 71 in the bottom of the concave portion 55, is formed on the second insulating layer 42 and the first insulating layer 41. At the same time, the second opening 52, through which the first electrode 61 is exposed in the bottom, is formed on the second insulating layer 42 (refer to FIG. 16A). Specifically, the entire surface of the first insulating layer 41 is asked. As a result, the portion 41A of the first insulating layer 41, which is exposed in the bottom of the fourth opening 54, is removed. In addition, an exposed portion of the second insulating layer 42 at a given thickness from the surface is removed.

Step-330

Figure 16A:
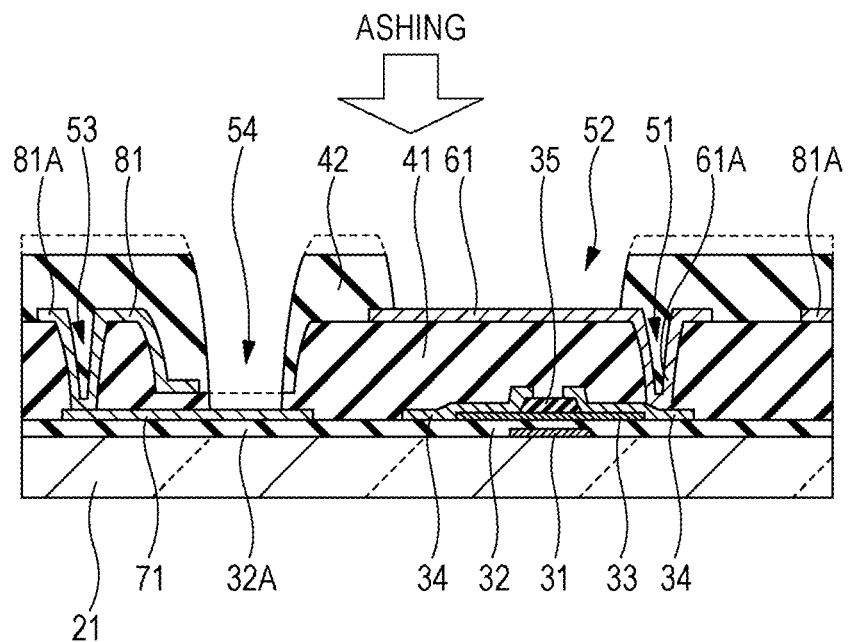
Figure 16B:
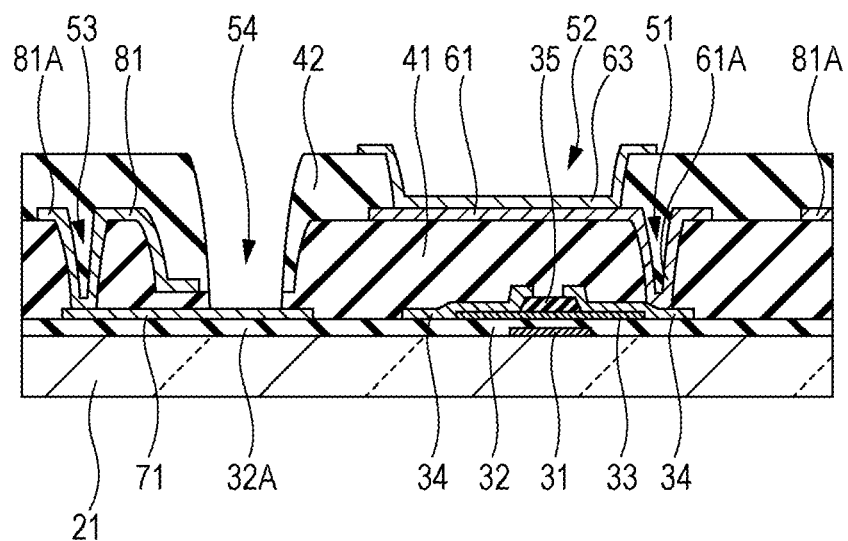
Figure 17A:
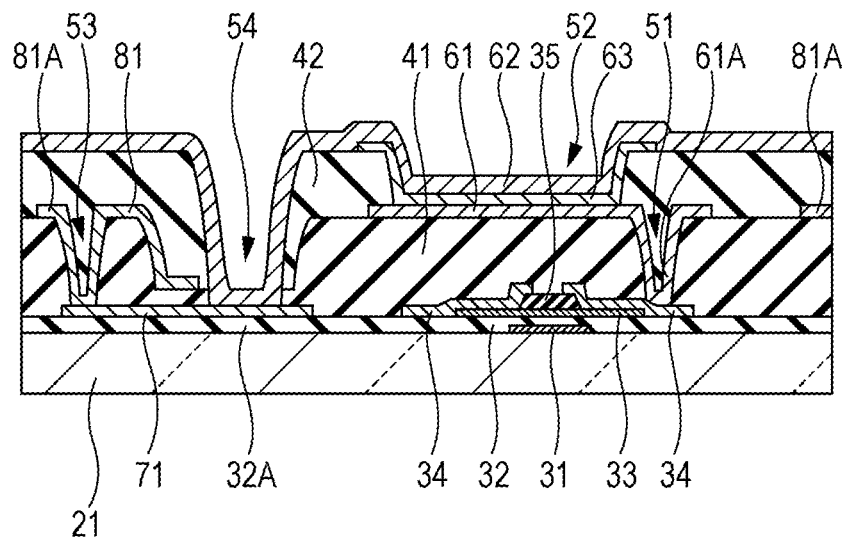
Figure 17B:
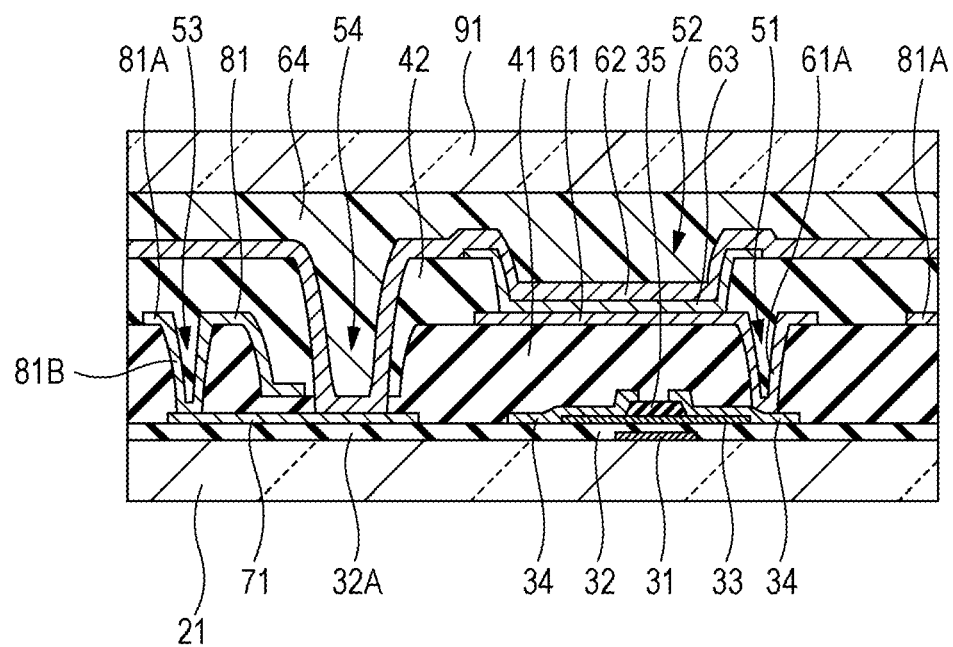

Next, structures illustrated in FIGS. 16B, 17A, and 17B can be obtained by performing the same steps as Step-160 to Steps-180 of Example 1.

Example 4

Example 4 is a modification example of the method of manufacturing a display device according to Example 3. Hereinafter, a method of manufacturing a display device according to Example 4 will be described with reference to FIGS. 18A, 18B, 19A, 19B, 20A, and 20B which are cross-sectional views schematically illustrating a part of a substrate and the like. Similarly to the case of Example 2, Example 3 is different from Example 4, regarding the positional relationship between the third opening 53 and the concave portion 55 with respect to the thin film transistor.

Step-400

Figure 18A:
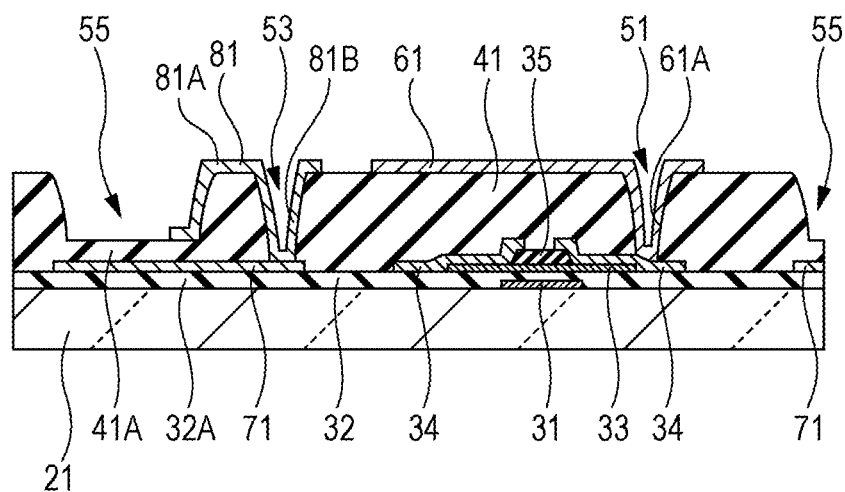
Figure 18B:
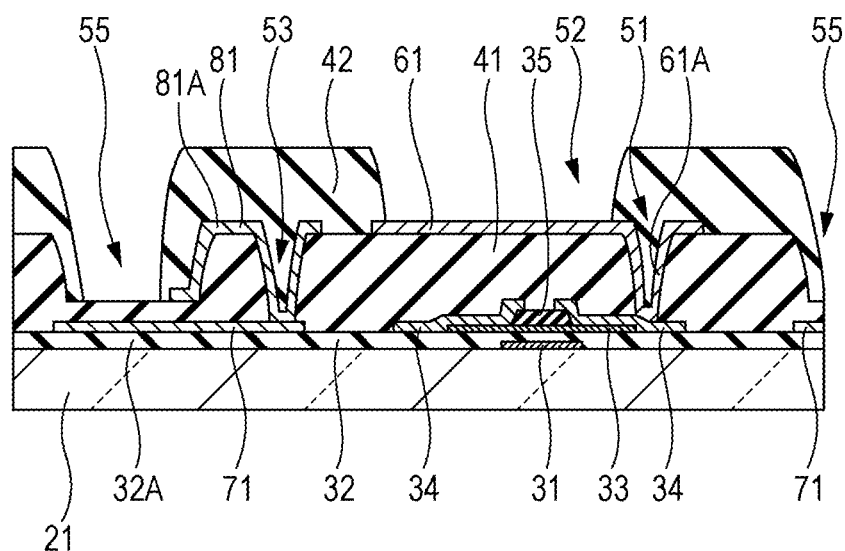
Figure 19A:
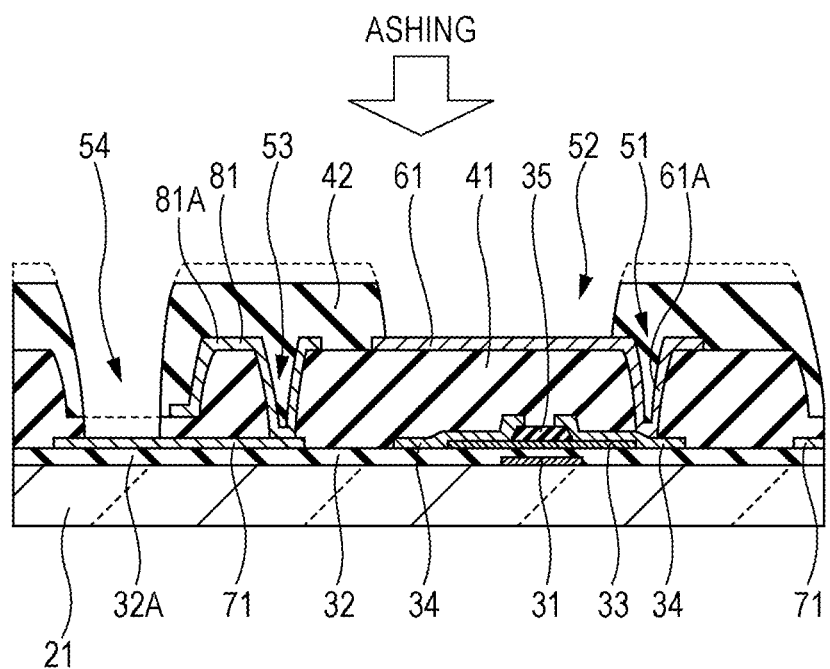
Figure 19B:
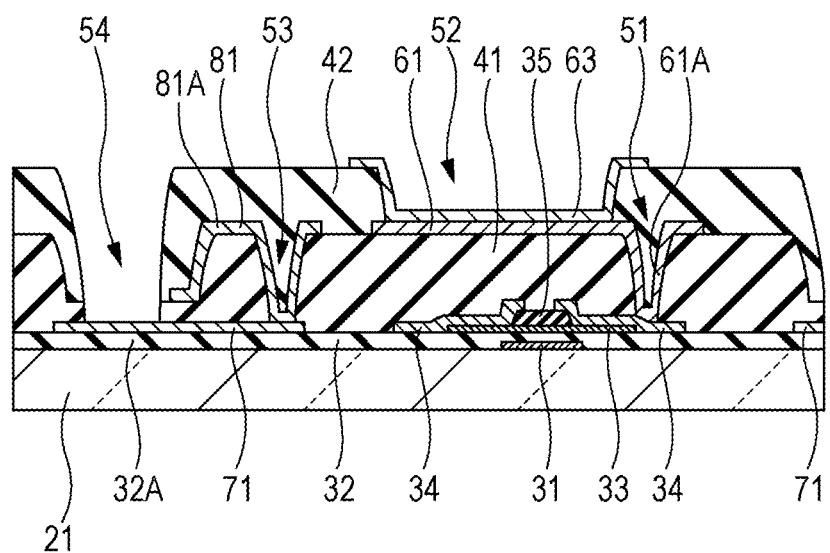
Figure 20A:
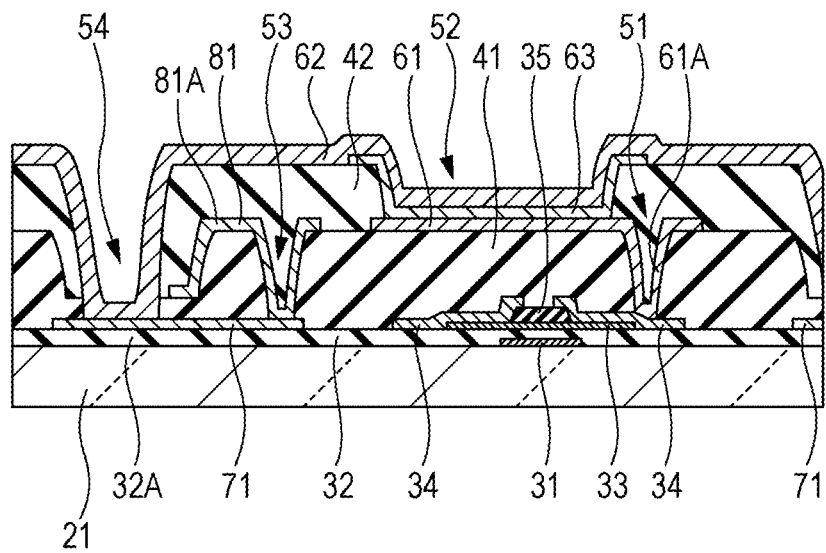
Figure 20B:
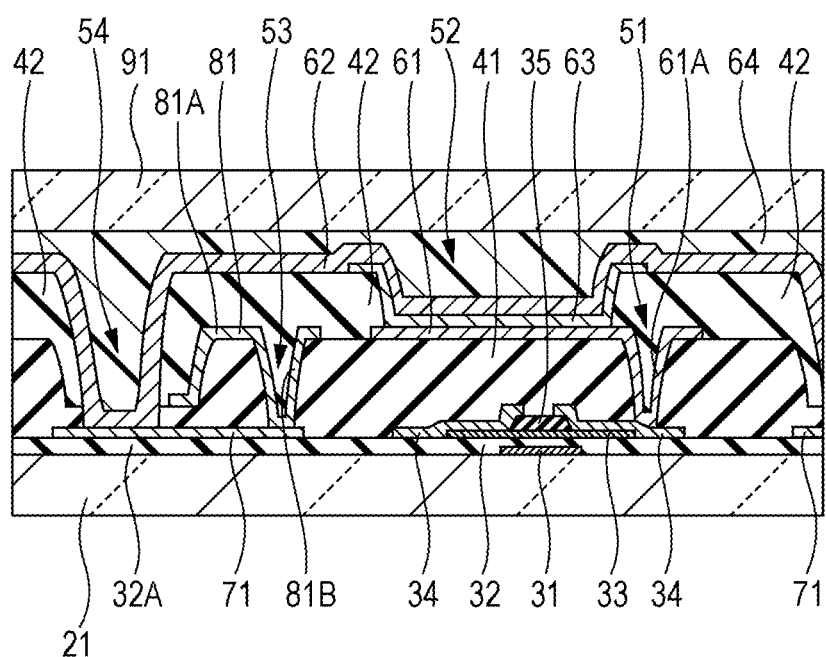

First, a structure illustrated in FIG. 18A can be obtained by performing the same step as Step-300 of Example 3.

Step-410

Next, structures illustrated in FIGS. 18B, 19A, 19B, 20A, and 20B can be obtained by performing the same steps as Step-310 to Step-330 of Example 3.

Example 5

In Example 5, a portion of the auxiliary wiring layer, which is located at an edge of a display region of the display device and is described above in Examples 1 to 4, and the like will be described.

Figure 21A:
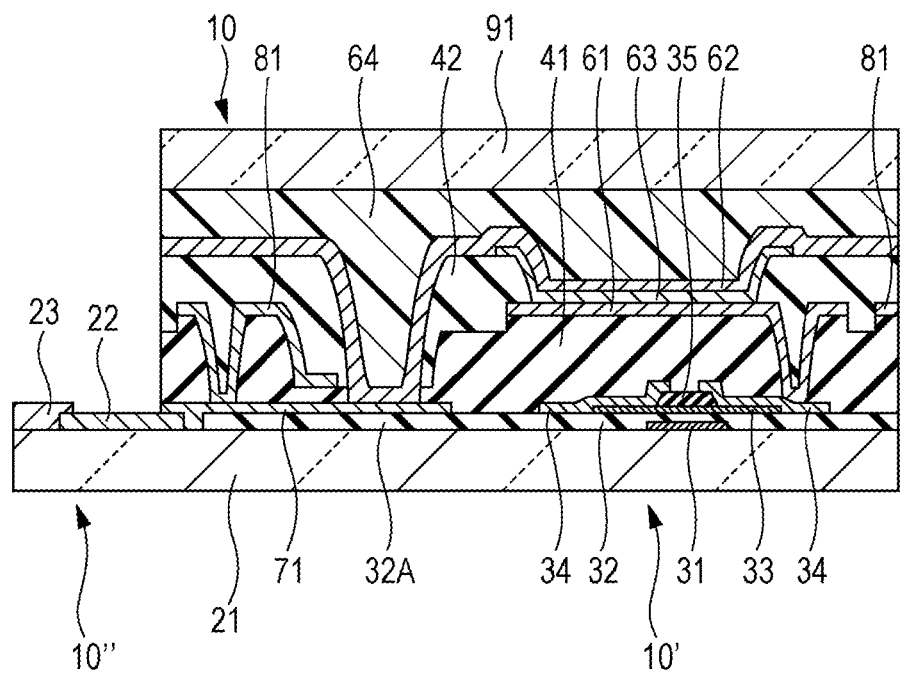
FIGS. 21A and 21B are cross-sectional views schematically illustrating a part of a display device according to Example 5.
Figure 21B:
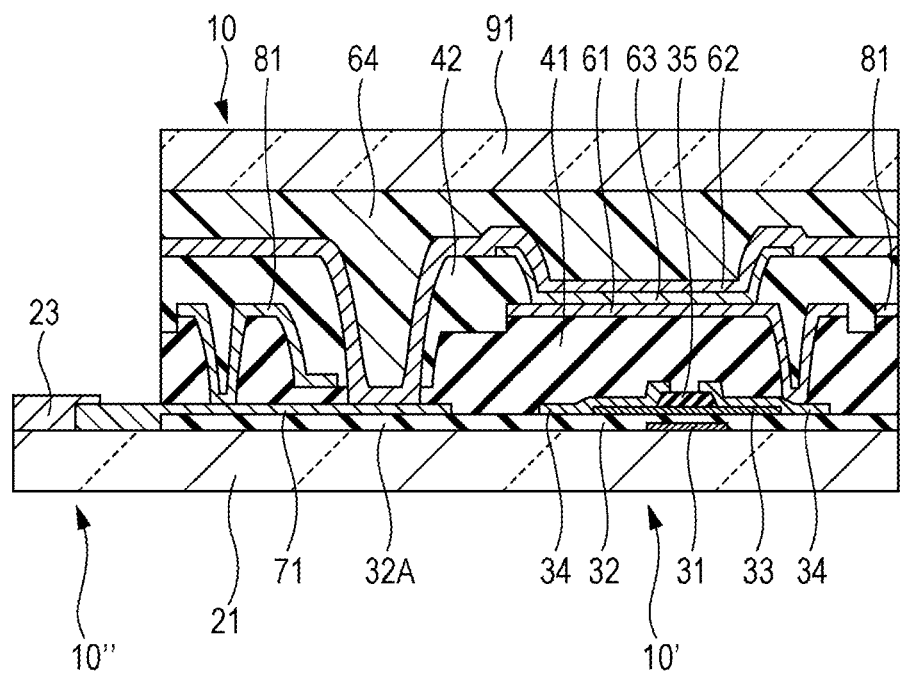

As illustrated in FIG. 21A, a portion of the auxiliary wiring layer 81, which is located at an edge of the display region 10' of the display device 10 is connected to a power supply 23, which is provided in the peripheral portion 10" of the display device 10, through the contact portion 71 formed on the substrate (first substrate) 21 and a wiring layer 22 extending from the contact portion 71. As a result, a voltage is applied from the power supply 23 to the second electrode 62 through the wiring layer 22 and furthermore through the auxiliary wiring layer 81 and the contact portion 71. In some cases, as illustrated in FIG. 21B, the contact portion 71 may extend to the peripheral portion 10" of the display device 10 to use an extending portion of the contact portion 71 instead of the wiring layer 22.

Example 6

Figure 22:
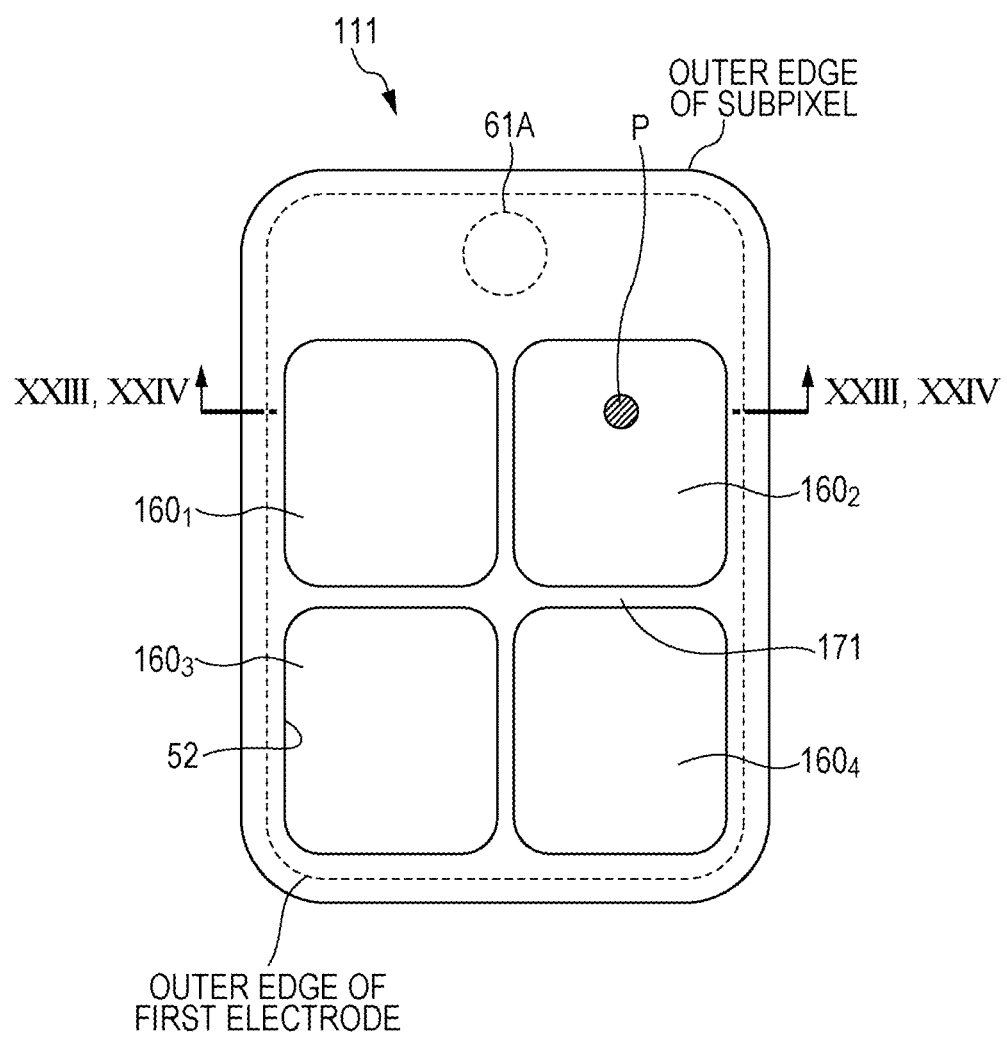
FIG. 22 is a plan view schematically illustrating one subpixel of a display device according to Example 6.
Figure 23:
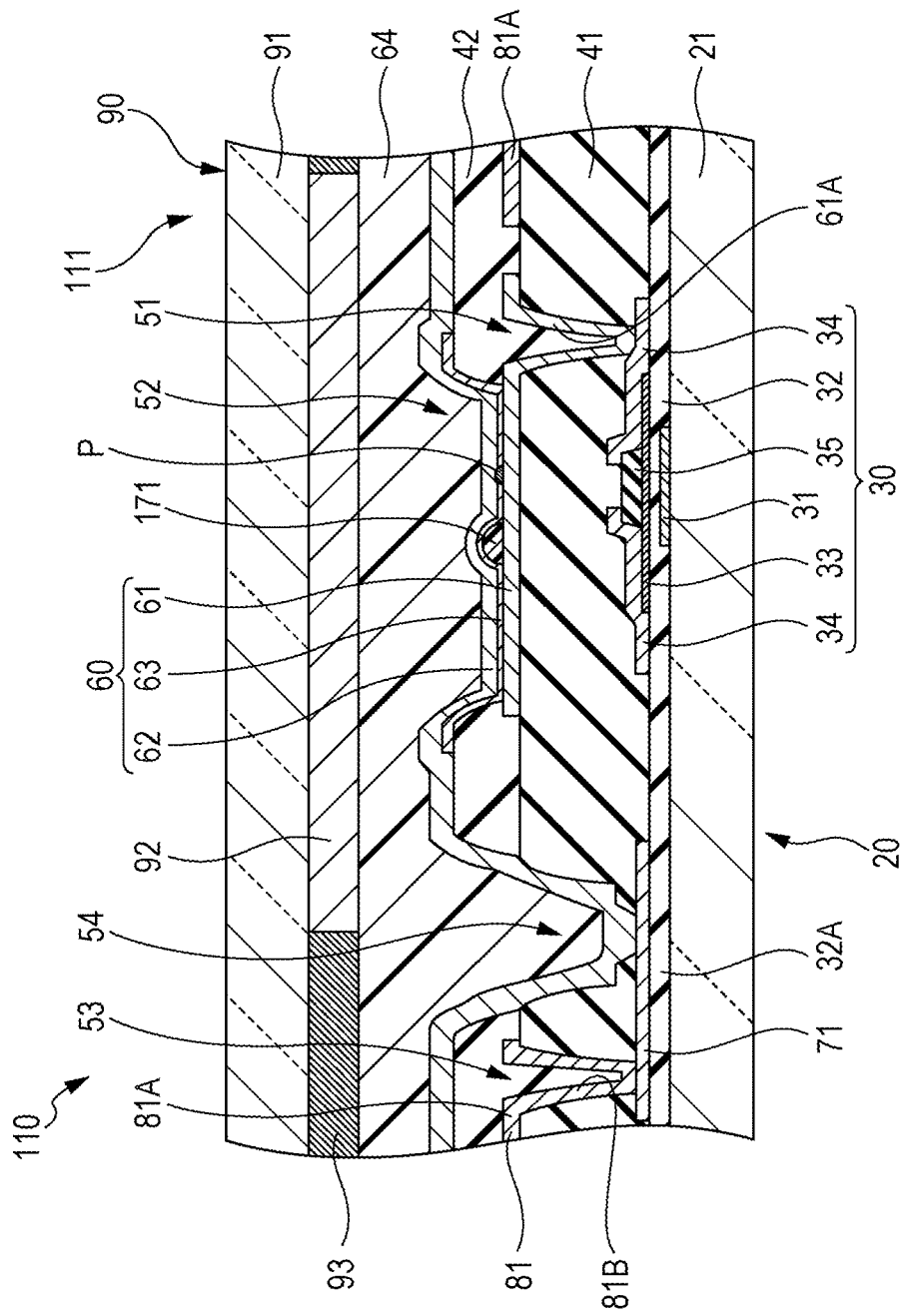
FIG. 23 is a cross-sectional view schematically illustrating a part of the display device according to Example 6.
Figure 24:
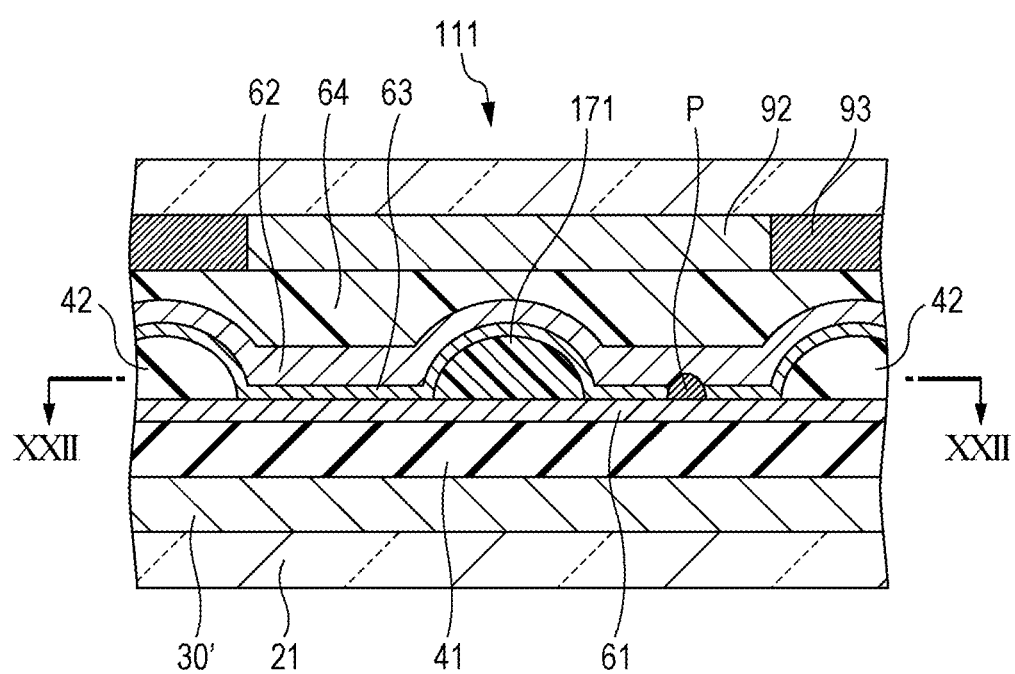
FIG. 24 is a cross-sectional view taken along line XXIV-XXIV of FIG. 22 schematically illustrating a part of one subpixel of the display device according to Example 6.

Example 6 relates to the display device according to the second embodiment of the present disclosure and the method of repairing a display device according to the first embodiment of the present disclosure. FIG. 22 is a plan view schematically illustrating one pixel of a display device (in the case of a color display device, one subpixel); FIG. 23 is a cross-sectional view schematically illustrating a part of the display device according to Example 6; and FIG. 24 is a cross-sectional view taken along line XXIV-XXIV of FIG. 22 schematically illustrating a part of one subpixel of the display device. FIG. 22 is a plan view of an imaginary plane taken along line XXII-XXII of FIG. 24. FIGS. 22 and 24 illustrate a display device 110 into which a foreign material P is incorporated.

Similarly to the case of the display device 10 according to Example 1, the display device 110 according to Example 6 or Example 7 described below includes light emitting elements 111 that are arranged in a two-dimensional matrix,
  in which the light emitting elements include:
    (a) a drive circuit 30 which is provided on a substrate (first substrate) 21;
    (b) a first insulating layer 41 which covers the drive circuit 30 and the substrate (first substrate) 21;
    (c) a light emitting portion 160 which includes a first electrode 61, an organic layer 63 having a light emitting layer, and a second electrode 62; and
    (d) a second insulating layer 42 which covers the first electrode 61.

The first electrode 61 formed on the first insulating layer 41 is electrically connected to the drive circuit 30.

The above-described display device according to Example 6 or Example 7 described below has substantially the same configuration or structure as the display device according to Example 1, except that the contact portion 71 and the auxiliary electrode layer 81 are not provided except for the following points. Of course, similarly to the case of Examples 1 to 5, the contact portion 71 and the auxiliary electrode layer 81 may be provided in the display device according to Example 6 or Example 7 described below. In an example illustrated in FIG. 23, the contact portion 71 and the auxiliary electrode layer 81 are provided. In FIGS. 24, 26, 32, and 33, the drive circuit 30 is illustrated as a TFT layer 30'. In addition, the first electrode 61 formed on the first insulating layer 41 is electrically connected to the drive circuit 30 (specifically, one source/drain electrode 34) through a first electrode extending portion 61A which extends into the first opening 51 provided in the first insulating layer 41. In FIGS. 22, 25, 29, 30, and 31, an outer edge of the first electrode is indicated by a dotted line and an outer edge of a subpixel is indicated by a solid line. In addition, in an example of the drawing, a color filter 92 and a light shielding film (black matrix) 93 are formed between the second substrate 91 and the sealing layer 64. White light exits through the light emitting layer.

In the display device 110 according to Example 6, the light emitting elements 111 further includes a window layer 171 which is provided on the first electrode 61. The light emitting portion 160 is divided into plural (in Example 6, four) window portions $160_1$, $160_2$, $160_3$, and $160_4$ by the window layer 171. As illustrated in FIG. 22, the planar shape of the window layer 171 is a well curb shape. The planar shape of the window portions $160_1$, $160_2$, $160_3$, and $160_4$ is a rectangular shape with four round corners. The window layer 171 is formed of the same material as that of the second insulating layer 42, is formed at the same time as the formation of the second insulating layer 42, and extends from the second insulating layer 42.

In addition, the organic layer 63 is formed at least on the first electrode 61 (specifically, in Example 6, the organic layer 63 is formed over a range from a portion of the first electrode 61, which is exposed in the bottom of the second opening 52 formed on the second insulating layer 42, to a part of an upper area of the second insulating layer 42). The second electrode 62 is formed on the organic layer 63. The display device according to Example 6 or Example 7 described below can be manufactured with substantially the same method as the method of manufacturing a display device according to Example 1 or 5.

When there is a foreign material in a window portion of the light emitting portion 160 (in an example of the drawing, when there is a foreign material P in the window portion $160_2$), a portion of the first electrode 61 corresponding to the window portion $160_2$ is separated from the other portions of the first electrode 61.

A method of repairing a display device according to Example 6 for the above-described display device 110 will be described. The method of repairing a display device is applied after completing the display device. In an example of FIG. 24, it is assumed that, as a result of inspecting the display device, a conductive foreign material P is found in the window portion $160_2$; and the first electrode 61 and the second electrode 62 are short-circuited or has a high possibility of being short-circuited. When short-circuiting occurs, a subpixel in which short-circuit occurs does not emit light.

Figure 25:
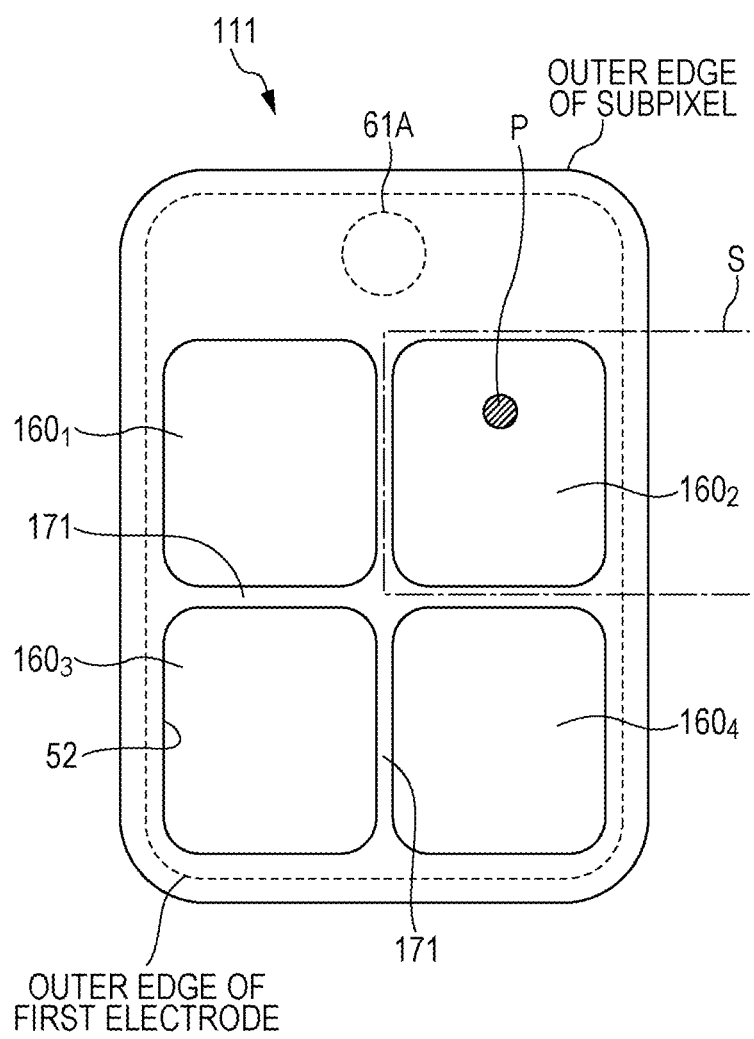
FIG. 25 is a plan view for describing a method of repairing a display device according to Example 6, schematically illustrating one subpixel of the display device according to Example 6.

When there is a foreign material in the window portion $160_2$ of the light emitting portion 160, a portion of the first electrode 61 surrounding the window portion $160_2$ is irradiated with laser light to separate the portion of the first electrode 61 corresponding to the window portion $160_2$ from the other portions of the first electrode 61. Specifically, as illustrated in FIG. 25, the portion is irradiated with laser light along chain line S using a repair device (not illustrated). The trace of laser light ranges from the second insulting layer 42 to the second insulating layer 42 through the window layer 171. That is, a portion of the first electrode 61 surrounding the window portion $160_2$, into which the foreign material P is incorporated, among the four window portions $160_1$, $160_2$, $160_3$, and $160_4$ (more specifically, a portion of the first electrode 61 which is located below a portion of the window layer 171 surrounding the window portion $160_2$ and a portion of the first electrode 61 which is located below the second insulating layer 42 connected to the portion of the window layer 171) is irradiated with laser light using a repair device. As a result, the portion of the first electrode 61 irradiated with laser light is melted and cut. Then, the portion of the first electrode 61 corresponding to the window portion $160_2$ is separated from the other portions of the first electrode 61.

Figure 26:
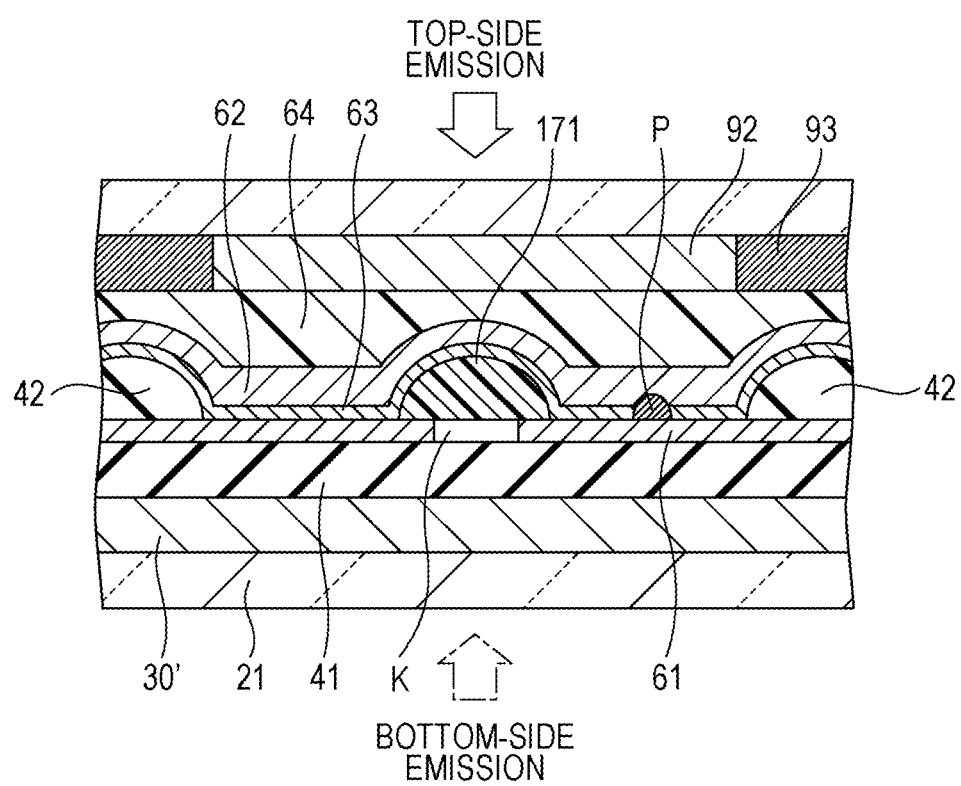
FIG. 26 is a cross-sectional view for describing the method of repairing a display device according to Example 6, schematically illustrating a part of the subpixel of the display device according to Example 6.

In the case of the top-side irradiation, the first electrode 61 is irradiated with laser light through the second substrate 91, the color filter 92, the sealing layer 64, the organic layer 63, and the window layer 171 or the second insulating layer 42. The second substrate 91, the color filter 92, the sealing layer 64, the organic layer 63, the window layer 171 may be formed of a material which is difficult to absorb laser light in a specific wavelength range. On the other hand, the first electrode 61 is formed of a material which absorbs laser light in a specific wavelength range. As a result, the first electrode 61 is cut as illustrated in FIG. 26 and a cut trace (void) K is formed.

In the case of the bottom-side irradiation, the first electrode 61 is irradiated with laser light through the first substrate 21 and the first insulating layer 41. The first substrate 21 and the first insulating layer 41 may be formed of a material which is difficult to absorb laser light in a specific wavelength range. On the other hand, the first electrode 61 may be formed of a material which absorbs laser light in a specific wavelength range. As a result, the first electrode 61 is cut in the same manner as in the case of the top-side irradiation and a cut trace (void) K is formed.

A portion of the first electrode 61 corresponding to the window portion $160_2$, into which the foreign material P is incorporated, among the four window portions $160_1$, $160_2$, $160_3$, and $160_4$ is separated from the other portions of the first electrode 61 corresponding of the three window portions $160_1$, $160_3$, and $160_4$. On the other hand, a function of the first electrode 61 corresponding to these three window portions $160_1$, $160_3$, and $160_4$ normally functions. As a result, a light emitting function of the organic layer 63 corresponding to the three window portions $160_1$, $160_3$, and $160_4$ remains.

In this way, in the method of repairing a display device according to Example 6, the first electrode 61 can be separated without being separating the second electrode unlike the related art, and a new repair method can be provided. With this repair method, the manufacturing yield of a display device can be improved. In particular, since a repair process can be performed after completing a display device, the manufacturing efficiency of a display device is superior to that of a case where a repair process is performed with the irradiation of laser light before bonding with the second panel and after completing the first panel. The same shall be applied to Example 7 described below.

Specifically, the step of forming the drive circuit 30 to the step of bonding the first substrate and the second substrate are performed in a vacuum in many cases. When a display device is manufactured, it is preferable that the number of times of movement between a vacuum and the atmosphere be suppressed to the minimum. When the number of times of movement is increased, the manufacturing efficiency deteriorates and thus more energy and cost for forming a vacuum are paid. When a repair process is performed in the process of manufacturing a display device, that is, after completing the first panel, the number of times of movement between a vacuum and the atmosphere is increased by once as compared to a case where a repair process is performed after bonding the first panel and the second panel. However, in some cases, a repair process may be performed after completing the first panel. The same shall be applied to Example 7 described below.

In addition, a portion of the first electrode 61 which is located below a portion of the window layer 171 is irradiated with laser light and, in some cases, a portion of the first electrode 61 which is located below the second insulating layer 42 connected to the portion of the window layer 171 is further irradiated with laser light. Therefore, the scattering of a melted material of the first electrode 61 can be reliably prevented.

Figure 27A:
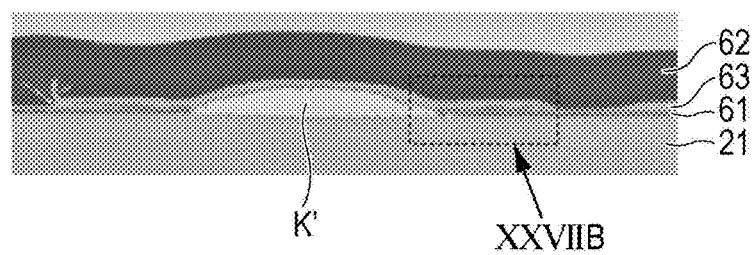
FIG. 27A is a micrograph illustrating a state where a melted material of a first electrode is scattered in a display device according to Comparative Example and FIG. 27B is an enlarged micrograph illustrating a portion surrounded by a broken line in FIG. 27A.
Figure 27B:
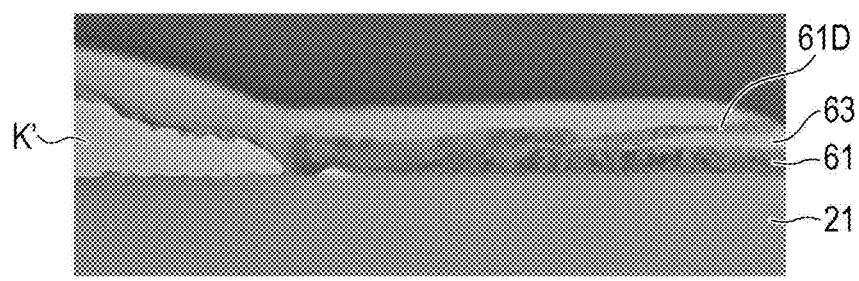
Figure 28A:
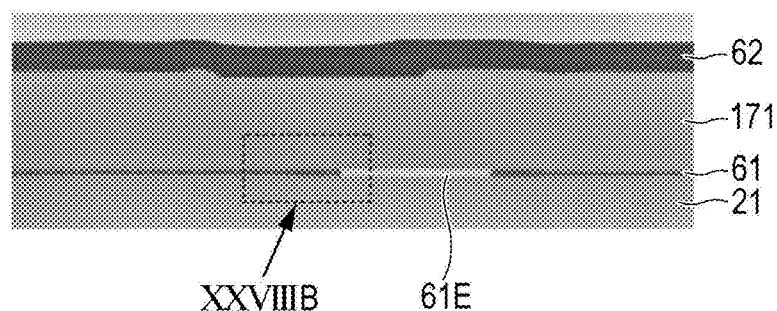
FIG. 28A is a micrograph illustrating a state where a first electrode is irradiated with laser light and is cut in a display device according to Example 6 and FIG. 28B is an enlarged micrograph illustrating a portion surrounded by a broken line in FIG. 28A.
Figure 28B:
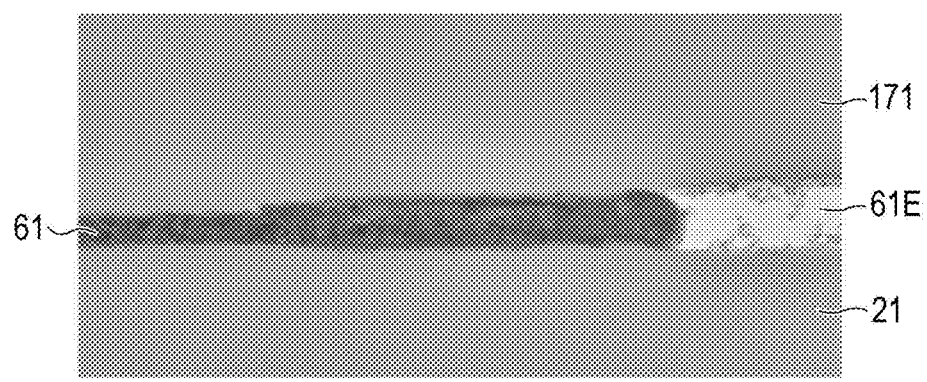
Figure 29A:
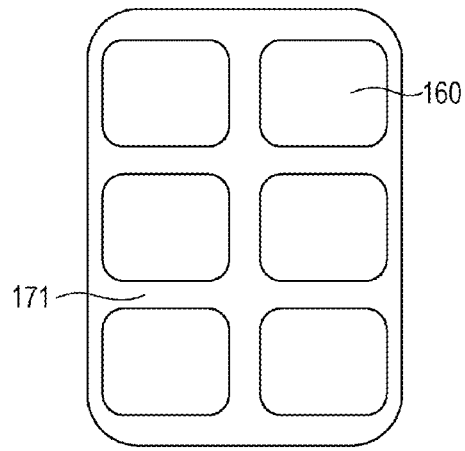
FIGS. 29A to 29D are plan views schematically illustrating modification examples of a shape of window portions.
Figure 29B:
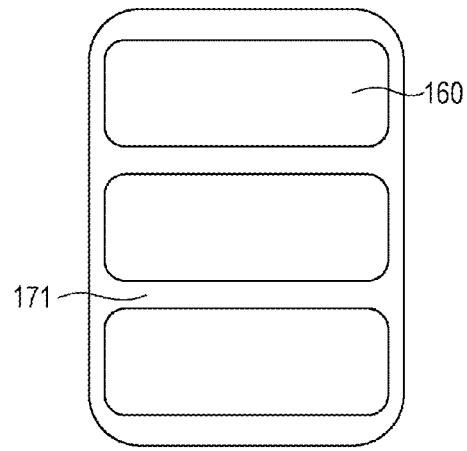
Figure 29C:
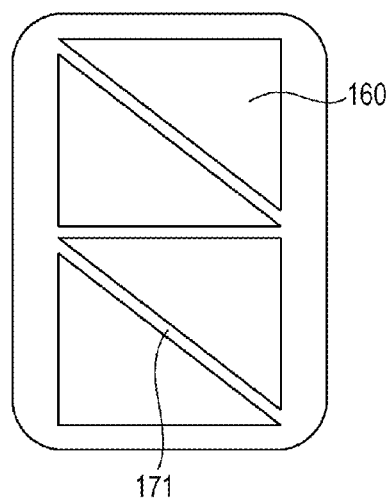
Figure 29D:
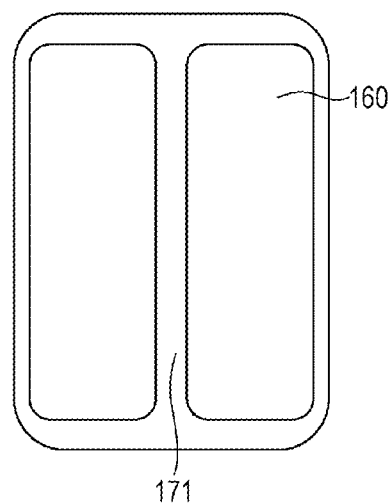

FIGS. 27A and 27B are micrographs illustrating a part of a display device for evaluation according to the Comparative Example; and FIGS. 28A and 28B are micrographs illustrating a part of a display device for evaluation according to Example 6. FIGS. 27A and 28A are micrographs illustrating a state where a melted material of a first electrode is scattered. In addition, FIGS. 27B and 28B are enlarged micrograph illustrating portions surrounded by broken lines in FIGS. 27A and 28A. The display devices for evaluation illustrated in FIGS. 27A and 28A includes the first substrate 21 which is formed of a glass substrate, the first electrode 61 which is formed of an Al—Nd alloy, the organic layer 63, and the second electrode 62. In the display devices for evaluation, the second electrode 62 is formed of platinum (Pt). In addition, the formation of the TFT layer 30' and the first insulating layer 41 are omitted. In the display device for evaluation according to Comparative Example, the window layer 171 is not formed.

In the display device for evaluation according to Comparative Example, as clearly seen from FIG. 27A, when the first electrode 61 is irradiated with laser light and is cut, a void K' is generated because the window layer 171 is not formed. In the vicinity of the void K', the first electrode 61 is scattered to the organic layer 63 and a scattered portion 61D reaches the second electrode 62 which is an upper layer of the organic layer 63. In this state, short-circuiting occurs or the possibility of short-circuiting is high.

On the other hand, in the display device for evaluation according to Example 6, as clearly seen from FIG. 28A, the first electrode 61 is clearly cut without being scattered because the window layer 171 is provided. A cut trace 61E is observed in the first electrode 61. That is, a short-circuited portion between the first electrode 61 and the second electrode 62 can be reliably removed. Since the organic layer 63 is formed below the second electrode 62, the organic layer 63 is not clearly shown in FIG. 28A.

FIGS. 29A, 29B, 29C, and 29D illustrate modification examples of the window portions 160. In an example illustrated in FIG. 29A, six window portions 160 (three in the vertical direction×two in the horizontal direction) are provided. In addition, in an example illustrated in FIG. 29B, three horizontally long window portions 160 are provided in the vertical direction. Furthermore, in an example illustrated in FIG. 29C, four triangular window portions 160 are provided in the horizontal direction. The triangles are oriented so as to be arranged as densely as possible. In an example illustrated in FIG. 29D, two vertically long window portions 160 are provided in the horizontal direction. First electrode small pieces which are described below in Example 7 may have the same shape as that of the above-described window portions.

Figure 30A:
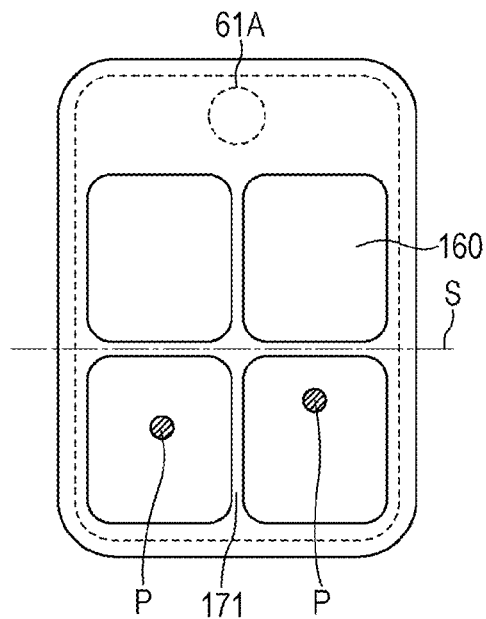
FIGS. 30A to 30C are planar views for describing a state where a first electrode is cut when plural foreign materials are incorporated thereinto, schematically illustrating one subpixel.
Figure 30B:
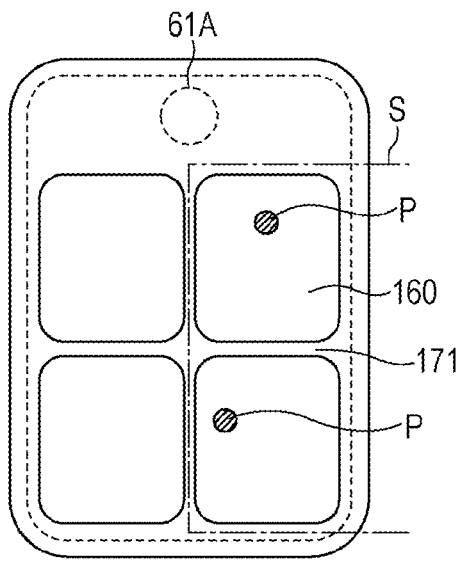
Figure 30C:
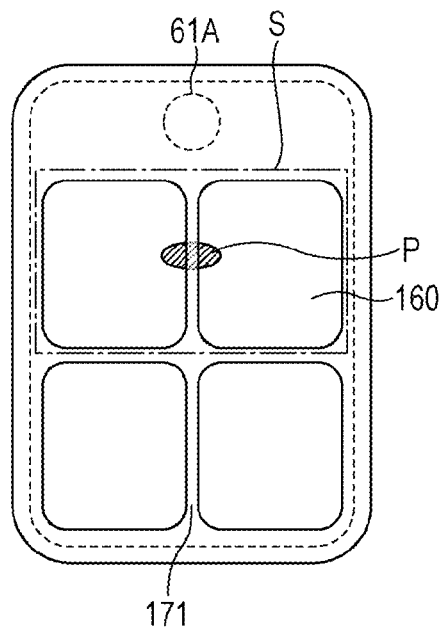

In addition, when foreign materials P are incorporated into window portions illustrated in FIGS. 30A, 30B, and 30C, the first electrode 61 may be cut as indicated by chain line S.

Example 7

Figure 31:
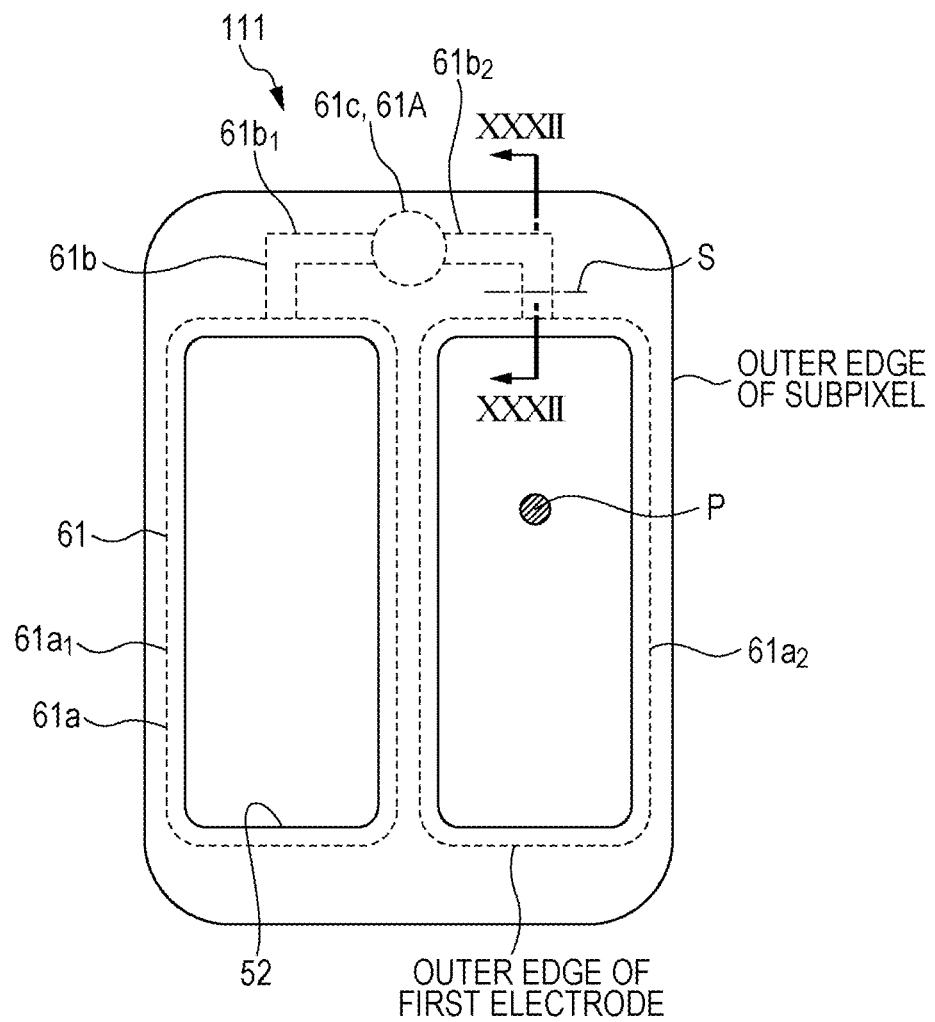
FIG. 31 is a plan view schematically illustrating one subpixel of a display device according to Example 7.
Figure 32:
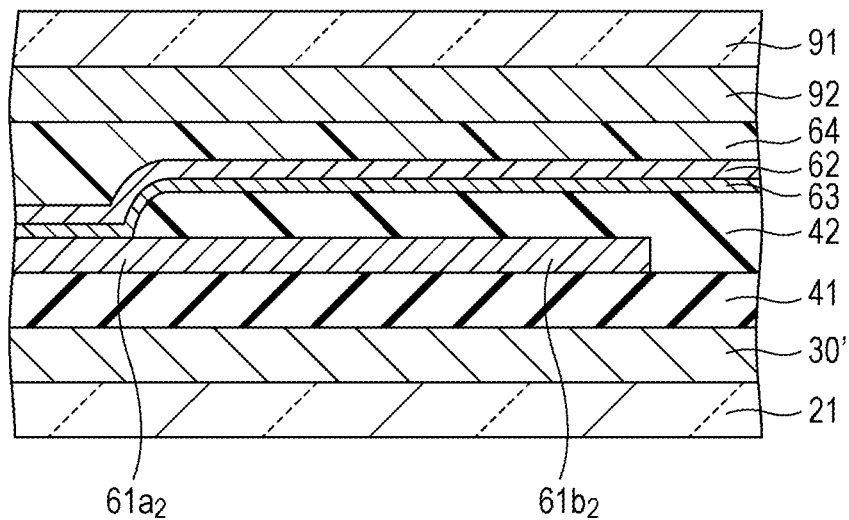
FIG. 32 is a cross-sectional view taken along line XXXII-XXXII of FIG. 31 illustrating a part of one subpixel of the display device according to Example 7.

Example 7 relates to the display device according to the third embodiment of the present disclosure and the method of repairing a display device according to the second embodiment of the present disclosure. FIG. 31 is a plan view schematically illustrating one pixel of a display device (in the case of a color display device, one subpixel); and FIG. 32 is a cross-sectional view taken along line XXXII-XXXII of FIG. 31 illustrating a part of one subpixel of the display device. FIGS. 31 and 32 illustrate the display device 110 into which a foreign material P is incorporated.

In the display device 110 according to Example 7, the first electrode 61 includes:

Q numbers (in an example of Example 7, Q=2) of first electrode small pieces (first electrode fragments) 61*a* (61*a*$_1$ and 61*a*$_2$) which are provided distant from each other;

first electrode branched portions 61*b* (61*b*$_1$ and 61*b*$_2$) which extend from the respective first electrode small pieces 61*a* (61*a*$_1$ and 61*a*$_2$); and a first electrode main portion 61*c* (in Example 7, more specifically, the first electrode extending portion 61A) which collects Q numbers of first electrode branched portions 61*b* and extends toward the drive circuit 30.

As illustrated in FIG. 31, the two first electrode small pieces 61*a* are arranged and the planar shape of each first electrode small piece 61*a* is a rectangular shape with four round corners.

The organic layer 63 is formed at least on each of the first electrode small pieces 61*a*. Specifically, the organic layer 63 is formed on the entire exposed portion of the first electrode 61 in the bottom of the second opening 52 formed on the second insulating layer 42. More specifically, the organic layer 63 is formed over a range from the exposed portion of the first electrode 61 in the bottom of the second opening 52, formed on the second insulating layer 42, to a part of an upper area of the second insulating layer 42. In addition, the second electrode 62 is formed on the organic layer 63.

Figure 33:
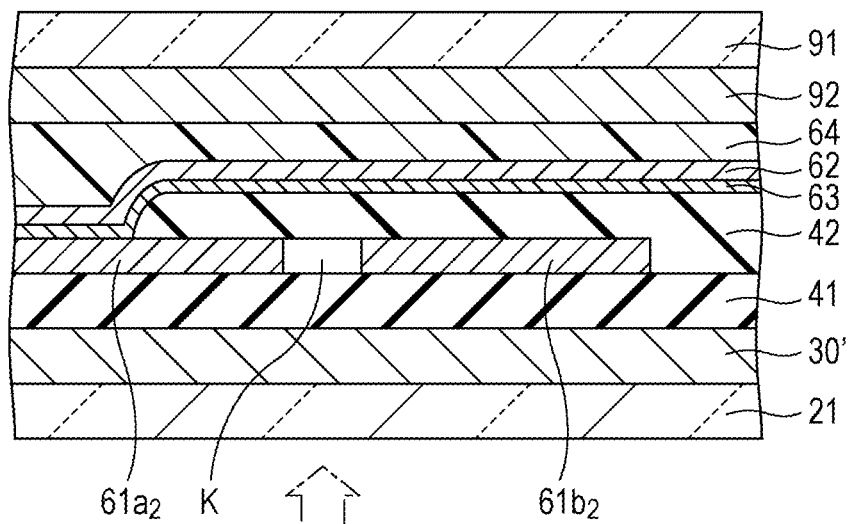
FIG. 33 is a partial cross-sectional view for describing a method of repairing a display device according to Example 7, schematically illustrating one subpixel of the display device according to Example 7.
Figure 34:
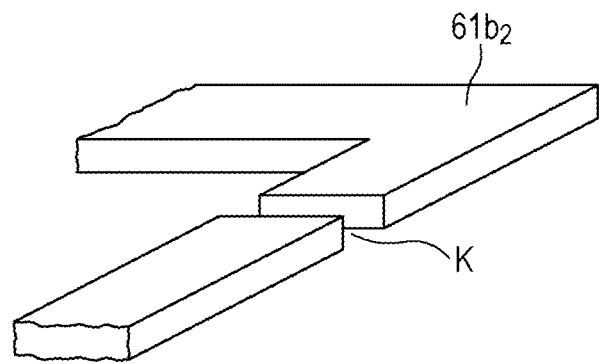
FIG. 34 is a perspective view for describing the method of repairing a display device according to Example 7, schematically illustrating a first electrode branched portion.

When there is a foreign material P on the first electrode small piece 61*a*$_2$ of the light emitting portion 160, the first electrode branched portion 61*b*$_2$ extending from the first electrode small piece 61*a*$_2$ is cut. FIG. 33 is a partial cross-sectional view schematically illustrating a state where the first electrode branched portion 61*b*$_2$ is cut; and FIG. 34 is a perspective view illustrating the cut first electrode branched portion 61*b*$_2$.

A method of repairing a display device according to Example 7 for the above-described display device 110 will be described. Similarly to the case of Example 6, the method of repairing a display device is applied after completing the display device. In an example of FIG. 31, it is assumed that, as a result of inspecting the display device, a conductive foreign material P is found in the first electrode small piece 61*a*$_2$; and the first electrode 61 and the second electrode 62 are short-circuited or has a high possibility of being short-circuited. Similarly to the case of Example 6, when short-circuiting occurs, a subpixel in which short-circuit occurs does not emit light.

Therefore, when there is a foreign material P on the first electrode small piece 61*a*$_2$ of the light emitting portion 160, the first electrode branched portion 61*b*$_2$ extending from the first electrode small piece 61*a*$_2$ is irradiated with laser light to cut the first electrode branched portion 61*b*$_2$. In Example 7, any one of the top-side irradiation and the bottom-side irradiation may be adopted. The first electrode branched portion 61*b*$_1$ extending from the first electrode small piece 61*a*$_1$ remains and thus a light emitting function of the light emitting 160 including the first electrode small piece 61*a*$_1$ remains.

In Example 7, since the first electrode branched portion 61*b*$_2$ is cut across a longitudinal direction of the first electrode branched portion 61*b*$_2$, the length of laser irradiation can be reduced. As a result, cutting with laser irradiation can be easily and reliably performed and the time of repair using laser irradiation can be reduced. In addition, since the first electrode branched portion $61b_2$ is interposed between the first insulating layer 41 and the second insulating layer 42, the scattering of a melted material of the first electrode branched portion 61b can be reliably prevented. Example 7 may be adopted in combination with Example 6. That is, in the display device according to Example 7, the window layer may be formed on the first electrode.

Example 8

Example 8 relates to the electronic apparatus according to the first or second embodiment of the present disclosure. The display devices obtained in Examples 1 to 7 can be applied to electronic apparatuses in various fields in which image signals, which are input from an external device or are generated from a display device, are displayed as a still image or a moving image, for example, a television set, a digital still camera, a personal laptop computer, a portable terminal device such as a mobile phone, or a video camera.

Figure 35:
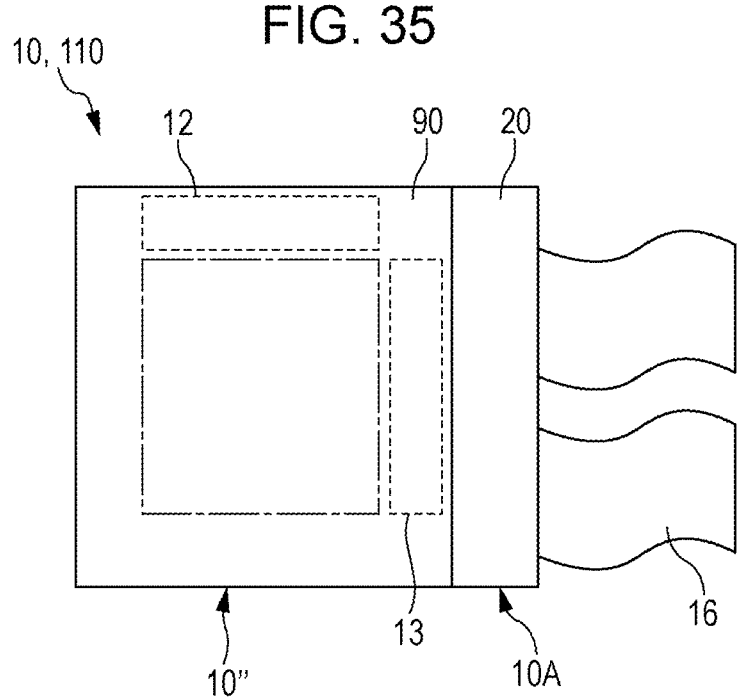
FIG. 35 is a perspective view illustrating an external appearance of a display device module including the display devices according to Examples 1 to 7.

FIG. 35 illustrates an external appearance of a display device module. The display devices 10 and 110 according to Examples 1 to 7 are applied to the display device module. Various electronic devices are incorporated into the display device module. In the display device module, the signal line drive circuit 12 and the scanning line drive circuit 13 are arranged in the peripheral portion 10'' of the display device 10 which is a region in which, for example, the first substrate 21 and the second substrate 91 are bonded to each other. In addition, in a region 10A in which the second substrate 91 is not bonded, an external connection terminal (not illustrated) which are connected to the signal line drive circuit 12 and the scanning line drive circuit 13 is arranged. A flexible printed wiring board 16 for inputting and outputting signals is mounted onto the external connection terminal.

Figure 36:
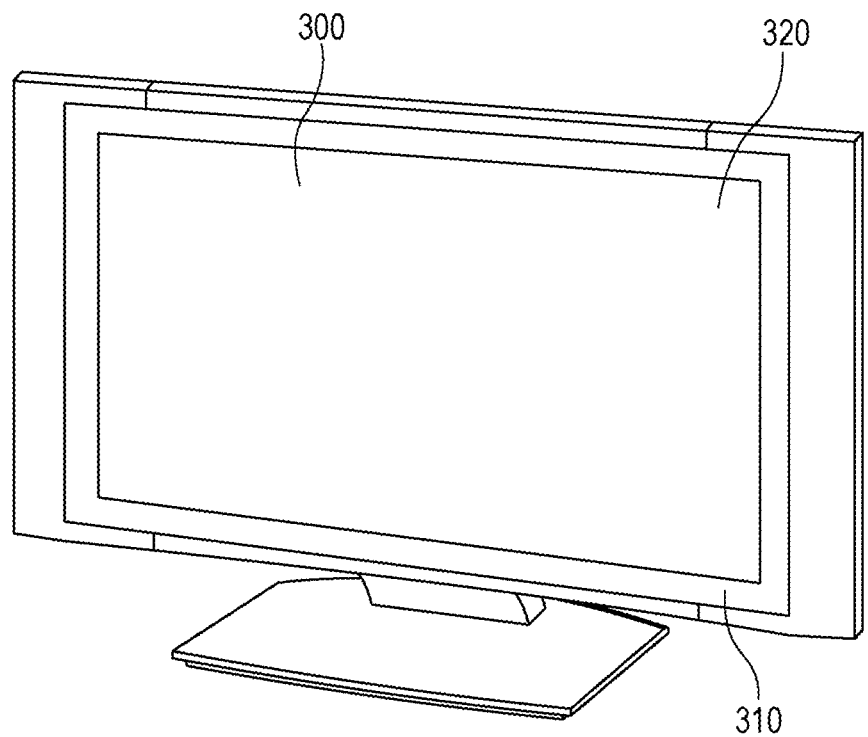
FIG. 36 is a perspective view illustrating an external appearance of a television set which is an electronic apparatus including the display devices according to Examples 1 to 7.

FIG. 36 illustrates an external appearance of a television set which is an electronic apparatus according to Example 8. The television set includes, for example, an image display screen 300 having a front panel 310 and a filter glass 320. The image display screen 300 is configured with the display devices 10 and 110 described in Examples 1 to 7.

Figure 37A:
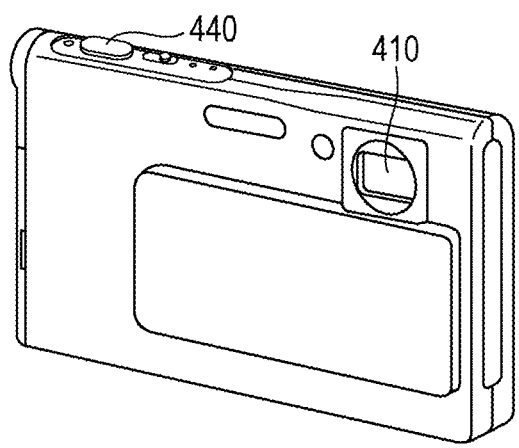
FIGS. 37A and 37B are perspective views illustrating an external appearance of a digital still camera which is an electronic apparatus including the display devices according to Examples 1 to 7.
Figure 37B:
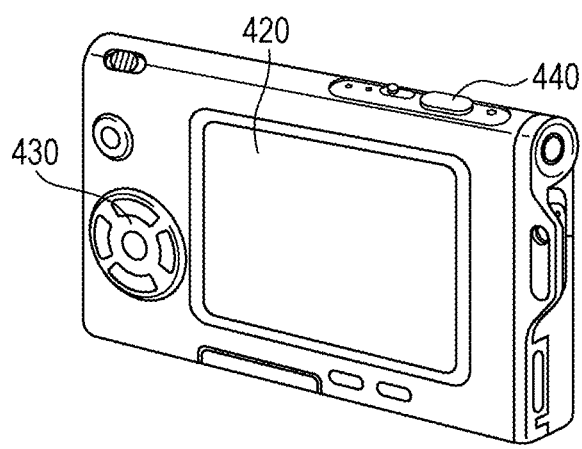

In addition, FIGS. 37A and 37B illustrate an external appearance of a digital still camera which is an electronic apparatus according to Example 8. The digital still camera includes, for example, a flash portion 410, a display portion 420, a menu switch 430 and a shutter-release button 440. The display portion 420 is configured with the display devices 10 and 110 described in Examples 1 to 7.

Figure 38:
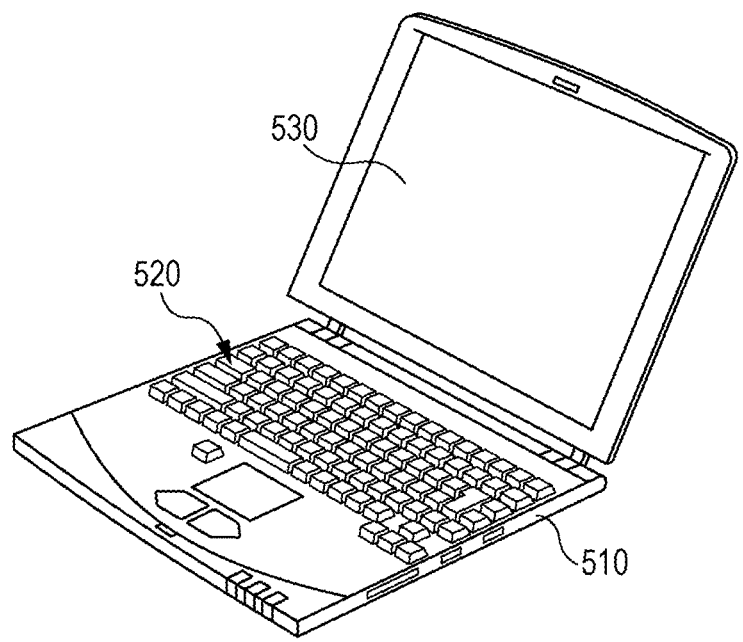
FIG. 38 is a perspective view illustrating an external appearance of a personal laptop computer which is an electronic apparatus including the display devices according to Examples 1 to 7.

Furthermore, FIG. 38 illustrates an external appearance of a personal laptop computer which is an electronic apparatus according to Example 8. The personal laptop computer includes, for example, a main body 510, a keyboard 520 for inputting characters and the like, and a display portion 530 for displaying an image. The display portion 530 is configured with the display devices 10 and 110 described in Examples 1 to 7.

Figure 39:
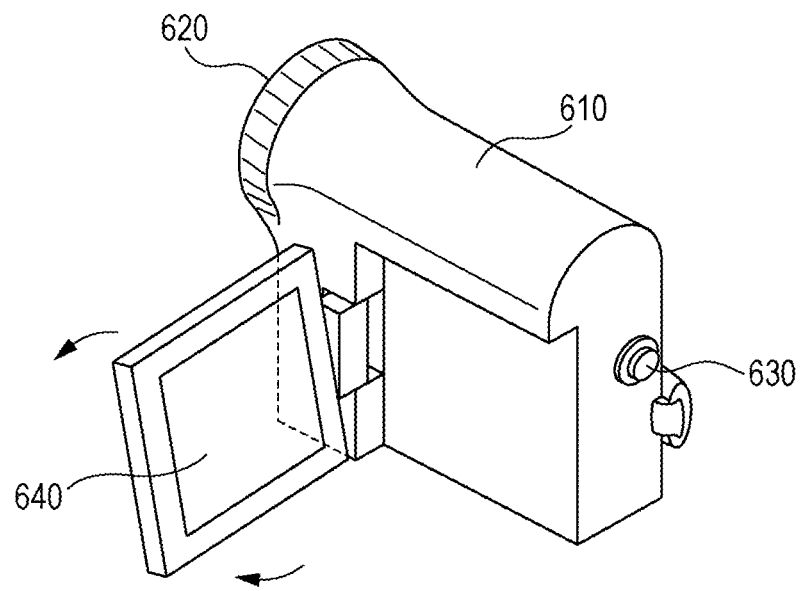
FIG. 39 is a perspective view illustrating an external appearance of a video camera which is an electronic apparatus including the display devices according to Examples 1 to 7.

In addition, FIG. 39 illustrates an external appearance of a video camera which is an electronic apparatus according to Example 8. The video camera includes, for example, a main body 610, a lens 620 for photographing an object which is provided on the front side of the main body 610, a start-stop switch 630 for starting and stopping photographing, and a display portion 640. The display portion 640 is configured with the display devices 10 and 110 described in Examples 1 to 7.

Furthermore, FIGS. 40A to 40G illustrate an external appearance of a mobile phone which is an electronic apparatus according to Example 8. The mobile phone is formed by, for example, connecting an upper case 710 and a lower case 720 through a connecting portion (hinge portion) 730, and includes a display 740, a sub-display 750, a picture light 760, and a camera 770. The display 740 or the sub-display 750 is configured with the display devices 10 and 110 described in Examples 1 to 7.

Hereinabove, the present disclosure will be described based on Examples. However, the present disclosure is not limited to Examples. The configurations and structures of the display devices and the electronic apparatuses, the method of manufacturing a display device, and the methods of repairing a display device, which are described in Examples, are merely examples and can be appropriately modified. The display device may be configured as an inorganic EL display device. In this case, "organic layer" is replaced with "inorganic layer" in the description of the light emitting portion. In the configuration of the light emitting layer according to Examples 1 to 5, a color filter may be provided to emit white light as described above in Example 6. In the configuration of the light emitting layer according to Examples 6 and 7, red light, green light, and blue light may be emitted as described above in Example 1.

The present disclosure may adopt the following configurations.

[1] Display Device: First Embodiment

A display device including light emitting elements that are arranged in a two-dimensional matrix, wherein the light emitting elements include a drive circuit which is provided on a substrate, a first insulating layer which covers the drive circuit and the substrate, a light emitting portion in which a first electrode, an organic layer having a light emitting layer, and a second electrode are laminated, and a second insulating layer which covers the first electrode, the light emitting elements further include an auxiliary electrode layer and a contact portion which is formed on the substrate, the first electrode is formed on the first insulating layer and is electrically connected to the drive circuit through a first electrode extending portion which is formed on a first opening provided in the first insulating layer, the organic layer is formed at least on a portion of the first electrode which is exposed in the bottom of a second opening formed on the second insulating layer, a third opening, through which the contact portion is exposed in the bottom, is formed on the first insulating layer, a fourth opening, through which the contact portion is exposed in the bottom, is formed at least on the second insulating layer, the auxiliary electrode layer is formed distant from the first electrode and over a range from an upper area of the first insulating layer to an internal area of the third opening, and the second electrode is formed over a range from an upper area of the organic layer to an upper area of the second insulating layer and furthermore to an internal area of the fourth opening.

[2] The display device according to [1], wherein the contact portion has a structure in which at least a first contact layer and a second contact layer are laminated in this order from the substrate side, and an etching rate of a material forming the second contact layer is lower than that of a material forming the first electrode.

[3] The display device according to [2],
wherein the material forming the second contact layer is a metal which is difficult to oxidize or a material containing the metal which is difficult to oxidize.

[4] The display device according to [2] or [3],
wherein a material forming the first contact layer is a metal having higher conductivity than that of the material forming the second contact layer, or a material containing the metal having higher conductivity.

[5] The display device according to any one of [2] to [4],
wherein the second contact layer is formed of a material containing molybdenum or titanium, and
the first contact layer is formed of a material containing at least one kind of metal selected from a group consisting of aluminum, silver, and copper.

[6] The display device according to any one of [1] to [5],
wherein the drive circuit includes a gate electrode, a gate insulating layer, a channel forming region, and source/drain electrodes, and
the source/drain electrodes have the same configuration as that of the contact portion.

[7] The display device according to [6],
wherein a structure, in which at least a first layer which forms the gate electrode and a second layer which forms the gate insulating layer are laminated, is formed below the contact portion.

[8] The display device according to any one of [1] to [7],
wherein the fourth opening has a wide upper portion and a narrow lower portion.

[9] The display device according to any one of [1] to [8],
wherein the first electrode is formed of aluminum or silver, and
light, emitted from the light emitting layer, is reflected from the first electrode.

[10] The display device according to any one of [1] to [9],
wherein a material forming the auxiliary electrode layer is the same as the material forming the first electrode.

[11] The display device according to any one of [1] to [10],
wherein light, emitted from the light emitting portion, passes through the second electrode.

[12] The display device according to any one of [1] to [11],
wherein the second electrode is shared by a plurality of light emitting elements.

[13] The display device according to any one of [1] to [12],
wherein a portion of the auxiliary electrode layer on the first insulating layer surrounds the first electrode, formed on the first insulating layer, in a state being distant from the first electrode.

[14] The display device according to any one of [1] to [13],
wherein a portion of an auxiliary wiring layer, which is located at an edge of a display region of the display device, is connected to a power supply, which is provided in a peripheral portion of the display device, through the contact portion formed on the substrate and a wiring layer extending from the contact portion.

[15] Electronic Apparatus: First Embodiment
An electronic apparatus including
the display device according to any one of [1] to [14].

[16] Method of Manufacturing Display Device
A method of manufacturing a display device including light emitting elements that are arranged in a two-dimensional matrix, in which the light emitting elements include a drive circuit and a light emitting portion in which a first electrode, an organic layer having a light emitting layer, and a second electrode are laminated, the method including:
providing the drive circuit and a contact portion on the substrate;
forming a first insulating layer that covers the drive circuit, the contact portion, and the substrate;
forming a first opening, through which a part of the drive circuit is exposed in the bottom, on a portion of the first insulating layer which is located above the drive circuit and forming a third opening, through which the contact portion is exposed in a concave portion and in the bottom, on a portion of the first insulating layer which is located above the contact portion;
forming a conductive material layer on the entire surface and patterning the conductive material layer to form the first electrode on the first insulating layer, to form a first electrode extending portion in the first opening, to form an auxiliary electrode layer, which is distant from the first electrode, over a range from an upper area of the first insulating layer to an internal area of the third opening, and to remove the conductive material layer on at least a part of the bottom of the concave portion;
removing a portion of the first insulating layer, which is located on an exposed portion in the bottom of the concave portion, to expose the contact portion, forming a second insulating layer on the entire surface, forming a second opening, through which the first electrode is exposed in the bottom, on the second insulating layer, forming a fourth opening, which reaches an exposed portion of the contact portion in the bottom of the concave portion, on the second insulating layer, or
forming a second insulating layer on the entire surface, removing a portion of the second insulating layer which is located above the concave portion, removing a portion of the first insulating layer which is located on a portion of the bottom of the concave portion, forming a second opening, through which the first electrode is exposed in the bottom, on the second insulating layer, and forming a fourth opening, which reaches an exposed portion of the contact portion in the bottom of the concave portion, on the second insulating layer and the first insulating layer;
forming the organic layer over a range from an exposed portion of the first electrode in the bottom of the second opening to a part of an upper area of the second insulating layer; and
forming the second electrode over a range from an upper area of the organic layer to an upper area of the second insulating layer and furthermore to an internal area of the fourth opening.

[17] The method of manufacturing a display device according to [16],
wherein at least the concave portion, the first opening, and the third opening are formed on the first insulating layer based on a photolithographic technique, and
a half-tone mask or a grey-tone mask is used in the photolithographic technique.

[18] Display Device: Second Embodiment
A display device including
light emitting elements that are arranged in a two-dimensional matrix,
wherein the light emitting elements include a drive circuit which is provided on a substrate, a first insulating layer which covers the drive circuit and the substrate, a light emitting portion which includes a first electrode, an organic layer having a light emitting layer, and a second electrode, and a second insulating layer which covers the first electrode,
the first electrode formed on the first insulating layer is electrically connected to the drive circuit,
the light emitting elements further include a window layer which is provided on the first electrode,
the light emitting portion is divided into plural window portions by the window layer, the organic layer is formed at least on the first electrode, the second electrode is formed on the organic layer, and when there is a foreign material in a window portion of the light emitting portion, a portion of the first electrode corresponding to the window portion is separated from the other portions of the first electrode.

[19] The display device according to [18]

wherein a portion of the first electrode which is located below the window layer surrounding the window portion, or a portion of the first electrode which is located below the window layer surrounding the window portion and a portion of the first electrode which is located below the window layer and the second insulating layer surrounding the window portion are separated from the other portions of the first electrode.

[20] Display Device: Third Embodiment

A display device including light emitting elements that are arranged in a two-dimensional matrix, wherein the light emitting elements include a drive circuit which is provided on a substrate, a first insulating layer which covers the drive circuit and the substrate, a light emitting portion which includes a first electrode, an organic layer having a light emitting layer, and a second electrode, and a second insulating layer which covers the first electrode, the first electrode formed on the first insulating layer is electrically connected to the drive circuit, the first electrode includes Q numbers of first electrode small pieces which are provided distant from each other, first electrode branched portions which extend from the respective first electrode small pieces, and a first electrode main portion which collects Q numbers of first electrode branched portions and extends toward the drive circuit, the organic layer is formed at least on each of the first electrode small pieces, the second electrode is formed on the organic layer, and when there is a foreign material on a first electrode small piece of the light emitting portion, a first electrode branched portion extending from the first electrode small piece is cut.

[21] Electronic Apparatus: Second Embodiment

An electronic apparatus including the display device according to any one of [18] to [20].

[22] Method of Repairing Display Device: First Embodiment

A method of repairing a display device including light emitting elements that are arranged in a two-dimensional matrix, in which the light emitting elements include a drive circuit which is provided on a substrate, a first insulating layer which covers the drive circuit and the substrate, a light emitting portion which includes a first electrode, an organic layer having a light emitting layer, and a second electrode, and a second insulating layer which covers the first electrode, the first electrode formed on the first insulating layer is electrically connected to the drive circuit, the light emitting elements further include a window layer which is provided on the first electrode, the light emitting portion is divided into plural window portions by the window layer, the organic layer is formed at least on the first electrode, and the second electrode is formed on the organic layer, the method including when there is a foreign material in a window portion of the light emitting portion, irradiating a portion of the first electrode surrounding the window portion with laser light to separate the portion of the first electrode corresponding to the window portion from the other portions of the first electrode.

[23] The method of repairing a display device according to [22], wherein a portion of the first electrode which is located below the window layer surrounding the window portion, or a portion of the first electrode which is located below the window layer surrounding the window portion and a portion of the first electrode which is located below the window layer and the second insulating layer surrounding the window portion are separated from the other portions of the first electrode.

[24] The method of repairing a display device according to [22] or [23], wherein the laser light is emitted from the second electrode side.

[25] Method of Repairing Display: Second Embodiment

A method of repairing a display device including light emitting elements that are arranged in a two-dimensional matrix, in which the light emitting elements include a drive circuit which is provided on a substrate, a first insulating layer which covers the drive circuit and the substrate, a light emitting portion which includes a first electrode, an organic layer having a light emitting layer, and a second electrode, and a second insulating layer which covers the first electrode, the first electrode formed on the first insulating layer is electrically connected to the drive circuit, the first electrode includes Q numbers of first electrode small pieces which are provided distant from each other, first electrode branched portions which extend from the respective first electrode small pieces, and a first electrode main portion which collects Q numbers of first electrode branched portions and extends toward the drive circuit, the organic layer is formed at least on each of the first electrode small pieces, and the second electrode is formed on the organic layer, the method including when there is a foreign material on a first electrode small piece of the light emitting portion, irradiating a first electrode branched portion extending from the first electrode small piece with laser light to cut the first electrode branched portion.

[26] The method of repairing a display device according to [25], wherein the laser light is emitted from the second electrode side.

The present disclosure contains subject matter related to that disclosed in Japanese Priority Patent Application JP 2012-070933 filed in the Japan Patent Office on Mar. 27, 2012, Japanese Priority Patent Application JP 2012-072826 filed in the Japan Patent Office on Mar. 28, 2012, and Japanese Priority Patent Application JP 2012-277619 filed in the Japan Patent Office on Dec. 20, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising light emitting elements that are arranged in a two-dimensional matrix, wherein the light emitting elements include a drive circuit which is provided on a substrate, a first insulating layer which covers the drive circuit and the substrate, a light emitting portion which includes a first electrode, an organic layer having a light emitting layer, and a second electrode, and a second insulating layer which covers the first electrode, the first electrode is formed on the first insulating layer and is electrically connected to the drive circuit, the light emitting elements further include a window layer which is provided on the first electrode, the light emitting portion is divided into plural window portions by the window layer, the organic layer is formed at least on a portion of the first electrode and on a portion of the window layer, wherein a first surface of the window layer is in contact with and is entirely supported by the first electrode, and wherein the first surface of the window layer is not in contact with the first insulating layer, the second electrode is formed on the organic layer, wherein the second electrode is separated from the window layer by the organic layer, and when there is a foreign material in a window portion of the light emitting portion, a portion of the first electrode corresponding to the window portion is separated from the other portions of the first electrode.

2. The display device according to claim 1,
wherein a portion of the first electrode which is located below the window layer surrounding the window portion, or a portion of the first electrode which is located below the window layer surrounding the window portion, the window layer surrounding the window portion, and a portion of the first electrode which is located below the second insulating layer are separated from the other portions of the first electrode.

3. The display device according to claim 1, wherein
the light emitting elements further include an auxiliary electrode layer and a contact portion which is formed on the substrate, the first electrode is electrically connected to the drive circuit through a first electrode extending portion which is formed on a first opening provided in the first insulating layer, the organic layer is further formed at least on a portion of the first electrode which is exposed in the bottom of a second opening formed in the second insulating layer, a third opening, through which the contact portion is exposed in the bottom, is formed in the first insulating layer, a fourth opening, through which the contact portion is exposed in the bottom, is formed at least in the second insulating layer, the auxiliary electrode layer is formed distant from the first electrode and over a range from an upper area of the first insulating layer to an internal area of the third opening, and the second electrode is formed over a range from an upper area of the organic layer to an upper area of the second insulating layer and furthermore to an internal area of the fourth opening, wherein the second electrode and the auxiliary electrode layer are electrically connected to one another by the contact portion.

4. The display device according to claim 3,
wherein the contact portion has a structure in which at least a first contact layer and a second contact layer are laminated in this order from the substrate side, and an etching rate of a material forming the second contact layer is lower than that of a material forming the first electrode.

5. The display device according to claim 4,
wherein the material forming the second contact layer is a metal which is difficult to oxidize or a material containing the metal which is difficult to oxidize.

6. The display device according to claim 4,
wherein a material forming the first contact layer is a metal having higher conductivity than that of the material forming the second contact layer, or a material containing the metal having higher conductivity.

7. The display device according to claim 3,
wherein the drive circuit includes a gate electrode, a gate insulating layer, a channel forming region, and source/drain electrodes, and
the source/drain electrodes have the same configuration as that of the contact portion.

8. The display device according to claim 3,
wherein a material forming the auxiliary electrode layer is the same as the material forming the first electrode.

9. The display device according to claim 3,
wherein a portion of the auxiliary electrode layer on the first insulating layer surrounds the first electrode, formed on the first insulating layer, in a state being distant from the first electrode.

10. The display device according to claim 3,
wherein a portion of an auxiliary wiring layer, which is located at an edge of a display region of the display device, is connected to a power supply, which is provided in a peripheral portion of the display device, through the contact portion formed on the substrate and a wiring layer extending from the contact portion.

11. An electronic apparatus comprising
the display device according to claim 3.

12. A display device comprising
light emitting elements that are arranged in a two-dimensional matrix,
wherein each of the light emitting elements includes: a drive circuit which is provided on a substrate, a first insulating layer which covers the drive circuit and the substrate, a light emitting portion which includes a first electrode, an organic layer having a light emitting layer, and a second electrode, and a second insulating layer which covers the first electrode,
the first electrode is formed on the first insulating layer and is electrically connected to the drive circuit,
the first electrode includes Q numbers of first electrode small pieces which are provided distant from each other, where Q is greater than 1, first electrode branched portions which extend from the respective first electrode small pieces, and a first electrode main portion which collects Q numbers of first electrode branched portions and extends toward the drive circuit,
the organic layer is formed at least on each of the Q first electrode small pieces,
the second electrode is formed on the organic layer, and
when there is a foreign material on a first electrode small piece of the light emitting portion, a first electrode branched portion extending from the first electrode small piece is cut, wherein the first electrode small piece is disconnected from the drive circuit.

13. An electronic apparatus comprising
the display device according to claim 12.

* * * * *